(12) United States Patent
Dutta

(10) Patent No.: US 10,873,045 B2
(45) Date of Patent: Dec. 22, 2020

(54) HIGH EFFICIENCY PHOTOVOLTAIC CELLS AND MANUFACTURING THEREOF

(71) Applicant: Achyut Kumar Dutta, Sunnyvale, CA (US)

(72) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 384 days.

(21) Appl. No.: 15/588,575

(22) Filed: May 5, 2017

(65) Prior Publication Data

US 2017/0301810 A1    Oct. 19, 2017

Related U.S. Application Data

(60) Continuation-in-part of application No. 14/315,308, filed on Jun. 25, 2014, now Pat. No. 9,935,217, which is a division of application No. 11/555,445, filed on Nov. 1, 2006, now Pat. No. 8,816,191.

(60) Provisional application No. 62/436,290, filed on Dec. 19, 2016, provisional application No. 60/597,419, filed on Nov. 29, 2005.

(51) Int. Cl.
| | |
|---|---|
| *H01L 31/0232* | (2014.01) |
| *H01L 31/0236* | (2006.01) |
| *H01L 31/0352* | (2006.01) |
| *H01L 51/44* | (2006.01) |

(Continued)

(52) U.S. Cl.
CPC ...... *H01L 51/447* (2013.01); *H01L 31/02327* (2013.01); *H01L 31/02366* (2013.01); *H01L 31/03529* (2013.01); *H01L 31/18* (2013.01); *H01G 9/2031* (2013.01);
(Continued)

(58) Field of Classification Search
CPC ............ H01L 31/0296; H01L 31/0304; H01L 31/035281; H01L 31/07; H01L 31/072; H01L 31/073; H01L 31/0735; H01L 31/18; H01L 31/1804; H01L 31/1828; H01L 31/184
See application file for complete search history.

(56) References Cited

U.S. PATENT DOCUMENTS

| | | | | |
|---|---|---|---|---|
| 3,150,999 A | * | 9/1964 | Rudenberg | H01L 31/0236 136/256 |
| 4,110,122 A | * | 8/1978 | Kaplow | H01L 31/0543 136/249 |

(Continued)

*Primary Examiner* — Golam Mowla

(57) ABSTRACT

This invention relates to a novel structure of photovoltaic devices (e.g. photovoltaic cells also called as solar cells) are provided. The cells are based on the micro or nano scaled structures which could not only increase the surface area but also have the capability of reducing the reflection and increasing the absorption of incident light. More specifically, the structures are based on 3D structure which are made of electric materials covering semiconductors, insulators, dielectric, polymer, and metallic type materials. By using such structures reflection loss of the light from the cell is significantly reduced, increasing the absorption, which results in increasing the conversion efficiency of the solar cell, and reducing the usage of material while increasing the flexibility of the solar cell. The structures can be also used in other optical devices wherein the reflection loss and absorption are required to enhance significantly improve the device performances.

18 Claims, 25 Drawing Sheets

(51) Int. Cl.
*H01L 31/18* (2006.01)
*H01G 9/20* (2006.01)

(52) U.S. Cl.
CPC ........... *Y02E 10/543* (2013.01); *Y02E 10/544* (2013.01); *Y02E 10/549* (2013.01); *Y02P 70/50* (2015.11)

(56) References Cited

U.S. PATENT DOCUMENTS

| | | | | |
|---|---|---|---|---|
| 4,135,950 A * | 1/1979 | Rittner | ............ | H01L 31/022425 |
| | | | | 136/255 |
| 4,227,942 A * | 10/1980 | Hall | ................. | H01L 31/02363 |
| | | | | 136/255 |
| 4,251,679 A * | 2/1981 | Zwan | ....................... | H01L 31/04 |
| | | | | 136/244 |
| 4,379,944 A * | 4/1983 | Borden | ........... | H01L 31/035281 |
| | | | | 136/259 |
| 4,406,913 A * | 9/1983 | Weyrich | .......... | H01L 31/035281 |
| | | | | 136/255 |
| 4,427,839 A * | 1/1984 | Hall | ................ | H01L 31/022458 |
| | | | | 136/255 |
| 5,100,478 A * | 3/1992 | Kawabata | ............. | H01L 31/061 |
| | | | | 136/249 |
| 5,296,045 A * | 3/1994 | Banerjee | ................ | H01L 31/076 |
| | | | | 136/249 |
| 6,127,623 A * | 10/2000 | Nakamura | .......... | H01L 31/0236 |
| | | | | 136/256 |
| 6,541,696 B2 * | 4/2003 | Washio | ........... | H01L 31/022433 |
| | | | | 136/255 |
| 2002/0172820 A1* | 11/2002 | Majumdar | ............. | B82Y 20/00 |
| | | | | 428/357 |
| 2003/0178057 A1* | 9/2003 | Fujii | ............... | H01L 31/022425 |
| | | | | 136/256 |
| 2004/0109666 A1* | 6/2004 | Kim | ....................... | F24S 23/12 |
| | | | | 385/147 |
| 2006/0207647 A1* | 9/2006 | Tsakalakos | ............ | B82Y 20/00 |
| | | | | 136/256 |
| 2010/0078055 A1* | 4/2010 | Vidu | ...................... | B82Y 40/00 |
| | | | | 136/244 |
| 2011/0120554 A1* | 5/2011 | Chhajed | ................ | C09D 1/00 |
| | | | | 136/259 |
| 2013/0109128 A1* | 5/2013 | Katsura | ............. | H01L 31/02363 |
| | | | | 438/71 |

\* cited by examiner

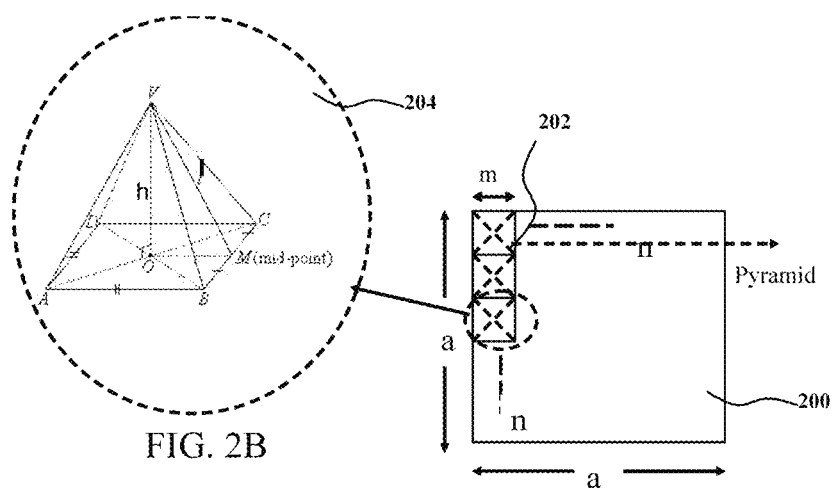
FIG. 2B
FIG. 2A
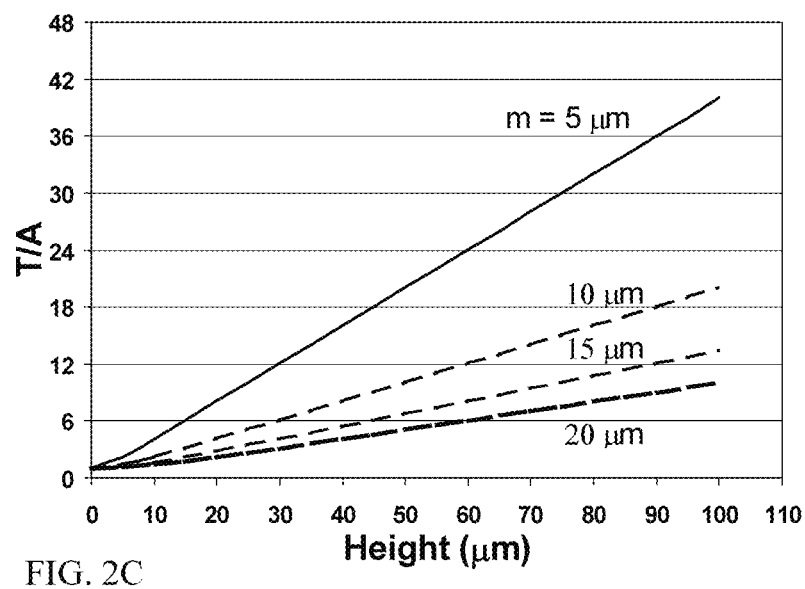
FIG. 2C

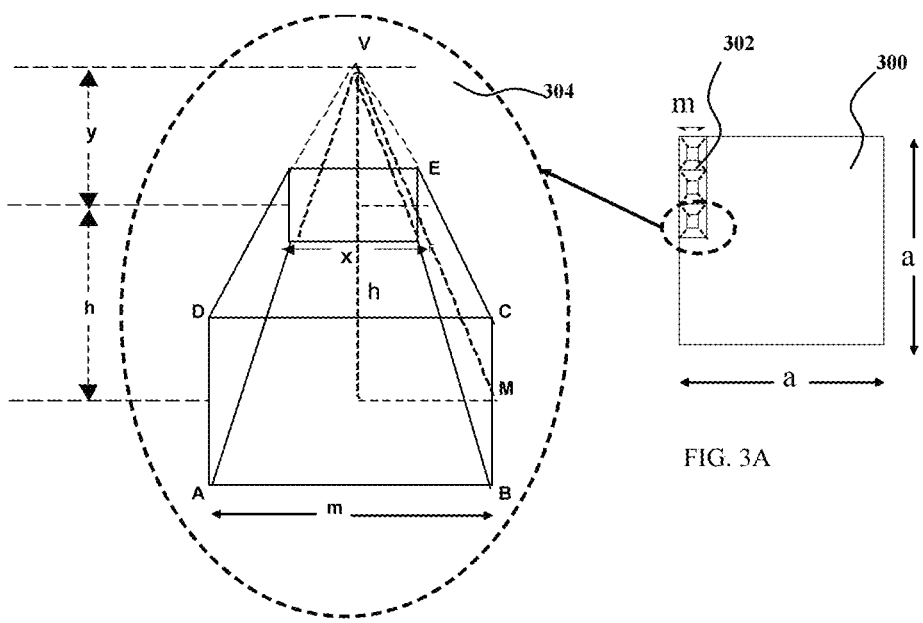
FIG. 3A
FIG. 3B
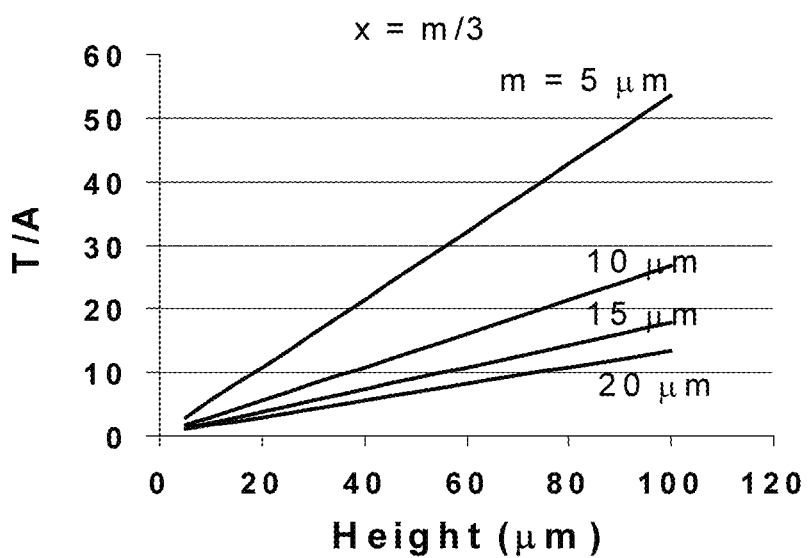
FIG. 3C

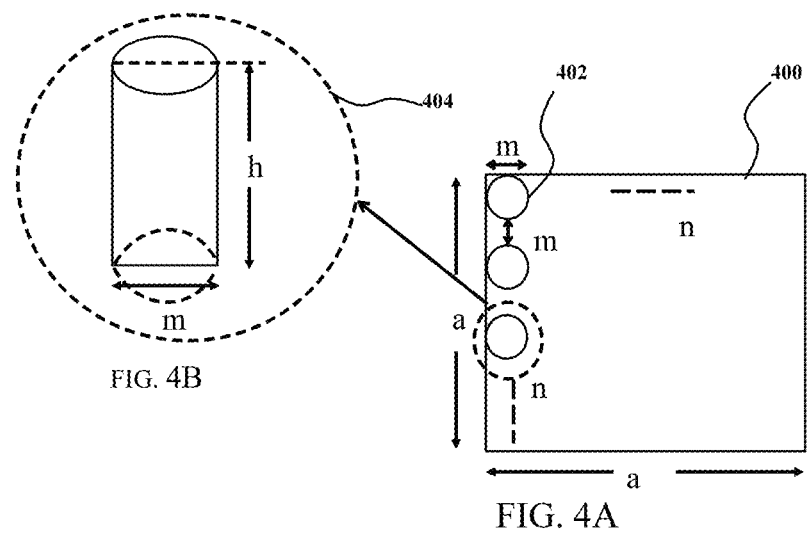
FIG. 4B
FIG. 4A
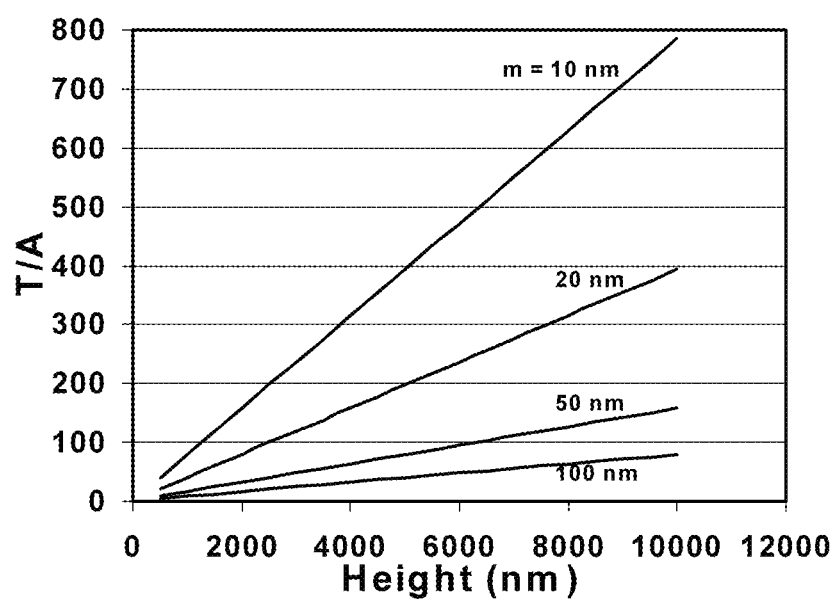
FIG. 4C

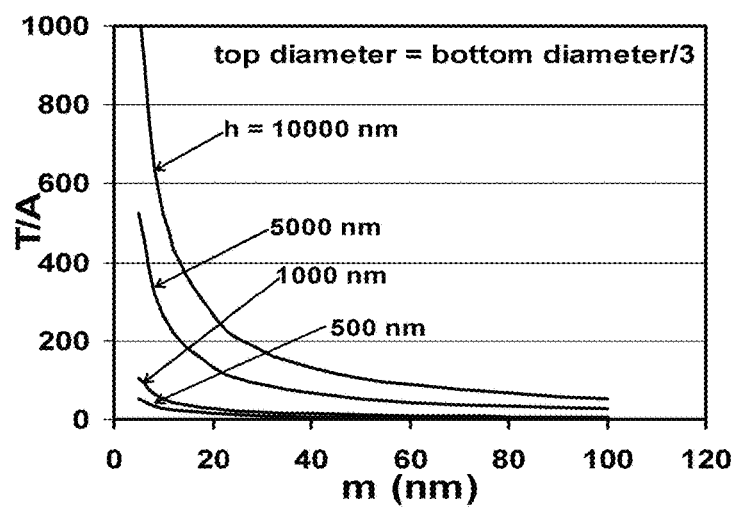
FIG. 5C
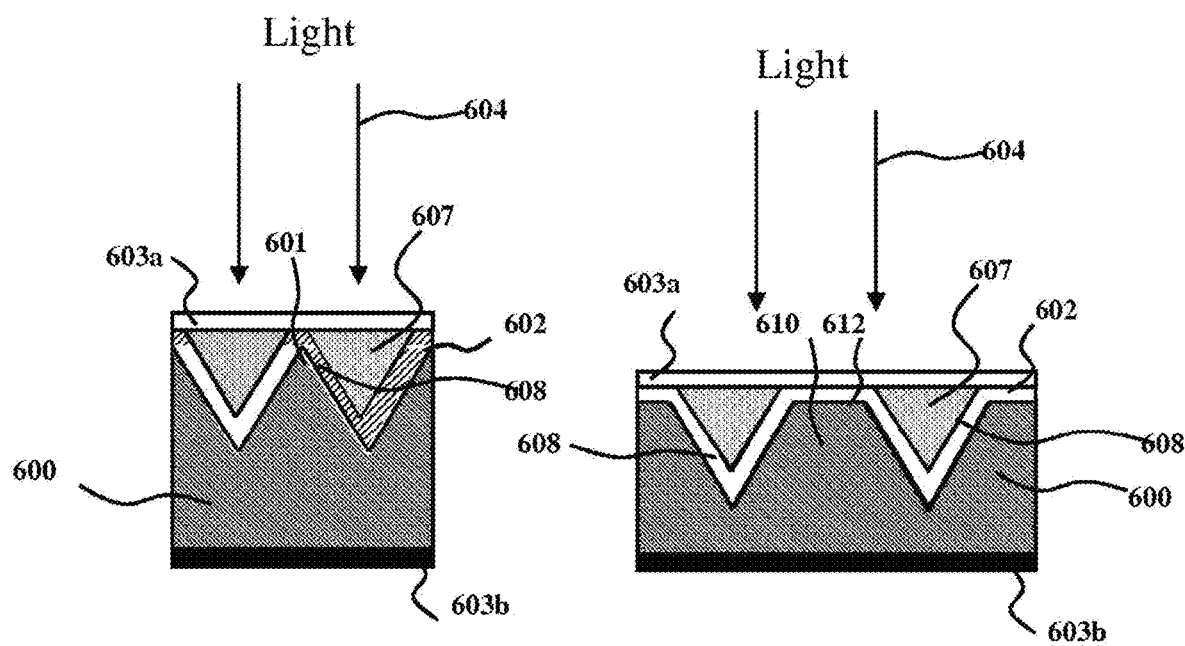
FIG. 6A
FIG. 6B

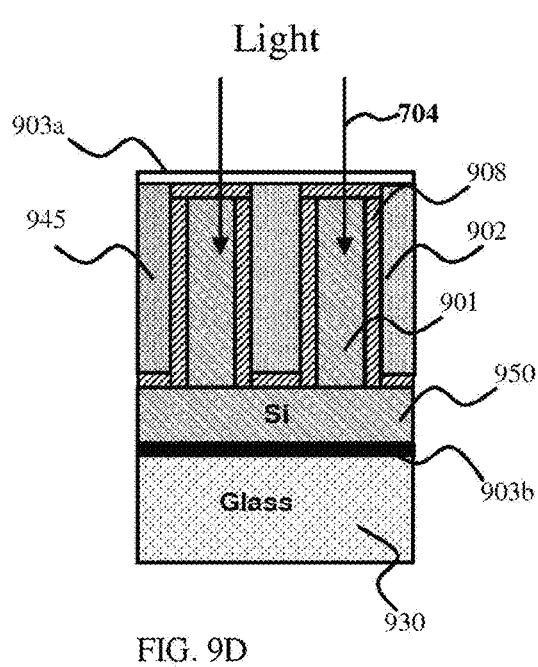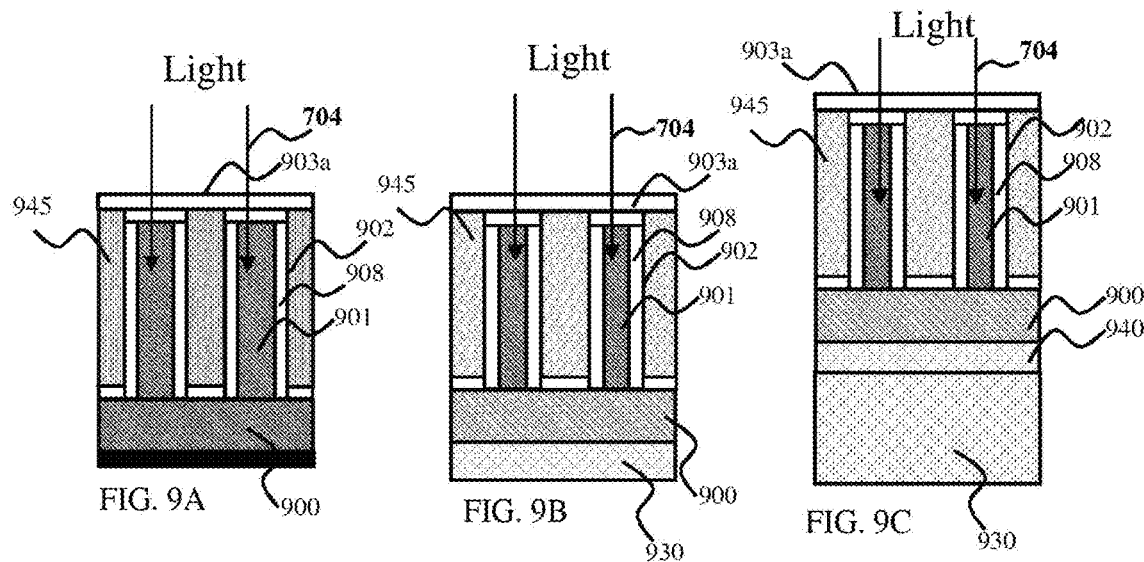
FIG. 9A  FIG. 9B  FIG. 9C  FIG. 9D  FIG. 9E

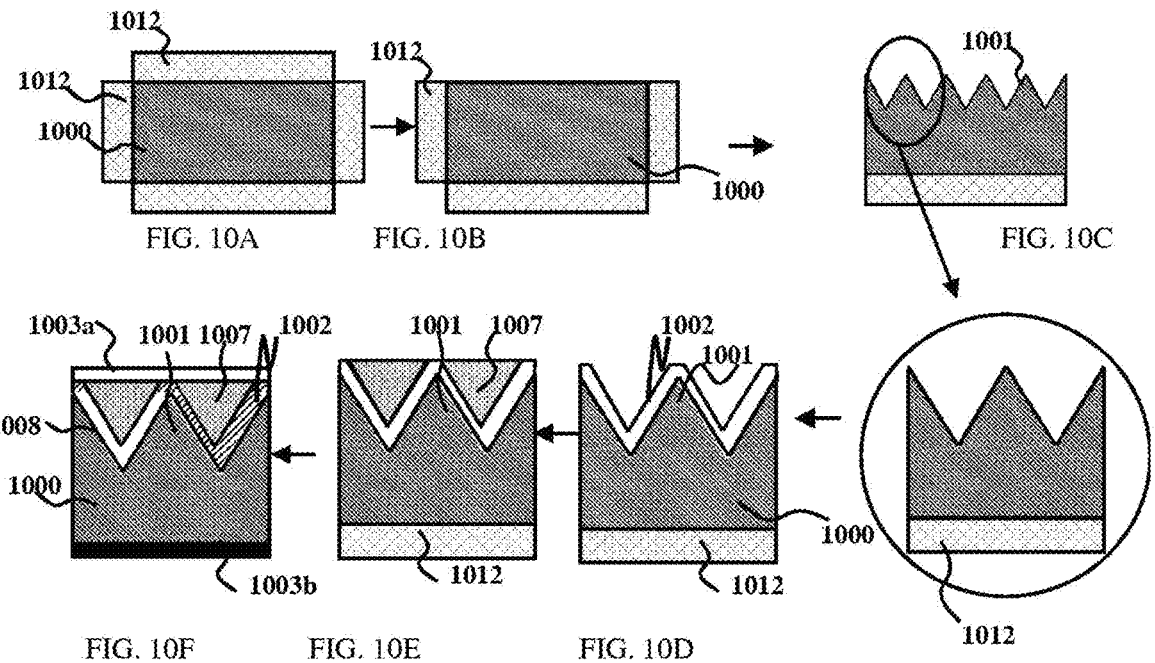
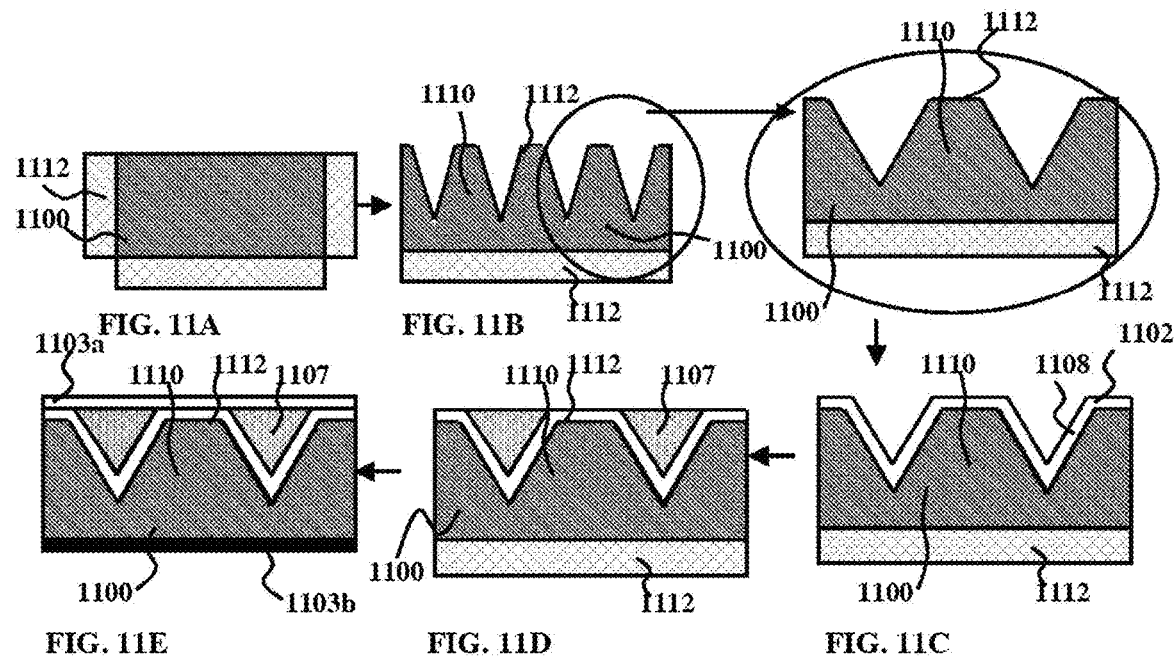

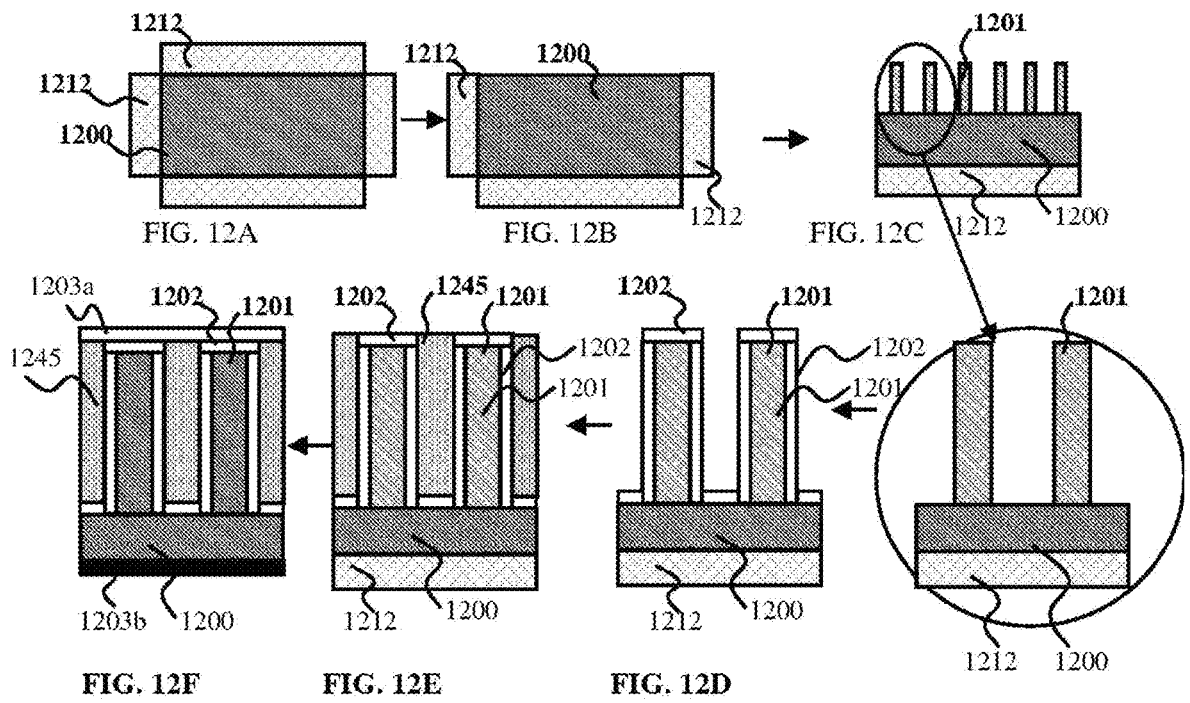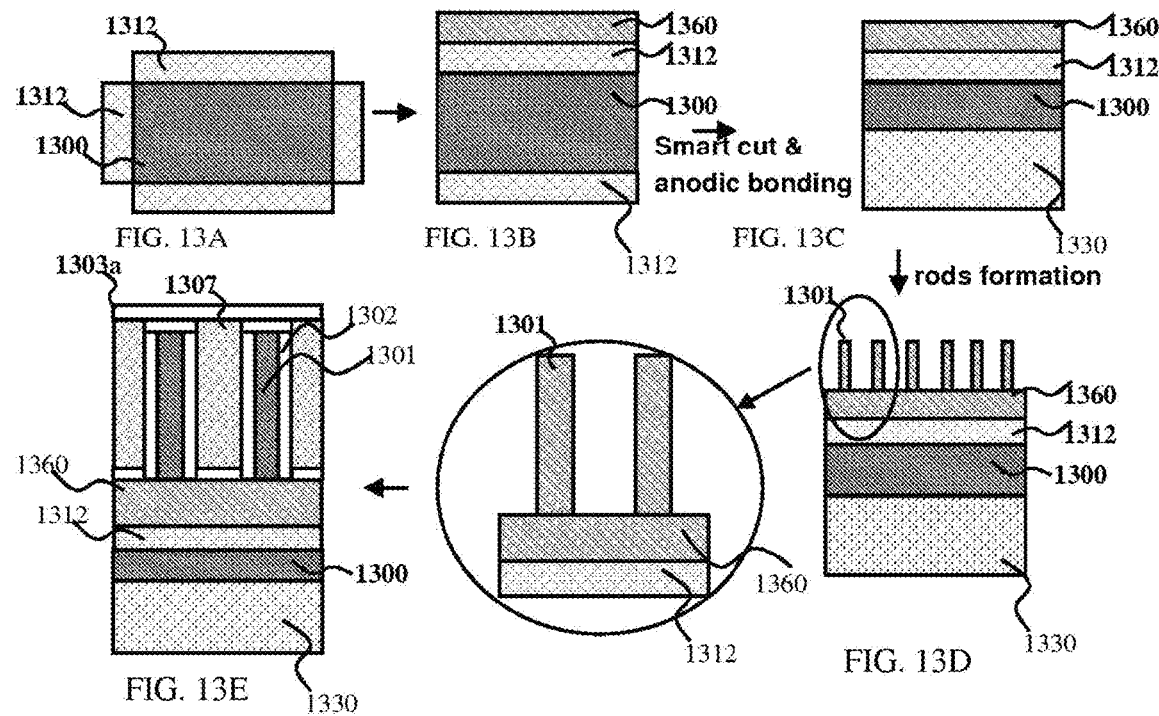

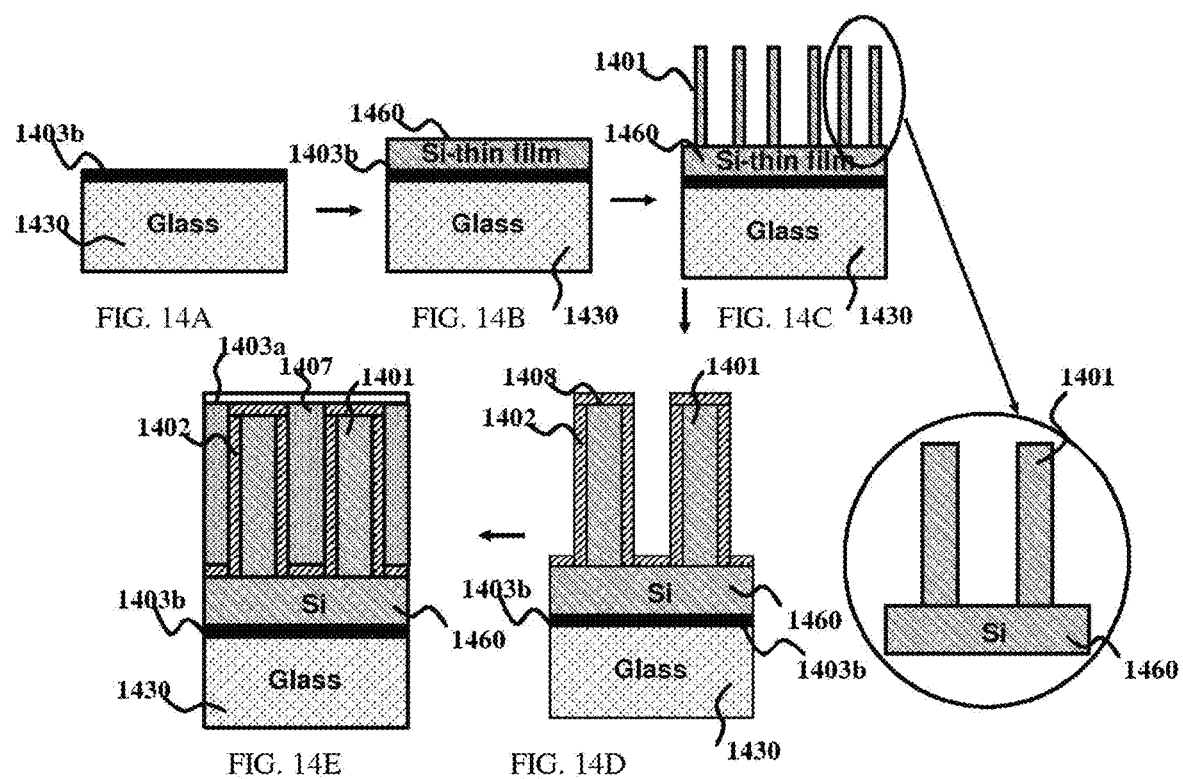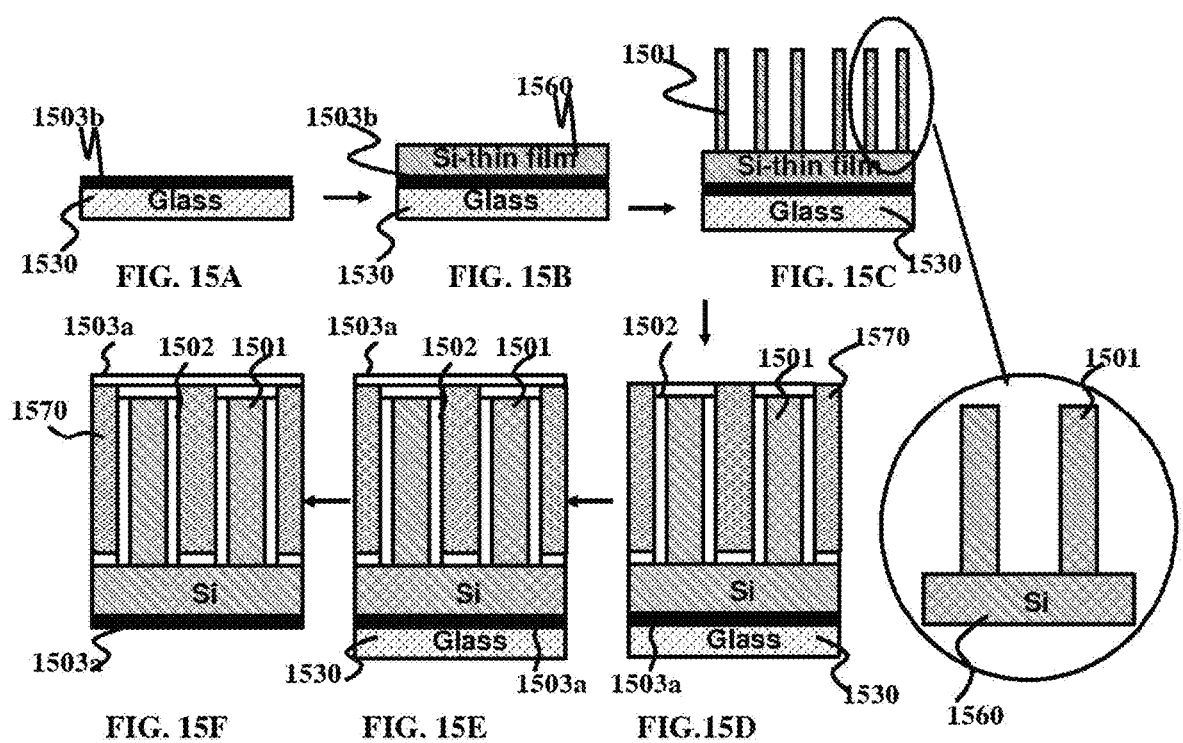

HIGH EFFICIENCY PHOTOVOLTAIC CELLS AND MANUFACTURING THEREOF

CROSS REFERENCE TO RELATED APPLICATIONS

This application is a continuation-in-part of U.S. application Ser. No. 14/315,308 filed on Jun. 25, 2014 which is a divisional of
(a) U.S. patent application Ser. No. 11/555,445 filed on Nov. 1, 2006, now U.S. Pat. No. 8,816,191, which claims,
(b) The benefit and priority of U.S. Provisional Application No. 60/597,419 filed Nov. 29, 2005.
A part of this continuous-in-part application is benefit and priority of U.S. Provisional Application No. 62/436,290, filed Dec. 19, 2016

STATEMENT REGARDING FEDERALLY SPONSORED RESEARCH AND DEVELOPMENT

New matter invention included as the continuity-in-part patent application was made with United States Government support under W91CRB11C0097 awarded by US Army Contracting Command. As such, the United States Government has certain rights in this invention.

FIELD OF INVENTIONS

This patent specification relates to structures of photovoltaic cells (also solar cells). More specifically, it relates to photovoltaic cells comprising structures that increase the junction area in order to increase power generation capability per unit area and also amplifying the light incident to the cell. This also relates to photovoltaic cells containing nano or micro scaled -blocks. These photovoltaic cells can be used in commercial, residential, and also industrial applications for power generation.

BACKGROUND OF THE INVENTIONS

Photovoltaic cells where light is converted into electric power to be fed to external loads, which are electrically connected to the photovoltaic cells, have been prevailing in a wide range of applications such as consumer electronics, industrial electronics, and space exploration. In consumer electronics, photovoltaic cells that consist of materials such as amorphous silicon are used for a variety of inexpensive and low power applications. Typical conversion efficiency, i.e. the solar cell conversion efficiency, of amorphous silicon based photovoltaic cells is in the range of ~10% [Yamamoto K, Yoshimi M, Suzuki T, Tawada Y, Okamoto T, Nakajima A. Thin film poly-Si solar cell on glass substrate fabricated at low temperature. Presented at MRS Spring Meeting, San Francisco, April 1998.]. Although the fabrication processes of amorphous silicon based photovoltaic cells are rather simple and inexpensive, one notable downside of this type of cell is its vulnerability to defect-induced degradation that decreases its conversion efficiency.

In contrast, for more demanding applications such as residential and industrial solar power generation systems, either poly-crystalline or single-crystalline silicon is typically used because there are more stringent requirements of better reliability and higher efficiency than those in consumer electronics. Photovoltaic cells consisting of poly-crystalline and single-crystalline silicon generally offer conversion efficiencies in the range of ~20% and ~25% [Zhao J Wang A, Green M, Ferrazza F. Novel 19.8% efficient 'honeycomb' textured multicrystalline and 24.4% monocrystalline silicon solar cell. *Applied Physics Letters* 1998; 73: 1991-1993.] respectively. As many concerns associated with a steep increase in the amount of the worldwide energy consumption are raised, further development in industrial solar power generation systems has been recognized as a main focus for an alternative energy source. However, due to the high cost ($3 to $5/Watt) of today's Si-based solar cell, it is not yet widely accepted as an alternative energy source solution.

Group II-VI compound semiconductors, for example CdTe and CdS, have been considered for the purpose of creating industrial solar power generation systems, manufactured at a lower cost and maintaining a moderate conversion efficiency. This approach resulted in a comparable conversion efficiency of ~17% [Wu X, Keane J C, Dhere R G, DeHart C, Duda A, Gessert T A, Asher S, Levi D H, Sheldon P. 16.5%-efficient CdS/CdTe polycrystalline thin-film solar cell. *Proceedings of the 17th European Photovoltaic Solar Energy Conference*, Munich, 22-26 Oct. 2001; 995-1000.]. This conversion efficiency is comparable to those for the single crystalline silicon photovoltaic devises; however, the toxic nature of these materials is of great concern for environment.

Group I-III-VI compound semiconductors, such as $CuInGaSe_2$, have also been extensively investigated for industrial solar power generation systems. This material can potentially be synthesized at a much lower cost than its counterpart, single crystalline silicon. However, a conversion efficiency of ~19%, is comparable to that of single crystalline silicon based cells and can be obtained, thus far, only by combining with the group II-VI compound semiconductor cells [Contreras M A, Egaas B, Ramanathan K, Hiltner J, Swartzlander A, Hasoon F, Noufi R. Progress toward 20% efficiency in Cu(In, Ga)Se polycrystalline thin-film solar cell. *Progress in Photovoltaics: Research and Applications* 1999; 7: 311-316.], which again raises issues associated with the toxic nature of these materials.

Photovoltaic cells designed for several exclusive applications, where the main focus is high conversion efficiency, generally consist of group III-V semiconductors, including GaInP and GaAs. In general, synthesis processes of single crystalline group III-V are very costly because of substantial complications involved in epitaxial growth of group III-V single crystalline compound semiconductors. Typical conversion efficiencies of group III-V compound semiconductor based photovoltaic cells, as these types of photovoltaic cells are intended to be, can be as high as ~34% when combined with germanium substrates, another very expensive material [King R R, Fetzer C M, Colter P C, Edmondson K M, Law D C, Stavrides A P, Yoon H, Kinsey G S, Cotal H L, Ermer J H, Sherif R A, Karam N H. Lattice-matched and metamorphic GaInP/GaInAs/Ge concentrator solar cells. *Proceedings of the World Conference on Photovoltaic Energy Conversion (WCPEC-3)*, Osaka, May 2003; to be published.], usually more than 10 times as expensive as the conventional Si-solar cell.

All photovoltaic cells in the prior art described above, regardless of what materials the cell is made from, essentially fall into one specific type of structure, which usually limits its power generation capability. Usually a flat pn-junction structure is used in conventional solar cells (FIG. 1A). Shown in FIG. 1A is a photovoltaic cell comprising a thick p-type semiconductor layer 101 and a thin n-type semiconductor layer 102 formed on an electrically conductive substrate 100. A pn-junction 103 is formed at the interface between the p-type semiconductor layer 101 and the n-type semiconductor layer 102. Incident light 104 entering the cell generates electron-hole pairs after being absorbed by the p- and also n-type semiconductor layers 101 and 102. The incident light 104 generates electrons 105e and holes 105h in the region near the pn-junction 103 and also electrons 106e and holes 106h in the region far from the pn-junction 103. The photogenerated electrons 105e and 106e (and holes) (hereafter considering only electronics, i.e. minority carriers in p-type semiconductors, although the same explanation is applicable for holes, minority carriers in n-type semiconductors) diffusing toward the pn-junction 103 and entering the pn-junction 103 contribute to photovoltaic effect. The two key factors that substantially impact the conversion efficiency of this type of photovoltaic cell are photo carrier generation efficiency (PCGE) and photo carrier collection efficiency (PCCE).

The PCGE is the percentage of photons entering a cell which contribute to the generation of photo carriers, which needs to be, ideally, 100%. On the other hand, the PCCE is the percentage of photogenerated electrons 105e and 106e that reach the pn-junction 103 and contribute to the generation of photocurrent. For a monochromatic light, a PCGE of ~100% can be achieved by simply making the p-type layer 101 thicker; however, electrons 106e generated at the region far away from the pn-junction 103 cannot be collected efficiently due to many adverse recombination processes that prevent photogenerated carriers from diffusing into the pn-junction 103. Thus, the basic structure of current photovoltaic cells has its own limitation on increasing the conversion efficiency.

FIG. 1B shows typical monochromatic light intensity behavior 108 inside the semiconductor. As illustrated in FIG. 1B, the light intensity behavior 108 inside the bulk semiconductor is exponential. The light intensity p at certain depth x can be expressed as $p(x)=P_o\exp(-\alpha x)$, where $P_o$ is the peak intensity at the surface and $\alpha$ is the absorption co-efficient of the semiconductor in which light is entering. Carriers (not shown here) generated due to light flux 112 absorbed by the pn-junction 103 is only drifted by the junction field and can be collected efficiently, whereas, carriers 106e and 106h generated due to absorption of light-flux 110 by semiconductor region 101 are diffused in all directions. Only those carriers 105e and 105h which are generated closer (a distance equal to or less than the diffusion-length of the semiconductor) to the pn-junction 103 can be collected. Those carriers 106e and 106h which are generated far away (a distance longer than the diffusion-length of the semiconductor) from the pn-junction 103 are recombined and lost. The light flux 112 is usually lost either by leaving out or being absorbed by the substrate.

Both PCGE and PCCE are largely dependent on the material and structure of the photovoltaic cells. Today's photovoltaic cells are structured in such a way that (a) wide ranges of the solar spectrum cannot be absorbed due to material limitations, and (b) PCCE is low due to its inherent structure. For example, the typical conversion efficiency of today's crystal-Si based solar cell is ~18%. Wavelengths of the solar spectrum spread from <0.1 μm to 3.5 μm, but Si can only absorb ~0.4 μm to 0.9 μm of light. ~50% of light belonging to the solar spectrum cannot be absorbed by Si, due to its inherent material properties. The remaining 32% is lost due to (i) recombination of photogenerated carriers and (ii) loss of light, which is represented by 112 in FIG. 1B; these two factors are structure dependent. If we could reduce these two factors, ~50% conversion efficiency could be achieved, even in a Si-based solar cell. If we could capture different wavelengths of light belonging to the solar spectrum by utilizing different alloyed materials, we could increase the conversion efficiency ideally to 100%. Furthermore, if the solar cell detection capability could be extended to the infrared-spectrum, then the solar cell could produce electrical energy not only during the day (while sun is present), but also at night (hereafter defined by when the sun is not out). Additionally, today's solar cell material is not highly radiation-tolerant. Specifically, in space applications, photovoltaic cells should be highly radiation tolerant and have structure and material systems which can generate high-power per unit area.

For both commercial and space applications, therefore, it would be desirable to have photovoltaic cell structures where both the PCGE and the PCCE can be increased simultaneously by having a photo absorption region which is thick enough to capture all the photons entering the cell and a pn-junction which is located as close to the photo absorption region as possible. It would be further desirable to have, while maintaining ideal PCGE and PCCE, materials which have photo responses at different spectrums in order to efficiently cover a wide spectrum of light that enters a photovoltaic cell. It would be further desirable to have a large junction area within a given volume of a photovoltaic cell so that generated electric power that is proportional to the junction area can be maximized. It would be further desirable to have solar cells which could generate electric power in both day and night.

In today's solar cell, high-cost is also a main factor, in addition to the issue of low conversion efficiency. It is found that more than 93% of solar cells are silicon (Si) based, meaning a silicon (Si) wafer is the base material, and the rest are thin-film based solar cells. In manufacturing Si-based solar cells, more than 85% of the cost comes from the Si wafer cost, the remaining comes from other processing costs. It is highly desirable to reduce the wafer cost and at the same time increase the conversion efficiency.

The performance of optical devices depends on how well they capture light and convert it to electrons. Reflection loss is one of the major drawbacks, which degrades performance resulting in lower sensitivity. Since the reflected light is no longer available for conversion into electrons, it is very important to reduce reflection from the top surface of an optical device as much as possible. It is estimated that approximately 30% of light incident on a surface having refractive index of 3 (i.e. optical device) is reflected back and not captured for conversion into electrons in the case of optical device. Light is also reflected back from the surface of the material, if the refractive index of that material is different from the air. More differences in refractive index as compared with air will cause more reflection. To solve this problem antireflection (AR) coating is usually used. In some cases, standard AR coating consisting of multiple pairs of quarter-lambdas thick stacked layers is used, which make them not only thicker than AR-coated layers, but also do not yet make it specifically closer to zero reflection for the desired range wavelength. Moreover, the usage of multiple pairs of stacks escalates material and fabrication costs of surface preparation of, for example, the optical device. Most importantly, as the pairs of stacked are made from different material than the surface material, and thus have different thermal coefficient of expansion (TCE) which causes less reliable for use in various applications where temperature changes are exist.

BRIEF SUMMARY OF THE INVENTION

Accordingly, it is an object of the invention to provide structures of photovoltaic cells, which have high power generation capability per unit area, with respect to the conventional counterparts, mentioned as the prior art.

Accordingly, it is an object of this invention to reduce the recombination of carriers and increase the absorption of light, which effectively increases the photogenerated carriers.

It is an object of this invention to provide solar cell structures based on pyramid, trapezoidal, and cylindrical shaped structures, formed on the supporting substrate or formed on the electronic materials which are formed on the base substrate. The pn- or Schottky junctions are formed with nano-blocks, which generate built-in potential by which photogenerated electrons and holes are swept away, leading to photovoltaic effect.

It is an object of this invention to provide solar cell structures based on nano blocks, such as rods or wires formed on the supporting substrate or formed on the electronic materials which are formed on the base substrate. The pn- or Schottky junctions are formed with nano-blocks, which generate built-in potential by which photogenerated electrons and holes are swept away, leading to photovoltaic effect.

According to this invention, the supporting substrate can be Si, CdTe, Cu, GaAs, InP, GaN, glass, Ge, C, ZnO, BN, $Al_2O_3$, AlN, Si:Ge, CuInSe, II-VI and III-V.

It is an object of this invention to have electronic materials on which nano-blocks (rods, wires, or tubes) can be formed and that electronic materials can be formed on a base substrate such as Si, Ge or glass, to decrease the cost.

It is an object of this invention to provide structures of photovoltaic cells which can capture most of the wavelengths belonging to the solar spectrum and can provide >80% conversion efficiency.

It is an object of this invention to provide structures of the photovoltaic cells which can generate electric power when the sun is and is not out.

This invention offers to ideally achieve >50% conversion efficiency utilizing Si-materials and >80% conversion efficiency for other materials. The main advantage of these inventions are that today's highly matured semiconductor process technologies can allow fabrication of the proposed photovoltaic cell which has much larger power generation capabilities as compared to that of conventional photovoltaic cells.

According to this invention, it is also an object to use the nano or micrometer scaled blocks to increase the surface area and also to increase the amplifying or concentrating the light incident onto the surface. The side of the nano or micrometer(s) scaled blocks could be any shape such as vertical or inclined at specific angle with respect to substrate surface.

Other objects, features, and advantages of the present invention will be apparent from the accompanying drawings and from the following detailed description.

Embodiments disclosed herein pertain to also antireflection coating as a part of a device structure covering all optical devices (including but not limited to solar cell, detectors etc), significantly enhances its optical and electrical performances various embodiments uses a novel set of structures we have invented to enable not only visible, but also broadband antireflection coating for all types of surfaces of any materials.

Some embodiments use an innovative approach to reduce reflection loss by tuning the refractive index to create a graded refractive index AR coating to match the refractive index of air on one side and matching the refractive index of the substrate surface on the other side. Some methods for creating graded index have been implemented such as alternating high index and low index materials with thickness less than wavelength, oblique angle deposition creating porous layer, quintic and modified quintic profiles, and implementing nanostructures. Various embodiments specifically innovate on a class of different nanostructures comprised of nanopillars, nanopyramids, nanocones, and quintic structures, which significantly enhances the graded index antireflection coating to match the refractive index of air to that of the substrate to reduce the index contrast and hence reducing reflection. Various embodiments result in indicate reflectivity of <0.01% for the broadband spectral wavelength of 400-1,000 nm at an incident angle of 0-80°. The broadband can be also extended with suitable material selection and also optimization of the nanostructure parameters. This structure cane be made using the photolithographic technique. Alternatively, similar structure can also be made from nanostructured material formed by chemical synthesis process. In another embodiment, the similar structure is also made from one nanostructure and/or from combination more than one nano structures growing at the same time while form. The nano-structure include but not limited to nano-cone, nano-pillars, nano-pyramid, nano-wires, nanoparticles of same or different sizes etc. The gradient index of refractive index can also be made using nanostructure arranged in a way that the structure stands in vertical direction, horizontal direction, oblique angle, and/or any combination of thereof. These nanostructures are formed in periodic order and/or random order.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

The present invention is expected to be found practically use in making the AR coating on any material surface to significantly reducing the reflection for the light illuminated from wide angle. By optimizing the physical parameters of the nanostructure and selection of a material or material combination, broadband (e.g. ultraviolet Visible, near IR, shortwave IR, Midwave IR, or longwave IR) AR coating is possible. In reverse way, this technique can be also implemented for making the high reflection coating (similar to mirror) using the nanostructures.

BRIEF DESCRIPTION OF THE DRAWINGS

The invention will be explained in more detail in conjunction with the appended drawings wherein:

FIGS. 2A and 2B show the pyramid structures used to achieve the benefit of a larger junction area used in the simulation, and FIG. 2C shows the ratio of the surface area T to the base area A as a function of height h with pyramid base side m as the parameter.

FIGS. 3A and 3B show the trapezoidal pyramid structures used to achieve the benefit of a larger junction area used in the simulation, and FIGS. 3C, 3D, and 3E shows the ratio of the surface area T to the base area A as a function of height h.

FIGS. 4A and 4B show the cylinder structures used to achieve the benefit of a larger junction area used in the simulation, and FIG. 4C shows the ratio of the surface area T to the base area A as a function of height h with cylinder base diameter m as the parameter.

FIGS. 5B and 5C show the ratio of the surface area T to the base area A as a function of height h with cone base diameter m as the parameter.

FIGS. 6A and 6B show the cross-sectional views of a photovoltaic cell structure consisting of the pyramid and trapezoidal shapes in the first embodiment, in accordance with the present invention.

FIGS. 9A, 9B, 9C, 9D, and 9E show the cross-sectional views of a photovoltaic cell structure consisting of the cylindrical shaped structures, made of either substrate material or the nano-blocks, vertically arranged in the fourth embodiment, in accordance with the present invention.

FIGS. 10A, 10B, 10C, 10D, 10E, and 10F show the fabrication process flow of photovoltaic cells comprising of the pyramid-shaped structure in the fifth embodiment in accordance with the present invention.

FIGS. 11A, 11B, 11C, 11D, and 11E, show the fabrication process flow of photovoltaic cells comprising of the trapezoidal-shaped structure in the sixth embodiment in accordance with the present invention.

FIGS. 12A, 12B, 12C, 12D, 12E, and 12F show the fabrication process flow of photovoltaic cells comprising of the cylindrical-shaped structure in the seventh embodiment in accordance with the present invention.

FIGS. 13A, 13B, 13C, 13D, and 13E show the fabrication process flow of photovoltaic cells comprising of numerous cylindrical shaped nano-rods vertically arranged in the eighth embodiment in accordance with the present invention.

FIGS. 14A, 14B, 14C, 14D, and 14E show the fabrication process flow of photovoltaic cells comprising of numerous cylindrical shaped nano-rods vertically arranged and formed on the glass substrate as the base material in the ninth embodiment in accordance with the present invention.

FIGS. 15A, 15B, 15C, 15D, 15E and 15F show the fabrication process flow of photovoltaic cells comprising of numerous cylindrical shaped nano-rods vertically arranged and embedded inside the flexible polymer formed on the glass substrate as the base material in the tenth embodiment in accordance with the present invention FIGS. 16A, 16B, 16C, and 16D are the schematics, showing quintic shaped or quintic like structures used to achieve the benefit of a achieving broadband snit-reflection layer and/or to achieve large junction area in the preferred embodiment, wherein FIG. 16A shows an array of quintic shape structure or quintic shaped pyramids, FIG. 16B shows a zoomed-in view of a single quintic shaped pyramid, FIG. 16C shows variations of refractive indexes with respect to variation in heights in a quintic structure, wherein the width of the quintic structure changes from the top (≈0) to the bottom, the effective index is not a constant value, and FIG. 16D illustrates the reflection characteristics of the optimized quintic structure compared to the plane (flat) substrate.

FIGS. 17A, 17B, and 17C, show the absorption under AM1.5 radiation (1 kW/m$^2$) in the preferred embodiments according to this invention, wherein FIG. 17A shows absorption distribution with variation of a base and a height of a quintic structure pyramid, wherein FIG. 17B shows the absorption with respect to variation of heights of quintic structure pyramids for a fixed length of square base, wherein FIG. 17C shows the absorption with respect to variations of the length of the square bases of quintic structure pyramids for a fixed height.

FIGS. 19A, 19B, 19C, 19D, 19E, and 19F are the cross-sectional views of various photovoltaic cells, comprising with a quintic shaped structures, in the preferred embodiments according to this invention, wherein FIG. 19A depicts the structures with a semiconductor substrate or the conductive metallic layer, wherein FIG. 19B depicts the structures with gaps present between each quintic shaped structure, wherein FIG. 19C shows a photovoltaic structure having the quintic shaped structure are conjoined at the end of each structure, and wherein FIG. 19D shows a photovoltaic structure having quintic structures with a truncated top, wherein FIG. 19E shows a photovoltaic structure having quintic shaped structures are oriented or aligned at an angle with respect to vertical direction. FIG. 19F shows a photovoltaic structure having the quintic structures formed at an angle, and not perpendicular to the substrate.

FIGS. 20A and 20B show the cross-sectional views of a photovoltaic cell comprising with a micro-nano shaped quintic structures in the preferred embodiments according to this invention, wherein, FIG. 20A shows the structure of a photovoltaic with a quintic-shaped or quintic shaped like structures formed from a non-electrically conductive material, and wherein FIG. 20B is photovoltaic cell structure with a quintic-shaped structure formed on an eclectically conductive material.

FIGS. 21A, 21B, and 21C are the cross-sectional views of photovoltaic cell structure a comprising with a quintic shaped structure in the preferred embodiments according to this invention, wherein, FIG. 21A is the photovoltaic cell with a quintic shaped structure formed from a material, with or without a part of an active material forming the photovoltaic cell, and used as a trap structure at the bottom of the photovoltaic cell, and wherein FIG. 21B is the photovoltaic cell comprising with a quintic-shaped structures applied to the bottom of the cell to act as a trap structure, and the electrode is disposed on to the top of the cell acts as a trap structure for light reflected back toward the top of the cell, and wherein in FIG. 21C, the quintic shaped structure is formed from the first electrode at the bottom of the cell while the other layers are flat.

FIGS. 21A and 21B are the cross-sectional views of photovoltaic cell structure a comprising with a quintic shaped structure in the preferred embodiments according to this invention, wherein, FIG. 21A is the photovoltaic cell with a quintic shaped structure formed from a material, with or without a part of an active material forming the photovoltaic cell, and used as a trap structure at the bottom of the photovoltaic cell, and wherein FIG. 21B is the photovoltaic cell comprising with a quintic-shaped structures applied to the bottom of the cell to act as a trap structure, and the electrode is disposed on to the top of the cell acts as a trap structure for light reflected back toward the top of the cell.

DETAILED DESCRIPTION

Figures 1A, 1B:
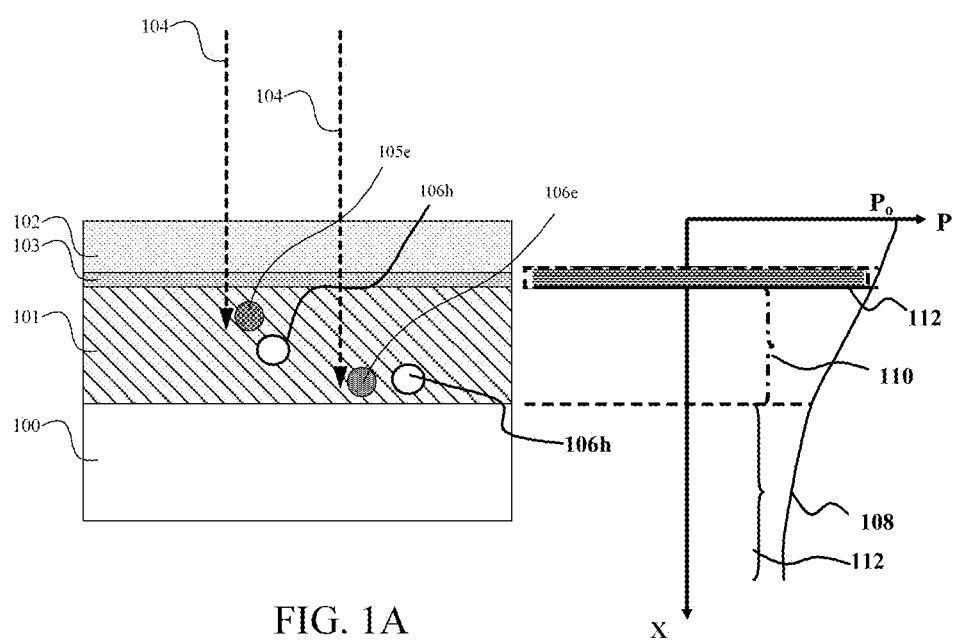
FIGS. 1A and 1B show the cross-sectional view of a conventional photovoltaic cell structure. This is the explanatory diagram representing today's photovoltaic cell and the light intensity behavior inside semiconductor materials.

According to the present invention it is our object to provide several photovoltaic cell structures that increase the surface area, which increases the junction area, which increases conversion efficiency. Before giving the detail explanation of the photovoltaic cell structures and their manufacturing, several simulation results are first given to show the benefits of increasing the surface area.

FIGS. 2A and 2B are schematics representing the pyramid shaped structure 204 uniformly arranged on the substrate 200. FIG. 2C shows the simulation results as function of the pyramid height h, with pyramid base m as the parameter. In FIG. 2A, n number of the pyramids 204 are arranged on the axa sized substrate 200. T/A is the ratio of the surface area of the total pyramids T to the total area of axa A. It is assumed that we could make the n number of pyramids 202 on the axa-area surface. Increase of the ratio indicates the increasing increment of the surface area T as compared to the conventional solar cell, which is usually flat. Assume that pyramid 204, as shown in FIG. 2B, has four sides which are equal in area. As depicted in FIG. 2C, reducing the pyramid base offers more surface for a fixed height.

Figure 3D:
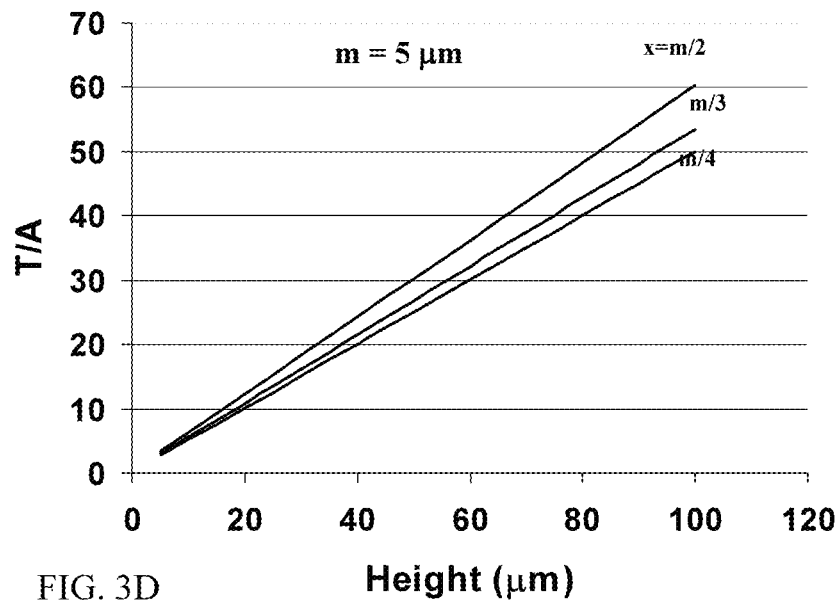
Figure 3E:
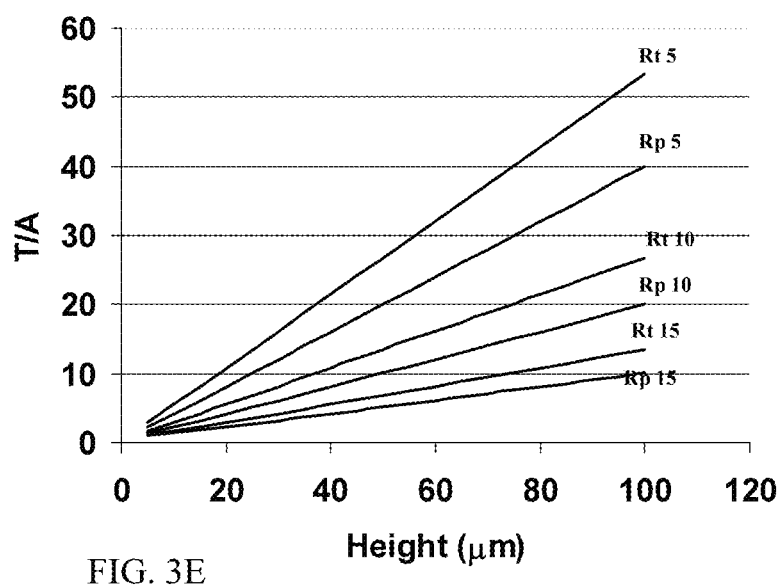

FIGS. 3A and 3B are the schematics representing the trapezoidal shaped structure uniformly arranged on the substrate 300. FIGS. 3C, 3D, and 3E show the simulation results as function of the trapezoidal vertical height h with the bottom base m and the top base x as the parameters, wherein similar numerals represent similar parts as described in the discussion of FIG. 2, so that the similar explanation is omitted. Reducing the bottom base increases significantly the surface area for the fixed top base because more structures can fit on the same area. Also that, the reducing the top base will reduce the surface area as compared with the pyramid shaped structure, where top and bottom bases are equal.

FIGS. 4A and 4B are the schematics representing the cylindrical shaped structure uniformly arranged on the substrate 400. FIG. 4C is the simulation results as function of the cylinder height h with cylinder base diameter m as the parameter. In FIG. 4A, n number of cylinders are arranged in axa sized substrate 400. T/A is the ratio of the surface area T of the total cylinders arranged vertically, to the total area A of axa. It is assumed that we could make the n number of cylinders 402 on the axa-area surface. Increase of the ratio indicates the increment of the surface area T as compared to the conventional solar cell, which is usually flat. As depicted in FIG. 4C, reducing the pyramid base offers more surface area for the fixed height.

Figure 5A:
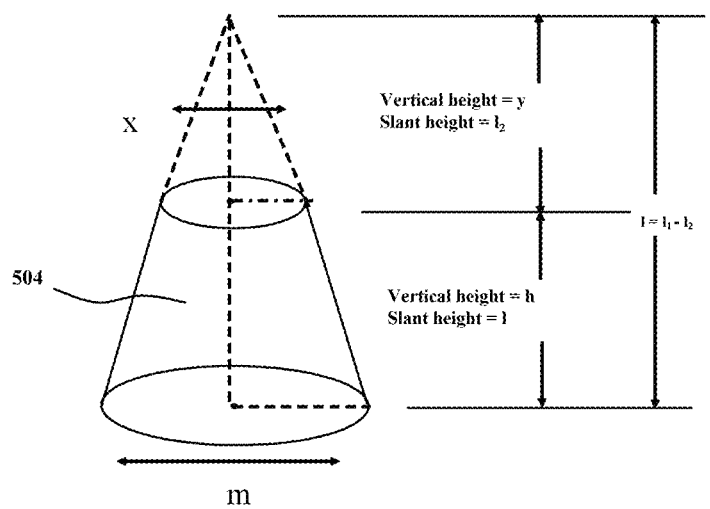
FIG. 5A shows the cone structures used to achieve the benefit of a larger junction area used in the simulation.
Figure 5B:
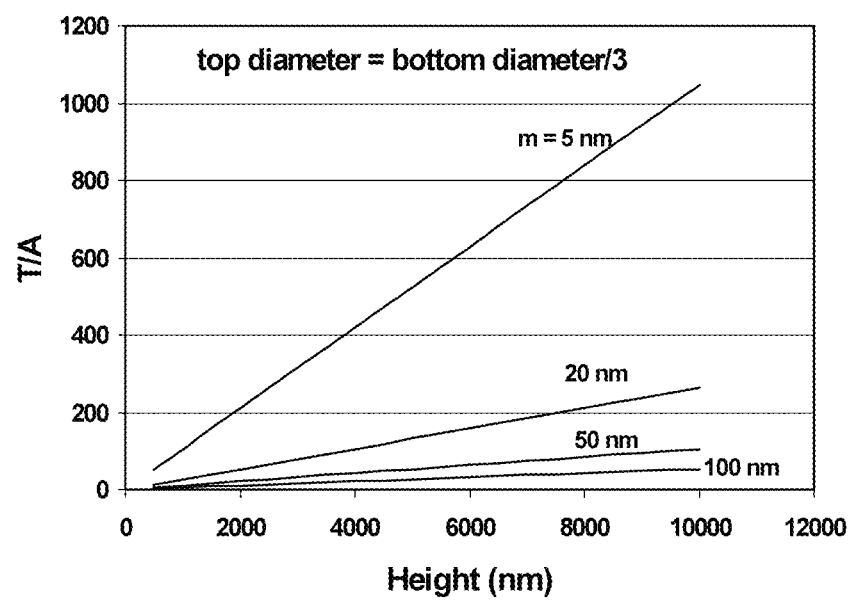

FIG. 5A is the schematic representing the opened-cone shaped structure uniformly arranged on the substrate, and FIGS. 5B and 5C are the simulation results as function of the cone vertical height h, where the open base m is the parameter, wherein similar numerals represent similar parts as described in the discussion of FIG. 4, so that the similar explanation is omitted. Reducing the bottom base increase significantly the surface area for the fixed top base because more structures can fit on the same area. Also that, the reducing the top base will reduce the surface area as compared with the cone shaped structure, where top base is zero.

According to a preferred embodiment illustrated in FIG. 6A, a photovoltaic cell comprising a plurality of micrometer(s)-scaled pyramids 601 are formed on the supporting substrate 600 (after having groove). The micrometer(s)-scaled pyramids 601 can have metallic electrical conduction, p-type or n-type semiconductor electrical conduction. The micrometer(s)-scaled pyramids 601 are surrounded by an electronic material 602 having metallic electrical conduction, p-type or n-type semiconductor electrical conduction. The electronic material 602 can be a separate material or electronic materials of p or n type formed inside 601 and 600. The electronic material 602 and the supporting substrate 600 are further electrically connected to electrodes 603a and 603b, respectively. The electrodes 603a and 603b are intended to serve as common electrodes that connect all pyramids 601. The electrode 603a is provided for the electronic material 602 or junction 608. The electrode 603a can be transparent (not shown here) and can be formed on the electronic material 602 or junction 608. The interface between the micrometer scaled pyramids 601 and the electronic material 602 (or junction 608) form pn- or Schottky junctions where built-in potential for both electrons and holes is generated.

According to this invention, alternatively the micrometer(s)-scaled pyramids 601 can be formed on a separate substrate (not shown here), and the electrode 603b can be formed on the substrate to have a common contact for each micrometer(s)-scaled pyramid 601, necessary for creating a junction. In way of an example not way of limitation, the nanometer(s)-scaled pyramids 601 can be made of n-type semiconductor and the electric material 602 that is on or surrounds the micrometer(s)-scaled pyramids 601 can be made of p-type semiconductor. Incident light 604 enters the photovoltaic cell through either the electrode 603a or on the material 602 or junction 608. (In FIG. 6A, the incident light enters the photovoltaic cell through the electrode 603a). The incident light 604 travels through pyramids 601, electronic material 602 (n or p-type) or junction 608, and the substrate 600. As the incident light 604 travels through the micro-scaled pyramids 601 and electronic material 602, numerous electrons (not shown here) are generated in the region near the electrode 603a. Portions of light 604 which pass through the valley portion of the pyramids 601 where another electronic material 607 is used for passivation or to make the junction in between micro-scaled pyramids 601, are traveling through the electronic material 602 and the supporting substrate 600, which generates electrons (not shown here). Some that are generated closer to electronic material 602 are collected and some that are generated in the region far from the electronic material 602 are recombined and lost. It should be pointed out that electrons are apparently generated all over the region along the thickness of the electric material 602 or junction 608. In addition, as the incident light 604 travels through the micrometer(s)-scaled pyramids 601, numerous holes (not shown here) are generated in the pyramids 601 and in the substrate 600. It also should be pointed out that holes are apparently generated all over the region along the thickness of the micrometer(s)-scaled pyramids 601 and the substrate 600. Photogenerated electrons generated in the electronic material 602, pyramids 601, and substrate 600 diffuse toward pn-junctions 608, created at the interface between the micrometer(s)-scaled pyramids 601 and the electronic material 602, and also at the interface between the electronic material 602 and substrate 600. At the pn-junctions 608, the electrons and the holes are swept away by built-in potential, thus photovoltaic effects set in.

Unlike a conventional solar cell, the solar cell shown in FIG. 6A has pn-junctions on all sides of the pyramids 601. The pn-junctions 608 formed in the side of the pyramids 601 have height h and a surface area dependent on the height h of the pyramids 601. The light 604 travels at an angle to the direction of the pn-j unction 608 formed across the side of the pyramids 601. Most of the light flux incident on the pn-junction 608 is absorbed and most of the photogenerated carriers can be collected. Most of the light flux incident onto the sides can also be absorbed, and the carriers generated by the light 604 can be collected without recombination (ideally). It is apparent that utilizing the solar cell shown in FIG. 6A can (i) reduce the recombination and (ii) absorb all photo-flux, thereby increasing the conversion efficiency.

According to a preferred embodiment illustrated in FIG. 6B, a photovoltaic cell comprising a plurality of micrometer(s)-scaled trapezoids 610 are formed on the supporting substrate 600 (after having groove). The only difference in FIG. 6B, as compared to FIG. 6A, is that the top 612 is opened and receives a portion of the light 604. Again, because the surface area of the junction for receiving the light 604 is increased, there is a reduction of the photogenerated carrier recombination and absorption of all photo-flux incident on the surface, thereby increasing the conversion efficiency.

Apparent advantages of this invention over conventional photovoltaic cells are directly associated with the fact that, unlike conventional photovoltaic cells, large portions of the pn-junctions are used for collecting photogenerated carriers created in the electronic material 602. This is true regardless of where the carriers were generated because the distance they have to diffuse to reach the pn-junctions, created on the surface of the pyramids (601) or trapezoids (610), is within the range of the diffusion length of the carriers and independent of the location where they were generated. Furthermore, the distance the photogenerated carriers created in the pyramids (601) or trapezoids (610) have to diffuse to reach pn-junctions is within the range of the diffusion length of the carriers, regardless of where they were generated. By properly selecting height h and the base m of the pyramids (601) or trapezoids (610), all carriers generated inside the semiconductor can be collected. According to this invention, the recombination can be zero (ideally), all photon flux can be absorbed (ideally), and the conversion efficiency can be ~100%, and >50% using Si. On the other hand, as explained in the description of the prior art shown in FIG. 1, in conventional photovoltaic cells, pn-junctions are perpendicular to the direction to which incident light travels and the photogenerated carriers generated in region far away from pn-junctions need to diffuse much longer distances (diffusion-length) than that for the photogenerated carriers generated near the pn-junctions. Thus, they have a greater chance to recombine without contributing to photovoltaic effects. Therefore in this invention, PCCE is expected to be much higher than that of conventional photovoltaic cells. In addition, it is evident that the total effective area that contributes to photovoltaic effect in this invention can be increased significantly by a few orders (>3000) (using a 300 mm diameter substrate, 500 µm height rods having 50 nm diameter and 50 nm pitch).

According to this invention, in way of an example not way of limitation, the supporting substrate 600 can be n-type or p-type Si of <100> orientation, on which the pyramids (601) or trapezoids (610) can be formed by using the process of patterning, using the standard photolithographic technique, and wet etching, using KOH solution. The dopants of opposite type of the substrate can be diffused into the surface of the pyramids (601) or trapezoids (610) to form the electronic material 602 of Si p-type. Conformal deposition of the dielectric material (not shown) can be done for planarization, and in this case silicon oxide or polymer can be used. Without dopant diffusion, the electronic material 602 can be separate Si-epitaxial growth to make the junction with the Si-substrate.

According to this invention, in a way of an example not way of limitation, the supporting substrate 600 can be Ge, GaAs, InP, GaN, ZnO, CdTe, or any suitable semiconductor substrate in which pyramids 601 or trapezoids 610 can be formed. Alternatively, the supporting substrate 600 can be a polymer material or metal (e.g. copper) on which the semiconductor can be deposited or formed either by deposition or electrolytic way, and the pyramid 601 and trapezoid 610 are formed on the substrate before the semiconductor is formed on it.

Figure 7:
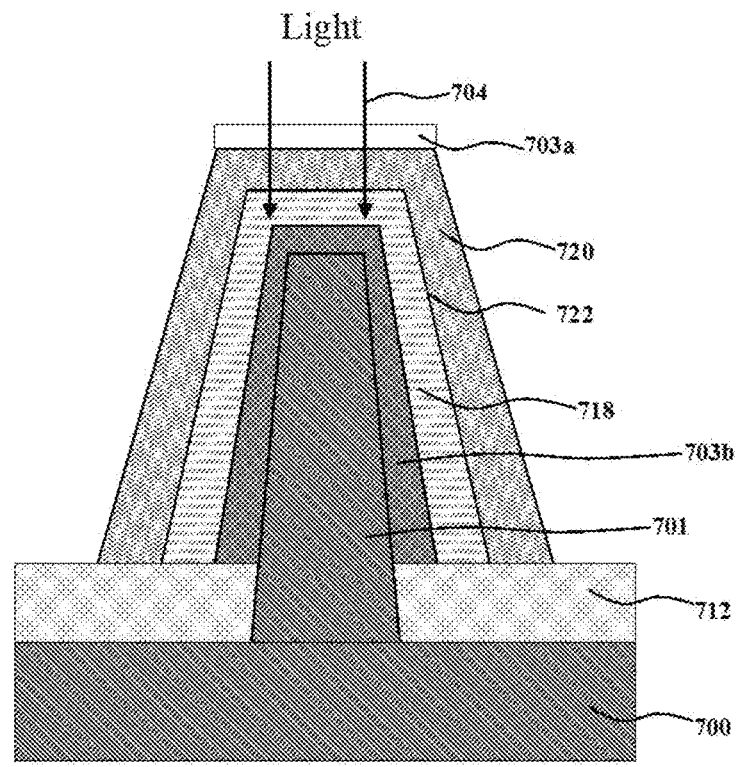
FIG. 7 shows the cross-sectional view of a photovoltaic cell structure consisting of the trapezoidal shapes in the second embodiment, in accordance with the present invention.

In an alternative preferred embodiment shown in FIG. 7, a photovoltaic cell comprises a plurality of micro or nanometer(s)-scaled trapezoids or cylinders 701, which are electrically connected to a substrate 700. The cylinders, trapezoids, or pyramids 701 can have metallic electrical conduction, p-type or n-type semiconductor electrical conduction. The dielectric layer 712 on the substrate 700 isolates the cylindrical or trapezoidal shaped rods. The micro or nanometer(s)-scaled trapezoids, pyramids, or cylinders 701 are surrounded by electronic materials 718 and 720 having metallic electrical conduction, top and bottom contacts 703a and 703b. The electronic materials 718 and 720 form p-type or n-type semiconductor electrical junction 722. The electronic materials 718 and 720 can be separate materials or electronic materials of p or n type formed inside or on 701 and 700. The electronic materials 720 and 718 are further electrically connected to electrodes 703a and 703b, respectively. The electrodes 703a and 703b are intended to serve as common electrodes that connect all cylindrical pyramid, or trapezoidal shaped electrical junctions 722. The electrode 703a is on the electronic material 720. The interface between the nanometer(s)-scale rods 701 and the electronic material 720 form pn- or Schottky junctions 722, thus there are pn- or Schottky junctions on both sides, inside and outside, of the micro or nanometer(s)-scale trapezoidal, pyramid or cylindrical rods 701.

According to this invention, alternatively the nanometer(s)-scale rods 701 can be formed on the substrate (not shown here), and the electrode 703a can be made on the substrate to have a common contact for each nanometer(s)-scale rod 701, necessary for creating a junction.

In way of an example not way of limitation, the micro or nanometer(s)-scale trapezoidal, pyramid, or cylindrical rods 701 can be made of metal and the electronic materials 718 and 720 that surround the micro or nanometer(s)-scale trapezoidal, pyramid, or cylindrical rods 701 can be made of p-type semiconductor; thus, the interface of 718/720 forms pn-junctions 722 in the micro or nanometer(s)-scale trapezoidal, pyramid, or cylindrical rods 701. Incident light 704 enters the photovoltaic cell through the electronic material 720 (front-side of the cell). As the incident light 704 travels through the electronic material 720, numerous electrons (not shown here) are generated. It should be pointed out that electrons (of electron-hole pairs) are apparently generated all over the region along the thickness of the nanometer(s)-scale rods 701 and also the gaps in between rods 701. Photogenerated electrons in the electronic materials 718 and 720 made of p and n-type-type semiconductors then diffuse toward pn-junctions 722 in the interface of 718/720. At the pn-junctions, the diffused electrons are swept away by built-in potential, thus photovoltaic effects set in.

Common advantages are previously described for the photovoltaic cell in the discussion of FIG. 6. The only difference is the forming of the nano-scaled rods, which are formed without forming the grooves.

According to this invention, in way of an example not way of limitation, the supporting substrate 700 can be Si, on which trapezoids or slanted cylinders can be made by conventional photolithography followed by wet etching, using standard etchant (e.g. KOH solution). In order to isolate the trapezoids, a dielectric layer of silicon oxide can be used. Different types of thin-films, of p-type and n-type, can be deposited on the slanted cylinders 701 after uniform metallization, to form the electrode 703b. The thin films could be any suitable thin film which could form the junction. For example, they are the combination of CdTe/CdS, Zn(Cd)Te/Zns, ZnO based materials, Si based alloyed material (e.g. Si:Ge or a-Si), GaAs or InP based alloyed materials, etc. Conformal deposition of the electronic material can be done based on the slant angle and planarization (not shown here).

According to this invention, in way of an example not way of limitation, the supporting substrate 700 can be Ge, GaAs, GaN, InP, GaN, CdTe, or ZnO.

Figure 8:
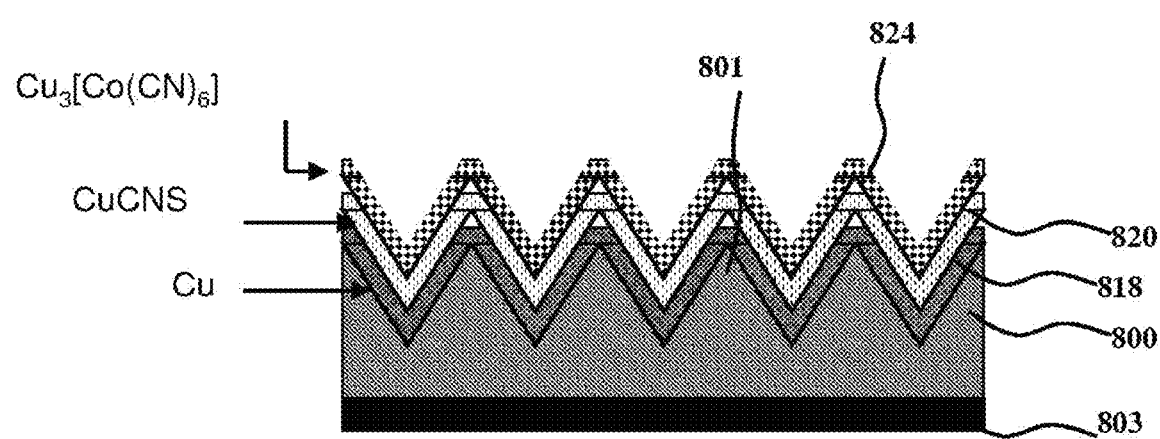
FIG. 8 shows the cross-sectional view of a photovoltaic cell structure consisting of the pyramid-shaped structures in the third embodiment, in accordance with the present invention.

In an alternative preferred embodiment shown in FIG. 8, a photovoltaic cell comprises a plurality of micro-meter(s) scaled pyramids or trapezoids 801 (pyramids shown in FIG. 8), which are electrically connected to a substrate 800. The micro-meter(s) scaled pyramids or trapezoids 801 are surrounded by electronic materials 818 and 820 having metallic electrical conduction. The electronic materials 818, 820, and 824 and the supporting substrate 800 are further electrically connected to electrode 803. The micro-meter(s) scaled pyramids or trapezoids have a top surface consisting of a electronic material 824, which can have metallic electrical conduction, with suitable electrolyte solution (not shown). To collect the charge from the electrolyte, another electrode needs to be placed in the electrolyte. The substrate 800 can be a metal such as copper and can be formed into a pyramid or any cylindrical structure. Alternatively, the metal can be formed onto the substrate 800, which has a pyramid surface. By using an electrolyte based solution, CNS solution, CuCNS film can be formed onto the substrate 800 as $Cu+CNS^- \rightarrow CuCNS$. Again, a copper hexa cyanide layer can also be formed onto the CuCNS by electrolyte processes as $CuCNS+K_3[Co(CN)_6] \rightarrow Cu_3[Co(CN)_6]+KCNS$. A dye molecule, such as rhodamine, can be put into the copper hexacyanide layer formed on CuCNS. By using the appropriate electrolyte solution, the structure shown in FIG. 8 can generate charge under illumination. As the surface area is increased the conversion efficiency can be increased significantly. It should be noted that the dye sensitization is successful in some semiconducting materials which are less important in efficient solar cell manufacturing such as $TiO_2$, $SnO_2$, $SnS_2$, CuCNS, ZnO, CuI and $WO_3$. These semiconductors provide advantages because they can be fabricated in spray pyrolysis, sol-gel or dip coating techniques. They are relatively stable at semiconductor/electrolyte junctions because many of them are oxides or stable forms of metal halides.

In an alternative preferred embodiment shown in FIGS. 9A, 9B, 9C, 9D, and 9E, a photovoltaic cell comprises a plurality of micrometer(s) or nanometer(s)-scaled rods (or cylinders) 901, which are electrically connected to a substrate 900. The micrometer(s) or nanometer(s)-scaled rods (or cylinders) 901 can have metallic electrical conduction, p-type or n-type semiconductor electrical conduction. The micrometer(s) or nanometer(s)-scaled rods (or cylinders) 901 are surrounded by an electronic material 902 having metallic electrical conduction, p-type or n-type semiconductor electrical conduction. The electronic material 902 can be a separate material or electronic materials of p or n type formed on 901 and 902. The electronic material 902 and the supporting substrate 900 are further electrically connected to electrodes 903a on the top side and another on the substrate side (not shown here). The interface between the nanometer(s)-scale rods 901 and the electronic materials 902 form pn-junctions 908, thus creating built-in-potential for collecting photo-generated carriers. The main difference between the solar cell shown in FIG. 9A and others of FIGS. 9B, 9C, 9D, and 9E is that the micrometer(s) cylinder is formed on the supporting substrate 900. For example, if Si of (111) is used as the substrate 900, the vertically arranged cylinders 901 can easily be formed using standard wet etching processes. Passivation material or polymer 945 can be used for plannarization and also to reduce the surface recombination.

According to this invention, as shown in FIGS. 9B and 9C, the nanometer(s)-scale rods 901 are formed on the material or directly onto to the Si-substrate 900. In all cases, either thinner Si-substrates 900 can be used or the portion of the substrate 900 can have a smart-cut to reuse it again. The main difference between FIGS. 9B and 9C is that, the glass 930 is bonded directly to the remaining substrate (or thinner Si-substrate) by anodic bonding process in the case of FIG. 9B. In FIG. 9C, the glass 930 is bonded after forming the Silicon Oxide 940 on to the Si-Substrate. The differences in FIGS. 9D and 9E are that the initial substrate is a glass 930 type substrate (not shown in case for FIG. 9E) on which metal and the poly or a-Si 950 is deposited before forming the nanometer(s) rods 901. In the case of FIG. 9E, the glass substrate is taken out and the rods are embedded with the conductive polymer electronic material 945 to make the solar cell flexible. The details of these fabrication processes are explained later.

In way of an example not way of limitation, the electronic material 902 that surrounds the nanometer(s)-scale rods 901 can be made of p-type semiconductor, thus the interface of 902/901 forms pn junctions 908. Incident light 904 enters into the photovoltaic cell through the electronic materials 901, 902, 900 (for FIGS. 9A, 9B, and 9C), and 950 (for FIGS. 9D and 9E). As the incident light 904 travels through the electronic materials 901, 902, 900, and 950, numerous electrons (not shown here) are generated in said electronic materials. It should be pointed out that electrons (of electron-hole pairs) are apparently generated all over the region along the thickness of the electronic materials 901, 902, 900, and 950. Photogenerated electrons in the electronic materials 901, 902, 900, and 950, then diffuse toward pn junctions in the interface of 902/901 and 902/900 for FIGS. 9A, 9B, and 9C, and 902/901 and 902/950 for FIGS. 9D and 9E. At the pn-junctions, the diffused electrons are swept away by built-in potential, thus photovoltaic effects set in.

According to this invention, in way of an example not way of limitation, the supporting substrate 900 can be n-type Si, n-type InP, or InP-based alloy rods 901, which are formed directly onto the Si-substrate or onto lattice matched InP or InP based alloy formed on the Si-substrate. The p-type InGaAs layer(s), having broad spectral absorption ranging from as low as <0.3 µm to as high as 2.5 µm, is formed as the electronic material 902 of p-type. The metal contacts (not shown here) can be formed on InGaAs and substrate 900. Conformal deposition of the dielectric material (not shown) can be done for planarization, and in this case silicon oxide or polymer can be used. Using single or multiple layers of the InGaAs helps absorb more wavelengths of light from <0.3 µm to 2.5 µm, which belongs to the solar spectrum.

According to this invention, in way of an example not way of limitation, the supporting substrate 900 can be Ge, GaAs, GaN, CdTe, ZnO, Cu, Al2O3, AlN, etc.

According to this invention, in way of an example not way of limitation, the supporting substrate 900 can be n-type Si, on which lattice matched InP or InP based alloy is formed. Next, n-type InP, or InP-based alloy rods 901 are formed. The p-type InGaAs layer(s), having broad spectral absorption ranging from as low as <0.3 µm to as high as 2.5 µm, and an InSb based electronic material (not shown here) is formed as electronic materials of p-type. The metal contacts (not shown here) can be formed on InGaAs and substrate 900. Conformal deposition of the dielectric material (not shown here) can be done for planarization, and in this case silicon oxide or polymer can be used. Using single or multiple layers of the InGaAs and other antimony based electronic materials helps to absorb more wavelengths of light from <0.3 µm to 3.5 µm, which belongs to the solar spectrum. Apparently, in addition to the common advantages over the prior art, already discussed in FIGS. 6-9, the additional advantage of the cell with multiple junctions formed on the electronic material as compared to the single junction of the photovoltaic cells described in FIGS. 6-9, is to have the capability of covering the wide range of spectrums contained in incident light and converting a wide range of the spectrum to photogenerated carriers. Dozens of different layers could be stacked in order to catch photons at all energies, to absorb a wide band of the solar spectrum, from lower wavelengths (as low as X-ray) to longer wavelength (e.g. long infrared). The addition of multiple junctions of different materials which could absorb a wide range of the solar spectrum, plus the increase of the junction area by using the rods, will help increase the conversion efficiency close to 100% (ideally). According to this invention, dozens of materials, which could absorb a wide range of the solar spectrum may or may not require the lattice mismatch with the rod, wires, or tubes. Lattice matched material could further increase the power generation due to reduction of the recombination.

According to this invention, in way of an example not way of limitation, the supporting substrate 900 can be Ge, GaAs, GaN, CdTe, ZnO, Cu, Al2O3, AlN, etc.

FIGS. 10A, 10B, 10C, 10D, 10E, and 10F are the schematics showing the fabrication process of the photovoltaic cell using pyramid structures, according to this invention, wherein similar numerals in FIG. 10 represents the same parts in FIG. 6A, so similar explanations are omitted. According to this invention, supporting substrate 1000 can be crystal-Si, Ge, GaAs, or InP. Standard silicon oxide 1012 is formed around the substrate and it is used as the mask. After standard photolithography and wet-etching, grooves (pyramids) 1001 are formed onto the front surface of the substrate 1000. A certain crystal orientated substrate is to be used to achieve the pyramid/grooves structure. For example, in Si substrate case, <100> orientation Si is to be used for achieving the grooves.

After forming pyramid structures 1001, the electronic material 1002 is formed on the surface of the pyramids 1001. The electronic material 1002 forms the junction with substrate material 1000. To make the pn-junction a dissimilar type (p or n) an electronic material 1002 is to be used. If the substrate 1000 is n-type Si, p-type Si is to be formed as the electronic material 1002. This can be achieved by diffusion of p-dopants into the n-type substrate. The interface of 1001/1002 forms the junction which has the built-in-potential to create the photovoltaic effect in large surface area. Finally, a passivation layer or conformal layer of dielectric or polymer 1007 is formed on the electronic material 1002. Final stages are to make the planarization using insulator layer 1007 and contacts 1003a and 1003b. Both contacts 1003a and 1003b can be taken from the back side of the substrate after planarization for completing the solar cell, as shown in FIG. 10F.

FIGS. 11A, 11B, 11C, 11D, and 11E are the schematics showing the fabrication process of the photovoltaic cell using trapezoid structures according to this invention. Like FIG. 10, the fabrication process is the same to make the trapezoidal structures. The only difference with FIG. 6 is that trapezoidal/open pyramids (by selecting the pattern) are made on the substrate. The explanation of the fabrication process the cells is previously explained in FIG. 10, so that repeated explanation is omitted here.

FIGS. 12A, 12B, 12C, 12D, 12E, and 12F are the schematics showing the fabrication process of the photovoltaic cell using cylindrical structures according to this invention. Like FIGS. 10 and 11, the fabrication process flow is the same. The only difference in FIG. 12 is that cylindrical structures are formed on the supporting substrate. In this case, a different orientation from FIGS. 10 and 11 is used. For example, if Si-substrate is used as the supporting substrate, <111> orientation is used in order to achieve a vertically arranged cylindrical structure. The explanation hereafter is previously explained in FIGS. 10 and 11, so that repeated explanation is omitted here. In the cases of FIGS. 10, 11, and 12, the micrometer(s) scaled structures can be made using the standard fabrication processes which should be known to anyone skilled in the art.

FIGS. 13A, 13B, 13C, 13D, and 13E are the schematics showing the fabrication process of the photovoltaic cell comprising nanometer(s) scale rods according to this invention, wherein similar numerals in FIG. 13 represents the same parts in FIG. 12, so that similar explanations are omitted. According to this invention, supporting substrate 1300 can be crystal-Si, Ge, GaAs, or InP.

According to this invention, in way of an example not way of limitation, the supporting substrate 1300 can be Si. Standard silicon oxide 1312 is formed around the substrate 1300 and is used for deposition of Si on deposited Silicon oxide 1312 (glass). After formation of the poly or a-Si 1360 on glass 1312, the silicon substrate can have the smart cut to reuse again. The smart cut can be done using the standard Si-smart-cut in which thinned silicon 1300 can be left. This is followed by the glass 1330 bonding process using the anodic bonding technique. Hoya Glass manufacturer, located in Japan, markets the Glass which has a thermal expansion close to the Si-substrate. Poly silicon can be formed either before or after the smart-cut and bonding processes. This is followed by the formation of the nanometer(s) scale rods 1301 on the Si-epi layer 1360. After formation the nano-sized metals (not shown here) act as a metal catalyst for forming the rods. Using conventional chemical vapor deposition techniques, the rods 1301 can be formed. Electronic material 1302 of opposite type from the rods 1301 is deposited on the surface of the rods 1301. Alternatively, diffusion processes can be used for doping the rods to make the specific (n or p type) semiconductor, for the Si rods case. Note here that Si-layer 1360 and rods 1301 could be the same type (e.g. p or n-type) to make the pn-junction with the electronic material 1302. For making the planarization, conformal deposition of the silicon-oxide or polymer 1307 can be used (not shown here). The final stages are to make the planarization and contacts of 1303a, and another on the Si-epi layer (not shown here).

FIGS. 14A, 14B, 14C, 14D, and 14E are the schematics showing the fabrication process of the photovoltaic cell comprising nanometer(s) scaled rods, according to this invention. Like FIG. 13, the nanometer(s) rods 1401 are formed on the electronic material epi-layer 1360 (e.g. Si-epi layer). FIG. 14 and FIG. 13 are substantially similar, but one difference is that the initial substrate is the glass 1430, on which the epi layer of Si 1460 can be grown. In addition, another difference is that the contact of 1403b is formed on the glass substrate 1430 prior to forming the epi-layer. Once epi layer 1460 is grown, the processes flow similar to that of FIG. 13, such as formation of the rods 1401, growing of the electronic material 1402 to form the junction 1408 with the semiconductor rods 1401, planarization and also the formation of both contacts 1403a and 1403b, so that repeated explanation is omitted here.

FIGS. 15A, 15B, 15C, 15D, and 15E are the schematics showing the fabrication process of the flexible photovoltaic cell comprising nanometer(s) scale semiconductor rods, vertically arranged according to this invention. Like FIG. 14, the base substrate 1530 is the glass substrate. It can cover also other polymer (having high glass temperature) type substrates where an epi-layer can be grown. Glass substrate 1530 can have a thickness significant enough to do the process. The growing of the nanometer(s) scaled rods 1501 and electronic material 1502 to form the junction are the same as described in FIG. 14. The only difference in FIG. 15 is that flexible conductive electrical polymer material 1570 is used to embed the nanometer(s) scale rods 1501. Planarization and the formation of the contact layer 1503a can be done after embedding the nanometer(s) scaled rods 1501. The glass substrate can be thinned out or completely taken out for enhancing the flexibility. The detailed process is previously explained in FIGS. 10-14, so that repeated explanation is omitted here.

According to this invention, the electronic material formed on the micrometer(s) or nanometer(s) scaled rods, cylinders, trapezoids, and pyramids, explained in FIGS. 6-15, is a single layer used to form the semiconductor pn-junction. The electronic material can be multiple layers to form multiple junctions to capture a wide range of the solar spectrum to increase the power generation.

According to the inventions, as explained in FIG. 6 thru 15, the pyramids, trapezoids, cylinders, or rods are used to increase the junction so that the junction can be extended closer to the region where the photo generated carriers are formed. The 3-dimensional (3D) structures (pyramids, trapezoids, cylinders, or rods) can be used as the part of the electronic material to form the junction. This structure can be formed utilizing a suitable substrate. The substrate can be used to form the structure when the junction is formed utilizing the other electronic materials formed on to the 3D structures.

According to this invention, the micrometer(s) scaled pyramid, cylinder, rod, or trapezoid can be made utilizing the orientation of the semiconductor substrate. In this case Si, InP, GAAs, Ge, CdTe, MN, etc can be used as the substrate.

According to this invention the rods could be GaN materials (n or p type) and the dozens of materials could be $In_{1-x}Ga_xN$ (p or n type, opposite to GaN rods). By increasing the Ga contents, the band-gap of InGaN can be increased to ~3.4 eV, which is the same as that of GaN. By increasing the In contents in InGaN, the band gap can be reduced to ~0.65 eV. Photons with less energy than the band gap slip right through. For example, red light photons are not absorbed by high band-gap semiconductors, while photons with an energy higher than the band gap are absorbed—for example, blue light photons in a low band-gap semiconductor; the excess energy is wasted as heat.

According to this invention, alternatively the rods could be III-V based materials (n or p type), for example InP, and the dozens of the materials could be III-V based material like $In_{1-x}Ga_xAs$ (p or n type, opposite to InP rods). In this case, by adjusting the In contents, the band gap can be tuned and thereby a wide spectrum of solar energy can be absorbed.

According to this invention, alternatively the rods could be II-V based materials (n or p type), for example CdTe, and the dozens of the materials could be II-VI based material like CdZnS (p or n type, opposite to CdTe rods) or Zn(Cd)Te/ZnS based materials. In this case, by adjusting the Zn contents, the band gap can be tuned and thereby a wide spectrum of solar energy can be absorbed.

According to this invention, alternatively the rods could be Si or amorphous Silicon materials (n or p type) and the dozens of the materials could be Si:Ge alloy (p or n type, opposite to Si rods). In this case, by adjusting the Ge contents, the band gap can be tuned and thereby a wide spectrum of solar energy can be absorbed.

According to this invention, alternatively the rods could be Si, InP, or CdTe (n or p type) and dozens of different materials could make the junction with the rods (wires or tubes) and each type of material would have a specific band gap for absorbing a specific range of the solar spectrum. In this way a wide range of the solar spectrum can be absorbed, and by increasing the junction area (due to use of the rods, wires, or tubes), the electrical power generation could be increased tremendously (50 times and beyond).

According to this invention, the nanometer(s)-scale wires, rods or tubes, mentioned in the preferred embodiments, can be any kind of electronic materials, semiconductor, insulator, or metal.

According to this invention, the nanometer sized rods, wires or tubes can be made from semiconductors such as Si, Ge, or compound semiconductors from III-V or II-VI groups. As an example for rods, wires, or tubes, InP, GaAs, or GaN III-V compound semiconductors can be used and they can be made using standard growth processes, for example, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AlN, Silicon-oxide, etc.

According to this invention, the nanometer sized rods, wires, or tubes based on an II-VI compound semiconductor can also be used. As an example CdTe, CdS, Cdse, ZnS, or ZnSe can be used, and they can be made using standard growth processes, for example, sputtering, evaporation, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers, ceramics such as AlN, Silicon-oxide, or metal etc.

According to this invention, the rods, wire, or tubes, mentioned earlier to make the photovoltaic cell, can be micro or nano scaled and their sides could be vertical or inclined (in shape) at an angle (e.g $\alpha$) with respect to the surface of substrate. Alternatively, the side could be nay shape convenient to manufacturing and increase the surface area. The advantage of using the inclined side is to concentrate the incident light falling onto the side and the gap in between the rods, wires, or tubes.

According to this invention, the nanometer sized rods, wires, or tubes can be made from carbon type materials (semiconductors, insulators, or metal like performances), such as carbon nano-tubes, which could be single or multiple layered. They can be made using standard growth processes, for example, MOCVD, MBE, or standard epitaxial growth. According to this invention, the self-assembled process can also be used to make wires, rods, or tubes and their related pn-j unction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AlN, Silicon-oxide, etc.

Figure 16A:
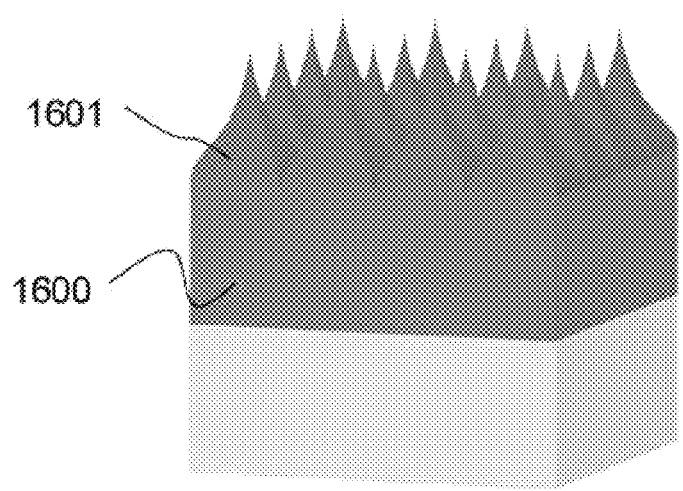
Figure 16B:
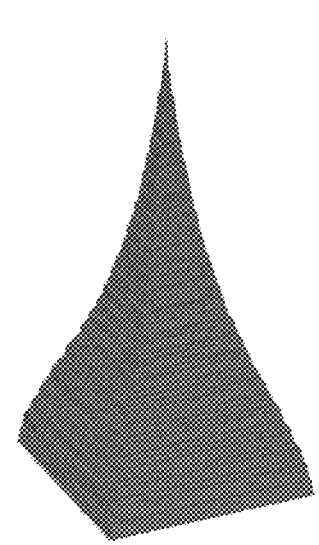
Figure 16C:
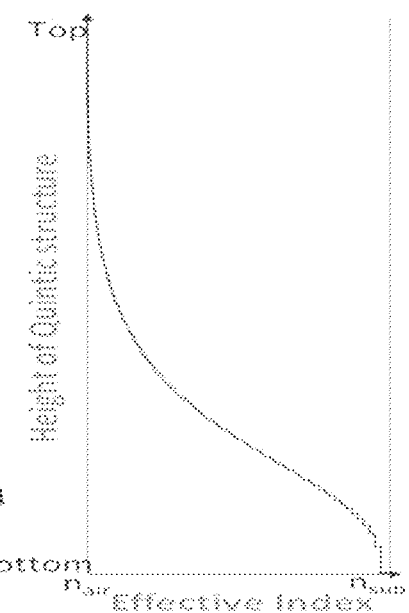

Alternatively, according to this invention, in way of an example not way of limitation, the photovoltaic cell comprising with a quintic-shaped micro-nano scaled structures can also be made as is shown in FIG. 16A, FIG. 16B FIG. 16C, and FIG. 16D, wherein micro- or micronano scaled quintic shaped structure (i.e. pyramid shaped with curved surfaces) are used to increase significantly conversion efficiency of photovoltaic cell by increasing the surface area to volume. This allows reducing the amount of material used, and makes the photovoltaic cell flexible. FIG. 16A is the enlarged cross-sectional view of a part of photovoltaic cell using of a quintic shaped 3D structure in a preferred embodiment in accordance with the present invention, wherein like parts are indicated by like or similar reference numerals as used in FIGS. 6A to 15D so that a repeated explanation is omitted here. FIG. 16A depicts an embodiment where the micro-nano scaled pyramids with curved sides (i.e. quintic shaped or quintic shaped like) are used. In an exemplary embodiment of the invention, a crystal-silicon (C-Si) cell is made in this configuration, where quintic structures 1601 are located on a top of plane silicon 1600 having a minimal thickness, ranging from 5 micrometer to 50 micrometer. The quintic micro-nano scaled structures may be etched or grown on the c-Si (for example as a substrate) using known techniques in the art. The variation of shape of micro-nano scaled structures from top to bottom (mentioning herewith as the "Quintic" structure) provides a gradual change in the effective refractive index from air to the plane silicon (as an example) and thus, reducing reflection losses. In an exemplary embodiment of the invention, in a way of an example not way of limitation FIG. 16B illustrates the structure which clearly indicates the quintic (second power and beyond) gradient of refractive index layer between air and silicon. According to this invention, the quintic gradient of refractive index layer between air and silicon can have more than $2^{nd}$ or more for achieving the refractive indexes gradient as shown in FIG. 16C In some embodiments use reduce reflection loss by tuning the refractive index to create a graded refractive index antireflective coating that matched the index of air on the one side and the refractive index of the substrate surface on the other. Methods used for creating a graded index include alternating high index and low index materials with thickness less than that the targeted wavelength, oblique angle deposition creating porous layer, quintic and modified quintic profiles, and implementing nanostructures. Various embodiments to achieve anti-reflection coating or layer on various surfaces can be achieved by implementing different nanostructures comprising of nanopillars, nanopyramids, nanocones, quintic structures, or combination of thereof, which significantly enhances the graded index antireflection coating to match the refractive index of air to that of the substrate or top layer surface to reduce the index contrast and hence reducing reflection. Various embodiments result in indicated very low reflectivity. For example for visible light reflectivity of <0.01% for the visible light wavelength of 400-1,000 nm at an incident angle of 0-80° are achieved. Broader spectral bands anti-reflection coating is also possible by selecting the material or material system along with the optimization of nanostructures physical dimensions.

Figure 16D:
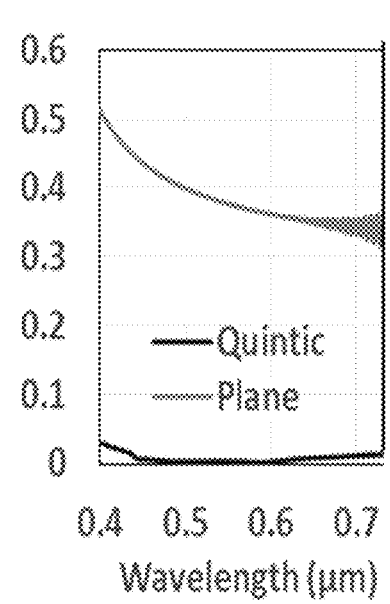

One embodiment can implement a selection of nanostructures depending on the substrate surface and how much tuning is required for the effective refractive index to achieve the target reflectivity of the optical device. In this type of nanostructure, a curved surface nano-pyramid-like shaped structure is mounted atop the surface of the optical device to reduce reflection and enhance light-trapping mechanism to boost absorption and therefore improve efficiency. FIG. 16C shows the effective index profile for a quintic structure. Since the width of the quintic structure changes from the top ($\approx$0) to the bottom, the effective index is not a constant value. The effective index value at the top of the quintic structure is equal to that of air and at bottom it is equal to that of the substrate. The quintic structure is designed to generate a quintic profile of effective index for optical thickness of the structure. FIG. 16D shows the reflection characteristics of the optimized quintic structure compared to the substrate. The optimized geometry of the quintic structure results in the least amount of reflection among the different nanostructures used. The variation of shape of nano-pyramids from top to bottom provides a gradual change of the effective refractive index from air to the plane silicon layer, for example, and thus reducing reflection losses.

The antireflective coatings mentioned above can be manufactured using methods including, but not limited to, synthesis, vacuum deposition, which can be done in a clean room and can be put on any surface made from any material. Alternatively, the anti-reflection layer can also be made making the holes or grooves inside the material, wherein the hole itself or the solid materials left outside the holes could have the 3D structures mentioned or quintic structures. They could be arranged in one dimensional array or 2-dimensional array either periodically or randomly, or combination thereof. Alternatively, the 3D structure may have the same height or different heights.

More specifically, in this specification, a quintic structure is a structure with inward curved sides that start at the base, and the slop at the top, become steeper as the material rises above the surface. This slope aligns with a quintic (i.e. third power and beyond) gradient index layer between air and the base material (i.e. semiconductor material). The quintic structure may change its angle in accordance to the gradient index layer between the materials used in the cell.

In the preferred embodiments as explained in FIGS. 16A and 16B, alternatively, the quintic-like structure may be used and the quintic-like structure are those structures, a combination of the conical, or pyramid and the quintic structure defined earlier.

Figure 17A:
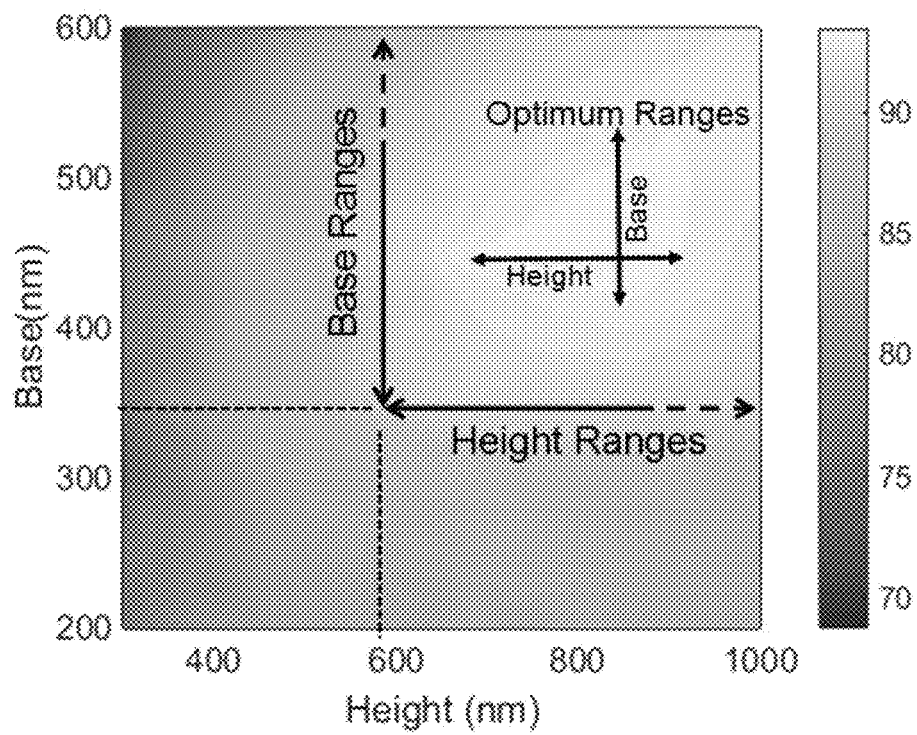
Figure 17B:
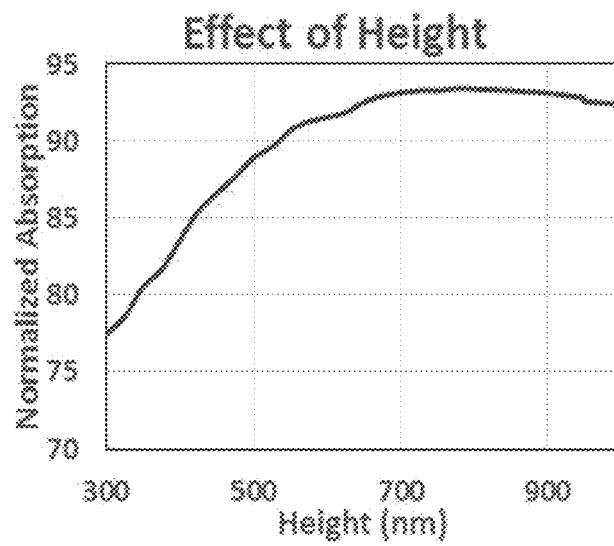

FIG. 17A shows the absorption distribution under AM1.5 radiation (1 kW/m$^2$) with variation of height and base of the quintic shaped structures. In an exemplary embodiment of the invention, as shown in FIG. 17A, the absorption distribution is obtained for the quintic shaped structures forming on to the 8 micrometer thick c-Si. As depicted, the results show that maximum absorption under solar irradiance is obtained for a quintic structure having a square base of 450 nm length and a height of 775 nm. The variation of height and base width of the nano-structure also affects the optical characteristics of the photovoltaic cell. The optical characteristics include but not limited to, the reflection loss and transmission loss. According to this invention, as the thinner base material (i.e. substrate material) is used, the radiation not absorbed by the material (either quintic shaped structure and/or combination of quintic shaped structure and base material) comes out from the structure as transmission loss. According to this invention, the reflection loss occurs due to the reflection of radiation (light) from surfaces, while the radiation passes through the transmission media having different refractive indexes. Using of quintic-shaped structure, the reflection loss can be made to minimal or completely close to zero for the specific bands of radiations. According to this invention, in an exemplary embodiment of the invention and in way of an example not way of limitation, FIG. 17A and FIG. 17B shows the effect of the height and length of the square base of the quintic-shaped structure on the absorption. In an exemplary embodiment of the invention as depicted from FIG. 17A, the absorption of more than 95% is obtained for the quintic shaped structures having square bases of 400 nm to 550 nm, and the heights of 600 nm to 950 nm. The absorption of more than 90% is obtained for the quintic shaped structure having square base lengths ranging from 375 nm to 700 nm, and the heights of 600 nm to 1200 nm. Alternatively, for quintic shaped like structure, as defined earlier, similar results (not shown here) are also achieved.

Figure 17C:
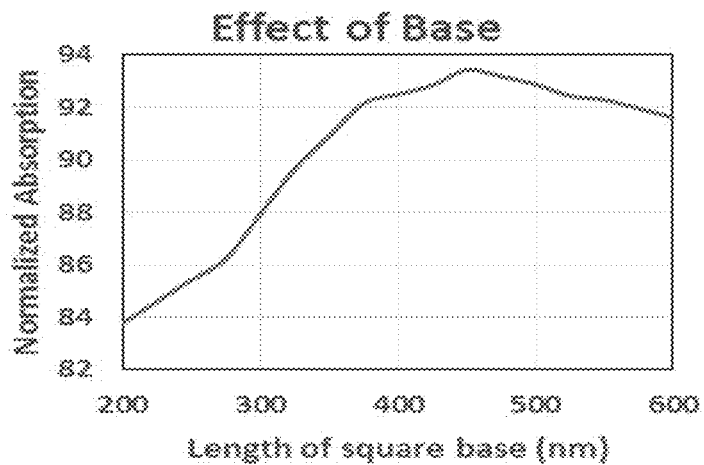

In an exemplary embodiment of this invention, as depicted from FIG. 17B, the absorption increases with increasing of the height of the quintic structures up to a certain height and beyond of that height the absorption starts to decrease. With proper selection of the length of square base of the quintic structure, and further optimization, the absorption (not shown here) can be increased to more than 99% even selecting very thinner Si below 50 micrometer. In addition, in another exemplary embodiment of the invention as shown in FIG. 17C, the optimum absorption is achieved for the square base length of 450 nm for the structure used.

Figure 17D:
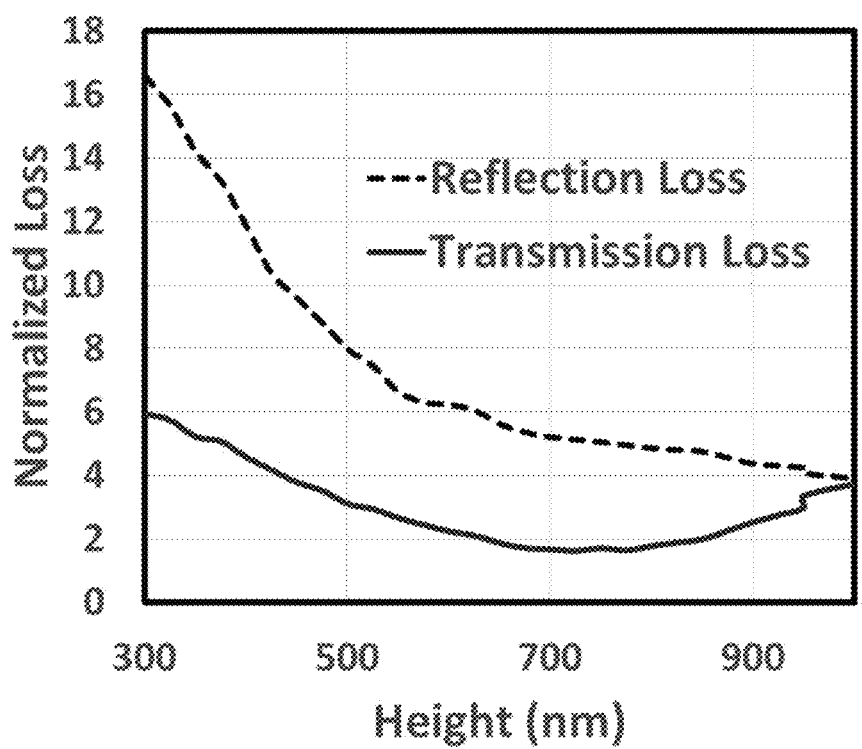
FIGS. 17D and 17E show the effect of height and length of the square base of the quintic structure on reflection and transmission losses, respectively.
Figure 17E:
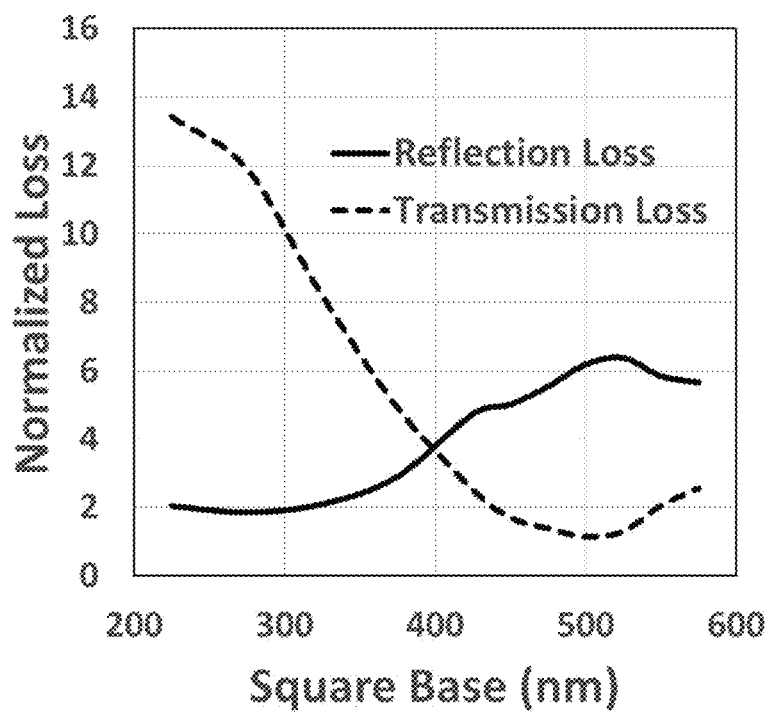

The optical loss in photovoltaic cells includes reflection and transmission losses. It is important to understand the variation of losses with variation in design parameters. In an exemplary embodiment of the invention, in way of an example not way of limitation, FIG. 17D and FIG. 17E show the effect of height and length of the square base of the quintic structure on reflection and transmission losses. Corresponding absorptions are shown in FIG. 17D and FIG. 17E, respectively. FIG. 17D shows that the reflection loss decreases with increasing height for a 450 nm square base. With increasing height of the nanostructure, the variation in effective index is slower from the top of the structure to the bottom. Because of smaller changes in the effective index as seen by light, the reflection loss decreases with increase in height. In the case of transmission loss as depicted from FIG. 17D, it initially decreases with increasing height, but after a certain point it increases. The variation in transmission loss can be explained by the light trapping effect provided by the nanostructure. For a given base width, at a smaller height of the nanostructure, the light trapping effect is less pronounced. As the height of the nanostructure is increased, the light trapping effect attains a maximum value after which it starts to fall, giving the transmission loss characteristics as seen in FIG. 17D. For a constant height of quintic structure on a photovoltaic cell, the reflection loss increases with increase in length of the square base as seen in FIG. 17E. This is because of the quick changes in the effective indexes from the top of the structure to the bottom as the width of quintic structure is increased for constant height. The transmission loss decreases with increase in width of the square base; it attains a minimum value and starts to increase again. This behavior can also be explained by the light trapping effects as discussed earlier.

Figure 17F:
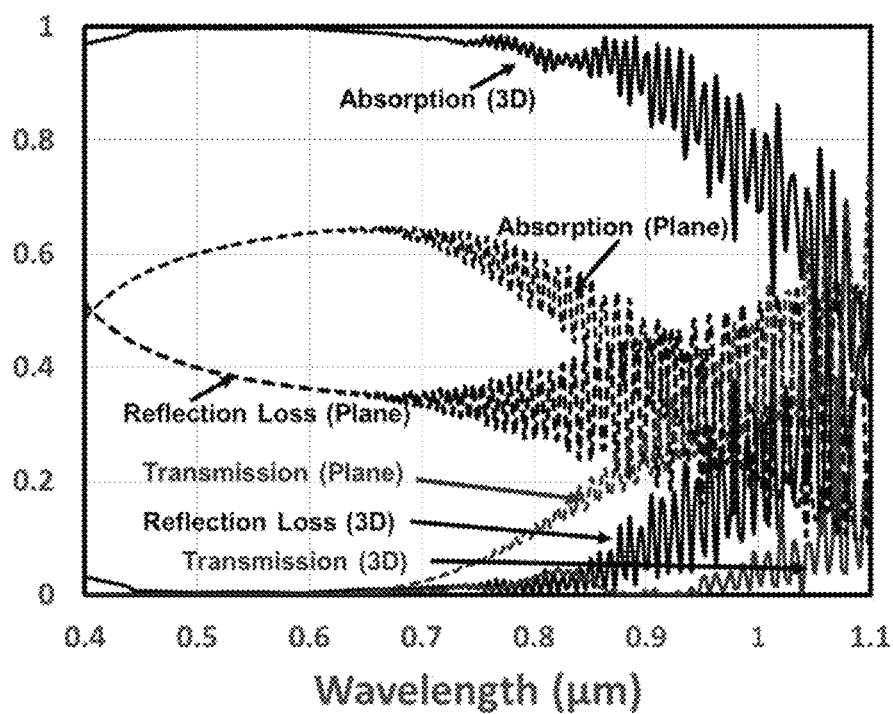
FIG. 17F shows the absorption, transmission loss, and reflection loss of the device structure comprising of a 3D structure (in this case Quintic shaped structure) in the preferred embodiment.

According to this invention, in an exemplary embodiment of the invention, in way of an example not way of limitation, FIG. 17F compares the absorption, transmission loss, and reflection loss of the device structure comprising of a 3D structure (in this case quintic shaped structure) and the plane structure, specifically for the height of 775 nm and square base of width 450 nm for the quintic structure, selected from the results as shown in FIGS. 17A to 17E, and 8 micrometer of thickness silicon for plane structure, in the preferred embodiment. The results are achieved using optimized solar cell with quintic structure of height 775 nm and base 450 nm on top of 8 µm thick silicon. The thickness of plane structure selected is the same as that of height of the quintic structure, in addition to 8 µm as total thickness. As depicted in FIG. 17F, a significant reduction in reflection and transmission losses are observed accompanied by improvement in absorption. The reflection loss was reduced from 37.13% for plane silicon to 4.93% for the optimized structure, which is equivalent to an 84.9% reduction in reflection loss. In terms of normalized absorption, the optimized structure absorbed 93.44% of available spectrum compared to 53.56% of the plane silicon structure, which is equivalent to a 74.45% improvement in absorption. With further optimization, the absorption can be made to more increased with further decreasing the reflection and also the transmission loss. As depicted from FIG. 17F, using of quintic structure (mentioned as 3D in FIG. 17F), the reflection loss and transmission loss as well, can be completely eliminated or reduced to below 2% over wider ranges of solar spectrum wavelengths. The results are achieved using optimized solar cell with quintic structure of height 775 nm and base 450 nm on top of 8 µm thick silicon, and for plane silicon solar cell with 8 µm thick silicon plus thickness of structures.

Figure 17G:
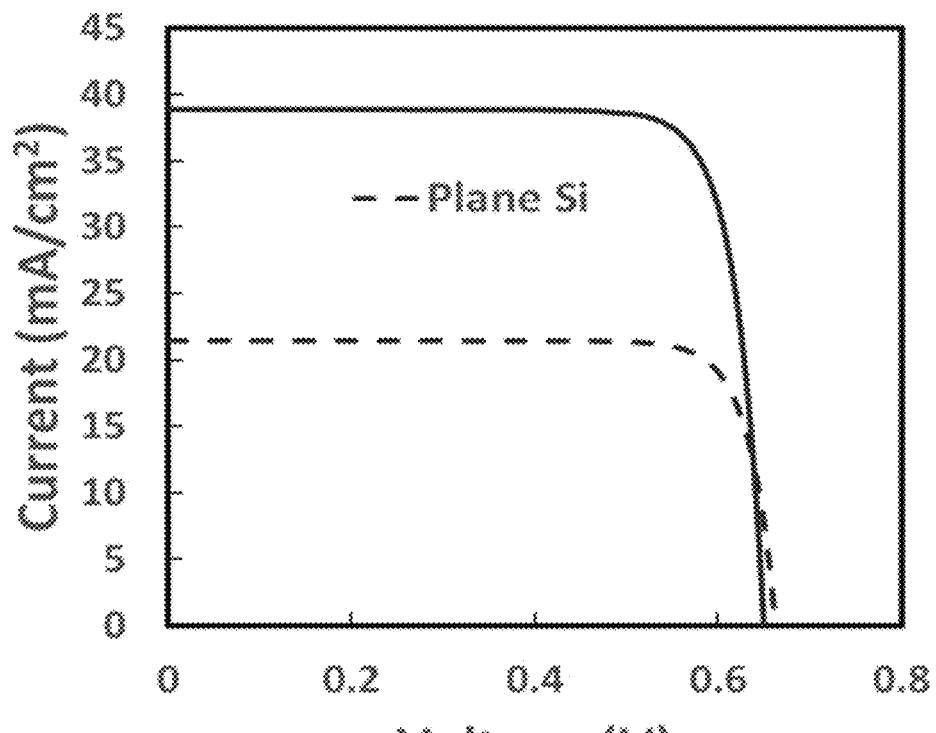
FIGS. 17G, 17H, and 17I shows the results of current vs. Voltage, Current vs. Power, and Mass vs. Power, respectively for the plane Si solar cell and Quintic structure based solar cell.
Figure 17H:
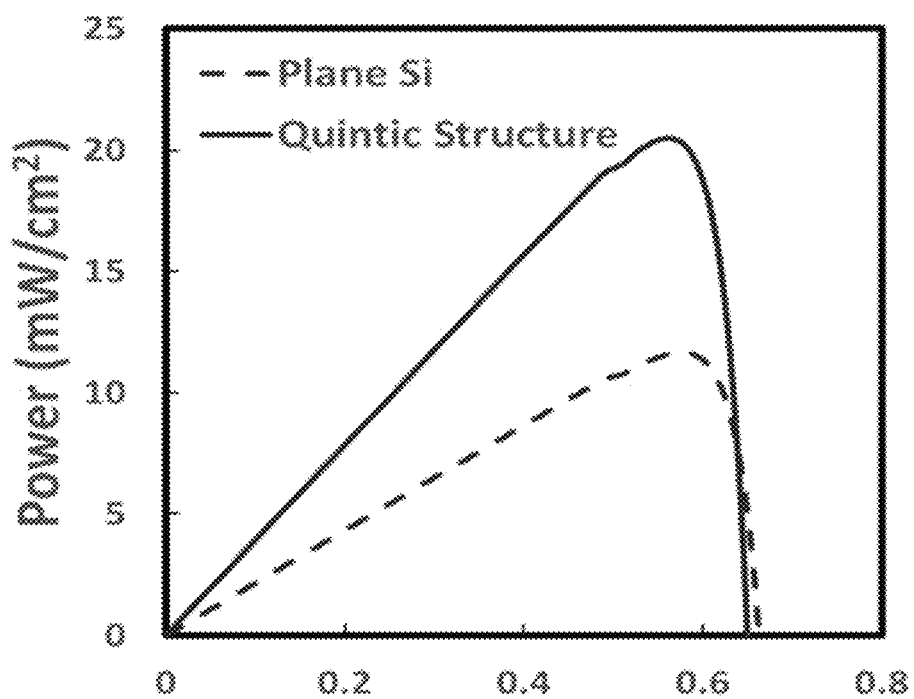
Figure 17I:
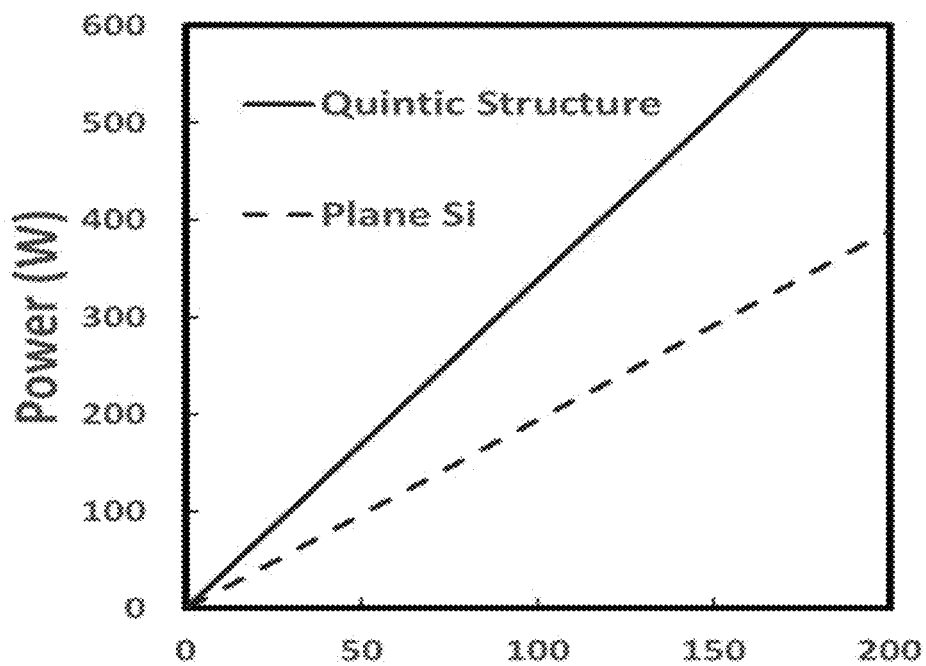

According to this invention, in an exemplary embodiment of the invention, in way of an example not way of limitation, FIGS. 17G, 17H, and 17I compares the results of Current-Density vs. Voltage, Power-Density vs. Voltage, and Mass vs. Power achieved using of cell based on quintic structures and the cell based on plane structure. The results are achieved using optimized solar cell with quintic structure of height 775 nm and base 450 nm on top of 8 µm thick silicon. A maximum current of 38.83 mA/cm$^2$ and a maximum power of 20.51 mW/cm$^2$ were obtained compared to 21.43 mA/cm$^2$ and 11.67 mW/cm$^2$ for plane silicon solar cell with 8 µm thick silicon. This corresponds to an 83.6% improvement in the efficiency of the solar cell compared to that of plane silicon. The power density of the solar cell was calculated to be 3.386 W/g compared to 1.94 W/g of plane silicon solar cell. With further optimization, the generation of current for the given area can be made to more increase with further decreasing the reflection and also the transmission losses.

The results showed in FIGS. 17G to 17I, are achieved due to use of the quintic structure. With increasing height of the nanostructure, the variation in effective index is slower from the top of the structure to the bottom. Because of smaller changes in the effective index as seen by light, the reflection loss decreases with increase in height (see FIG. 17D). In the case of transmission loss, it initially decreases with increasing height, but after a certain point it increases. The variation in transmission loss can be explained by the light trapping effect provided by the nanostructure. For a given base width, at a smaller height of the nanostructure, the light trapping effect is less pronounced. As the height of the nanostructure is increased, the light trapping effect attains a maximum value after which it starts to fall, giving the transmission loss characteristics as seen in FIG. 17D. For a constant height of quintic structure on a solar cell, the reflection loss increases with increase in length of the square base as seen in FIG. 17. This is because of the quick change of the effective index from the top of the structure to the bottom as the width of quintic structure is increased for constant height. The transmission loss decreases with increase in width of the square base; it attains a minimum value and starts to increase again. This behavior can also be explained by the light trapping effects as discussed earlier.

Figure 17J:
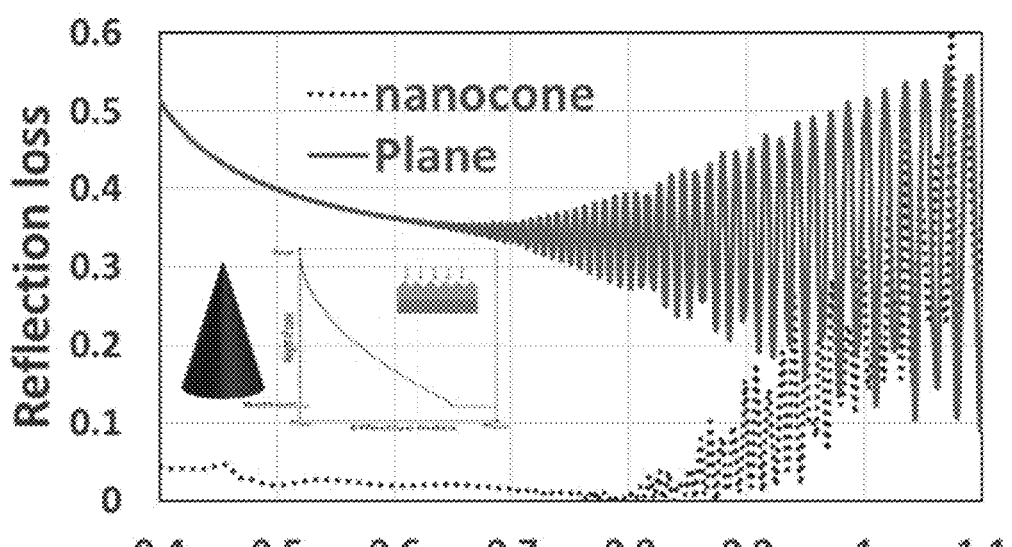
FIGS. 17J, 17K, and 17L are the results of reflections losses for the antireflections coating layer based on the nanocone, nanopillars, and quintic structures, respectively.
Figure 17K:
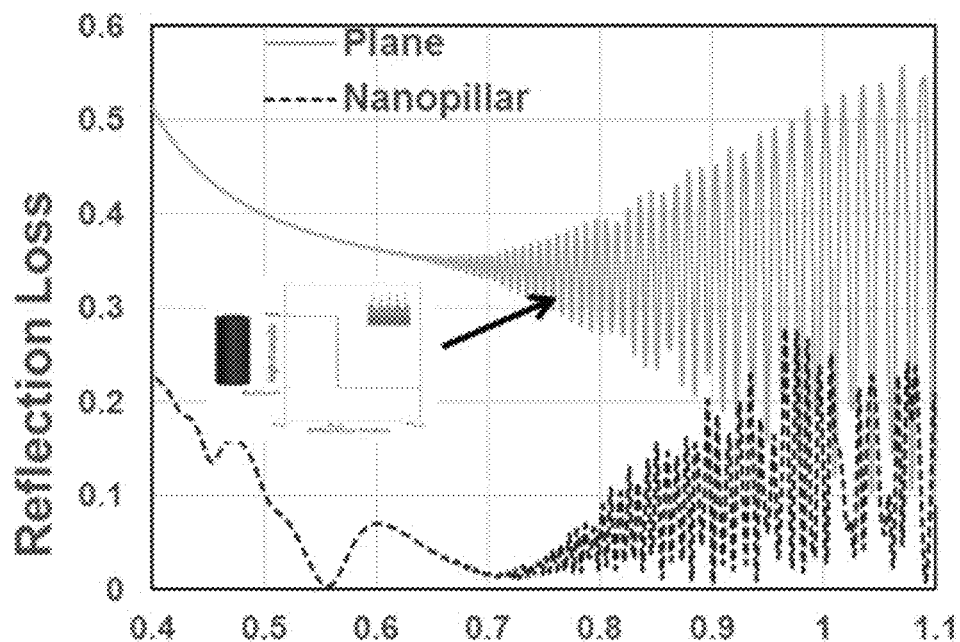
Figure 17L:
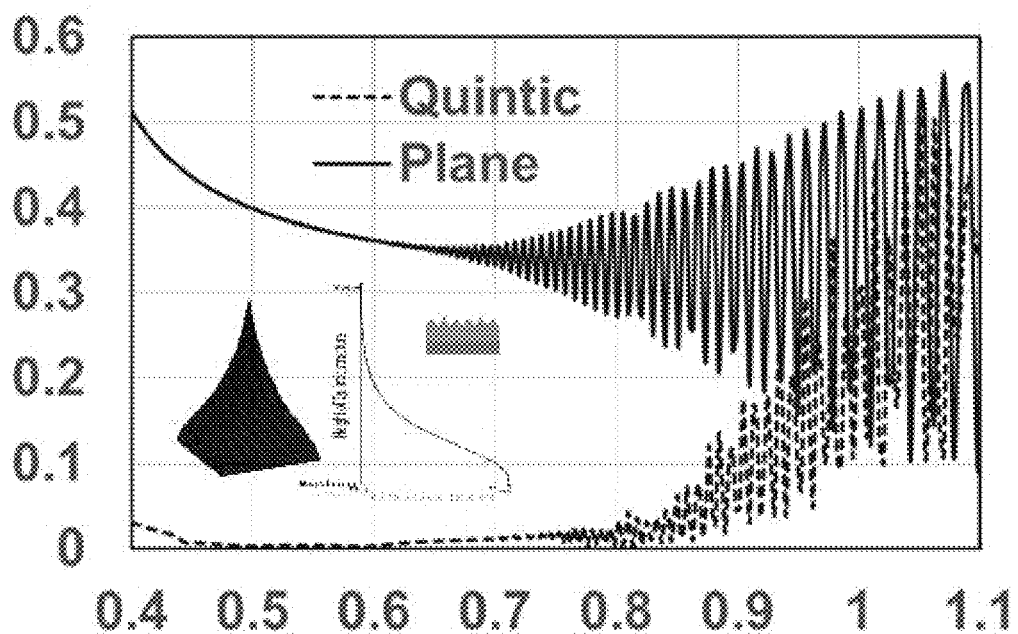

Alternatively, the 3D structure can also be used as the antireflection coating in optical devices including but not limited to the optical device such as detector, photovoltaic cell, and photoconductivity detector. The 3D structure includes but not limited to quintic structure, nanocone, nanopyramids, nanopillars, nano-trapezoidal pyramid or trapezoidal cone, or trapezoidal quintic structure. The antireflection coating materials to be used could be the electrical materials making the optical devices. Insulating material, electrical conductive material, or combination thereof. According to this invention, in an exemplary embodiment of the invention, in way of an example not way of limitation, FIGS. 17J, 17K, and 17L compares the absorption, transmission loss, and reflection loss of the device structure comprising of a 3D structure (in this case quintic shaped structure) and the plane structure, specifically for the height of 775 nm and square base of width 450 nm for the quintic structure, selected from the results as shown in FIGS. 17A to 17E, and 8 micrometer of thickness silicon for plane structure, in the preferred embodiment. In an exemplary embodiment, the 3D structures are made from Silicon as the electrical material part of the optical device (in this case solar cell). These structures can be used as the antireflection coating not only for the broad spectrum range but also as used for coating layer for omni directional illumination using of the vertical direction (3D structure orientation), or randomly oriented, or combination of thereof. With changing of material types, the antireflection coating and/or coating layer can be used for various optical bands.

In the preferred embodiment and also in an exemplary embodiment of the invention, in way of an example not way of limitation, the thinned silicon is considered to show the benefits of the structures to achieve reduced reflection loss in broad spectrum ranges, to make broadening the absorption and also to reduce transmission loss, even using of thinned material for potentially useful for the optical devices (i.e. photovoltaic cell). Furthermore, the radiation considered in the examples as shown in FIGS. 17A to 17F, are solar spectrum. Using of infrared (or UV) range material, the structure can also be used for reducing the reflection loss in desired broad spectrum ranges to enhance the optical performance of the device. According to this invention, with proper selection of material, its refractive index, and its physical parameters, the quintic structure (micro-nano scaled) can also be used as a broadband antireflection coating for an optical device (i.e. photovoltaic cell, detector) or use itself as the coating structure for the applications (not shown here) where reflection loss of radiation is to be minimized.

In the preferred embodiment and also in an exemplary embodiment of the invention, in way of an example not way of limitation, the square shape base is explained. This invention also cover all shapes of bases covering circle, elliptical, parabolic, or rectangular for the quintic structure and/or also quintic like structures. These structures can be arranged in periodically in array or randomly aligned. Furthermore, these structures can be arranged all in same heights or arranged in variable heights. Alternatively, each of the structure can be arranged side by side without gap, and/or each structure can be arranged with a gap which could be fixed or variable. Furthermore, the performance as shown in FIGS. 17A to 17L, even thinner Si of 8 micrometer thickness as base material with additional heights of the quintic structures, explained above can makes the high performance photovoltaic cell. Not only that, but also the flexible solar cell with high performance can also be achieved using the structure mentioned above. Alternatively, any thinned semiconductors or thinned material can be sued instead of Si.

Figure 18:
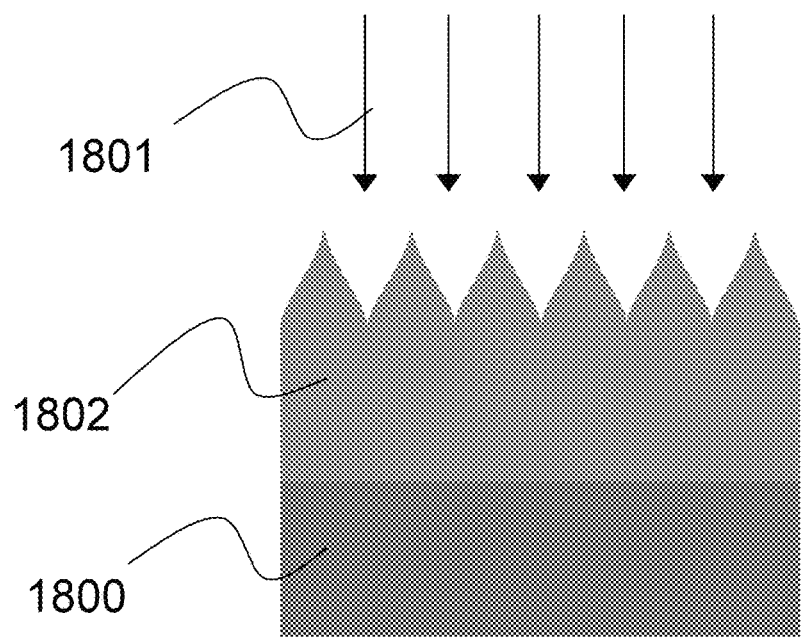
FIG. 18 is a schematic showing a cross sectional view of a device in the preferred embodiment according to the invention, The height and base length of the quintic nano-pyramid structures may varies to achieve optimized the absorption, reflection, and transmission characteristics of a solar cell.

The photovoltaic cell in FIG. 18 is based on an ultra thin (less than 50 micrometer in thickness, even more less than 20 micrometer or 10 micrometer) semiconductor substrate or layer (i.e. Si), which uses curved nano-scaled surface on top of plane using wither made from other material or made from same or dissimilar semiconductor (i.e. Si) to reduce reflection and enhance light-trapping mechanism to increase absorption significantly, which results in increasing the conversion efficiency. In an exemplary embodiment of the invention, in way of an example not way of limitation, the photovoltaic cell comprises of quintic nanostructures shaped formed on or made out of substrate. As a substrate or thinned layer and also as an exemplary embodiment, thinned silicon substrate of thickness less than 50 micrometer (in this case 8 micrometer) is used, and as mentioned quintic structure is formed on or transferred from other substrate (not shown here), or etched out of silicon substrate. As the thinner substrate or layer is used, a polymer or glass of refractive index 1.56 is used as the base for the photovoltaic cell. The variation of shape of structures from top to bottom provides a gradual change of the effective refractive index from air to the plane of silicon substrate and thus reducing reflection losses. As an exemplary embodiment, in way of an example not way of limitation, the substrate if Silicon is used, however, the substrate can be any type semiconductor, semi insulator, dielectric, or conductive type material. The material type can be the same or dissimilar, if the structures are formed on the top of the substrate. In the case semiconductor substrate, the structures could be formed onto or etched out from the substrate can be the electrical material of one type (p or n) which allows to make the semiconductor junction with another type (n or p) electrical material. The quintic structures along with the substrate are the main part of the photovoltaic cell. FIG. 18 shows the cross sectional view of photovoltaic device structure wherein nano-structures as explained earlier are formed onto the substrate and/or formed out of the electric material disposed on the substrate. The height and base width of the nano-pyramid may varies to have different effects and/or to achieve desired effects on the absorption, reflection and transmission characteristics of the solar cell.

Figure 19:
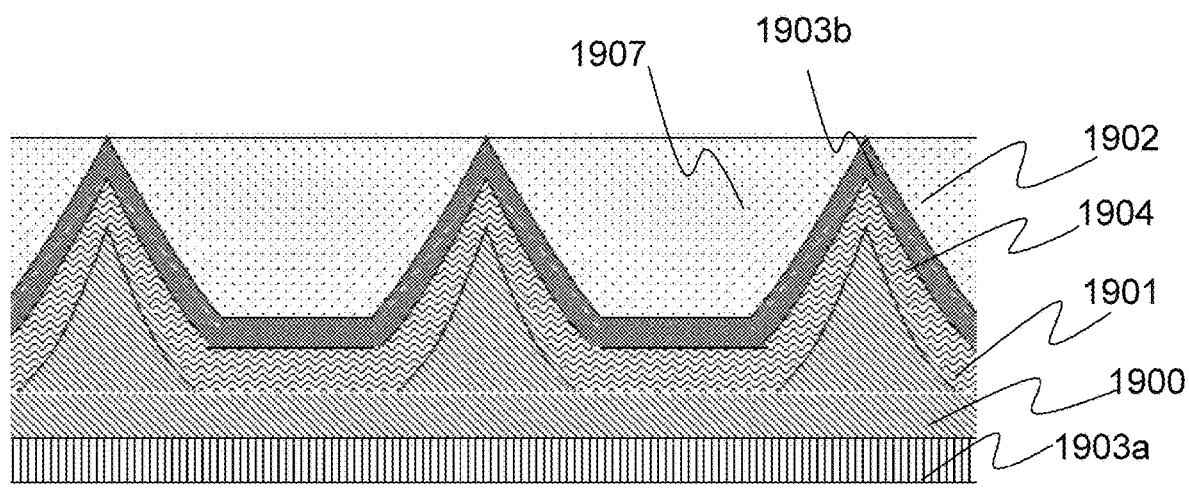
Figure 19:
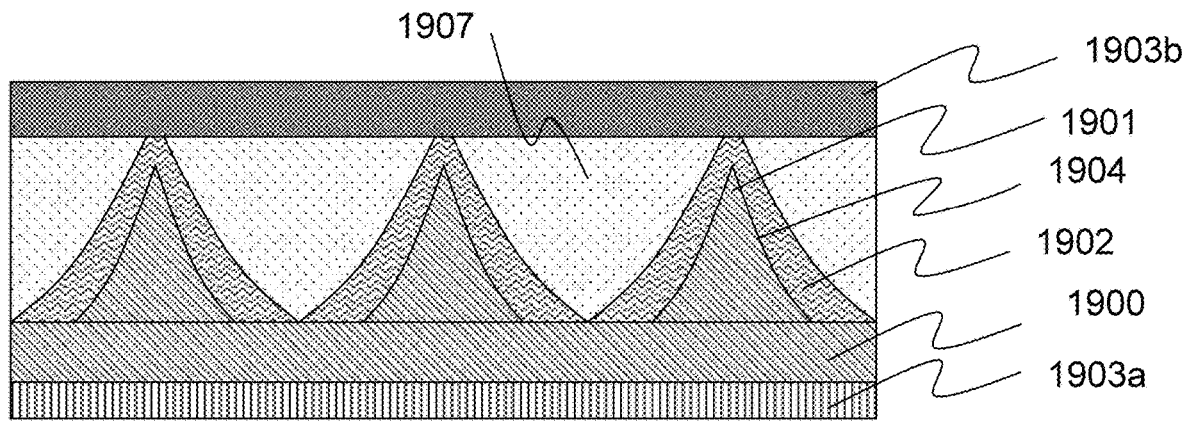

According to a preferred embodiment of the present invention, illustrated in FIG. 19A, in way of an example not way of limitation, is photovoltaic cells comprising a plurality of nano scaled quintic structures which are formed on a supporting substrate, wherein like parts are indicated by like or similar reference numerals as used in FIGS. 6 to 15 so that a repeated explanation is omitted here. The nanoscale quintic structures 1901 are electrical material, comprised of an electrical conduction of either p or n type semiconductor material. The quintic structures are formed on or etched out of a substrate 1900 comprising a semiconductor of the same type as the structures. Alternatively, the substrate may be made out of a semiconductor of the same type or opposite type, (not show here) with the quintic structures formed on top. The electric material 1902 dispose on to the quintic structures 1901, and surrounds the quintic structure and the electrical material 1902 comprises a semiconductor material of n or p type, which is opposite of the material used in the quintic structure forming a p-n junction 1908 along the top and side-walls of the quintic structure 1901. The electric material of the structures 1301 and the second electrical layer 1902 are electrically connected to electrodes: 1903a and 1903b. The electrodes are common and that serve for all of the structures. Electrode 1903a or 1903b can be transparent, not shown here, and can be formed on the electrical material 1902 or junction 1904, respectively. The electrodes 1903a or 1903b are disposed all over the surface (as Shown FIG. 19A) or connecting to the layer of interest (not shown here), which electrically connects whole layers 1900 or 1902 to form the p-n junction. More than one layer of the same type electrical material (not shown here) may require to make the perfect ohmic contacts Additionally, a passivation layer (not shown here) may be used to fill the gaps in between the structures formed after disposing the electrical layer 1902. The passivation layer may be disposed either after disposing the electrode 1903b or before disposing the electrode 1903b. If the passivation layer (not shown here) formed before the electrode 1903b, either planarization is necessary to open the electrical layer 1902 for contact or via is required followed by the making contact using electrode 1903b.

An exemplary embodiment, in way of an example not way of limitation, involves the using a Si based quintic structure of a square base of 450 nm and a height of 775 nm forming either on to the Si plane of thickness less than 50 micrometer thickness, or formed out of thinned Si, in order to achieve the maximum absorption over 97% of solar irradiance. Alternatively, the quintic structures may have a degree of variability resulting from manufacturing error or other unforeseen factors, leading to a preferred range of tolerances. The preferred range for height may fall from the maximized height is 675 nm to 890 nm with minimum loss, and may increase from 890 nm to 975 nm with minimal loss to absorption. Allowable variations of heights are ranging from 580 nm to 1200 nm to achieve more than 90% absorption under solar radiation. Not only that but also absorption spectra are also extended to near infrared 1000 with higher absorption of more than 35%. Furthermore, the preferred range for base may fall from the maximized base is 410 nm to 535 nm with minimum loss, and may increase from 535 nm to 600 nm with minimal loss to absorption. Allowable variations of bases are ranging from 350 nm to 750 nm to achieve more than 90% absorption under solar radiation at a given height selected from the ranges mentioned above.

According to a preferred embodiment of the present invention Illustrates in FIG. 19B, in way of an example not way of limitation, a photovoltaic cell comprises a plurality of nano-scaled or micro scaled quintic structures which are formed or etched from a supporting substrate, wherein like parts are indicated by like or similar reference numerals as used in FIG. 19A so that a repeated explanation is omitted here. FIG. 19B depicts the second electrode 1903b placed planar on top of the cell in contact with the second electrical layer 1902. The electrode 1903b may be any conductive material.

Figure 19C:
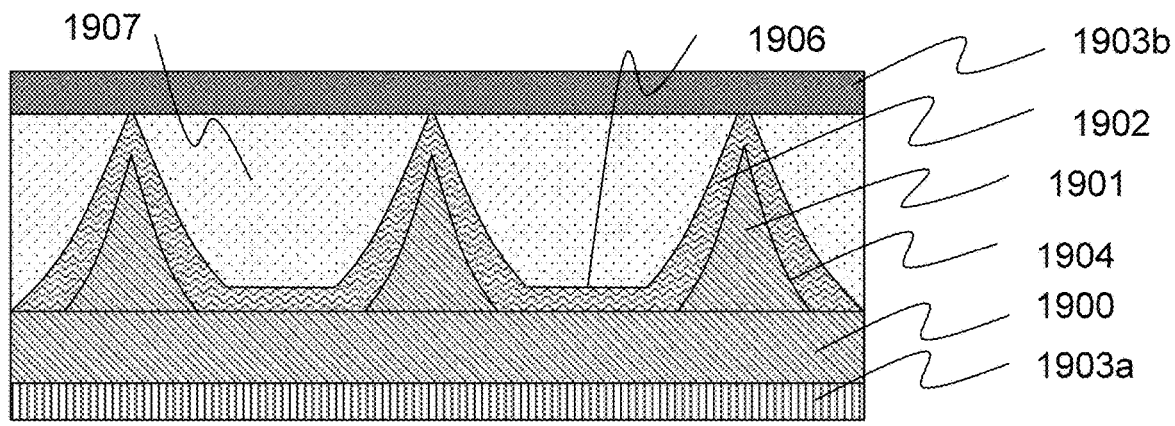

FIG. 19C is a cross sectional view of a photovoltaic cell in the preferred embodiment in accordance to this invention, wherein like parts are indicated by like or similar reference numerals as used in FIG. 19A and FIG. 19B, so that a repeated explanation is omitted here. According to this invention, in way of an example not way of limitation, the quintic structures may be located in proximity to each other such that they form gaps 1906. In the preferred embodiment, the light, not absorbed by the side wall of structures are get reflecting back and forth and are focused and get absorbed at the gap and/or reflected back the light which are not absorbed. Using of this structure helps to reduce the use of the amount of semiconductor material used to form p-n junctions, and yet to achieve higher conversion efficiency to at least to achieve similar conversion efficiency at reduced material used. This results in overall reducing the cost of the photovoltaic cell.

Alternatively, in way of an example not way of limitation, the substrate 1900 may be formed out of an insulating material, semi-insulating material, or an electrically conductive material. When an insulating material is used as the substrate 1900, a layer of electrically conductive material will need to be disposed on to the insulating substrate to be used as an electrode, before disposing electrical materials (i.e semiconductor) to form a pn junction of 1904 (not shown here). Semiconductor material also may be used as a substrate; however the pn junction is formed all over the 3-D structures and also on the gaps if the second layer is applied continuously over the surface of the substrate and quintic structures. Preferably the configuration may allow for an electrical material (i.e. 1902) to be placed in the gaps 1906, allowing a semiconductor substrate 1900, and quintic structures 1901 of a first electrical material type, and a continuous coating of a second type of electrical material 1902. This allows for a pn junction 1904 to be formed along the entire surface of the cell. This is depicted in FIG. 19C which allows light, not absorbed from the structures 1901 after reflected back and forth and trapped and are get absorbed into the gaps 1906 and granting the solar cell a greater efficiency. As electrical material either a substrate and/or quintic structures may be comprised of, or are coated by a material including but not limited to, Si, Ge, InP, GaAs, GaP, Cds, CIGS, CdSe, CdTe, ZnO, ZnSe, ZnS, or polymer or metal etc., or combinations thereof, separately synthesized either by epitaxial growth in a vacuum deposition system and/or chemically formed from the solution.

Figure 19D:
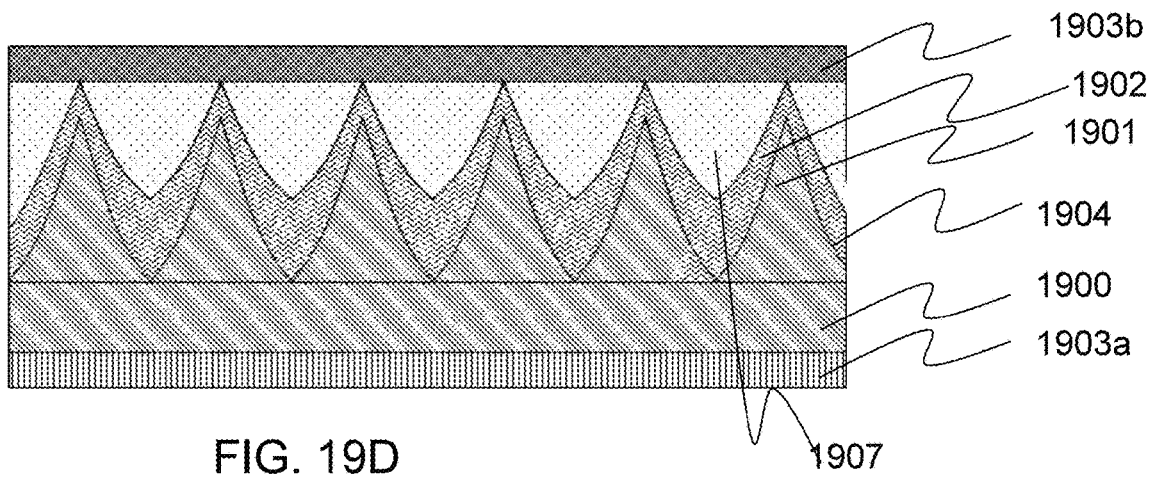

Alternatively, an exemplary embodiment, in way of an example not way of limitation, as depicted in FIG. 19D, includes the quintic structures 1901 being in proximity to one another, or conjoined to each other. In this embodiment, there are no gaps between the structures, but instead the slop of second electrical material 1902 runs directly into the slope of the next structure. This promotes light reflecting between the structures which increases absorption. This configuration has the quintic structures 1901 are in contact with each other. Alternatively, there may be a gap between the quintic structures, while still being conjoined by the electric material 1902.

Figure 19E:
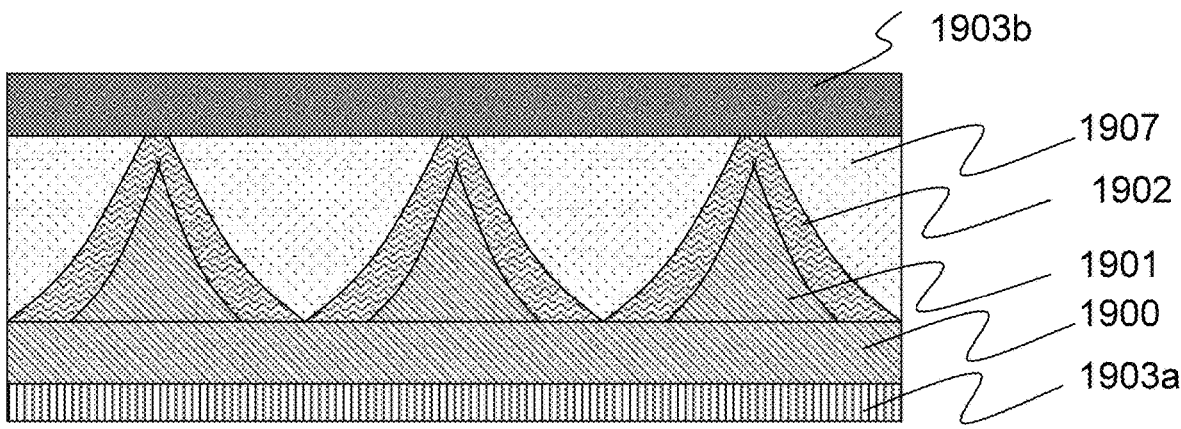

FIG. 19E is the schematic showing a cross-sectional view of photovoltaic cell in accordance to this invention, wherein the same numerals are the same parts as explained in FIG. 19A, FIG. 19B, FIG. 19C and FIG. 19D, so that repeated explanation is omitted here. According to this invention as depicted in FIG. 19E, in way of an example not way of limitation, the quintic structures may be truncated or not truncated and may have a passivation material between the second electric material and the second electrode material. FIG. 19E depicts the quintic structure formed from first electrical material 1901 is originally having spacing between the structures, however by disposing of the second electrical material 1902 onto the first electrical material 1901 form the structures without a gap between the structures. Furthermore, the structure depicts an example of a truncated quintic structure, wherein the second electrical material 1902 layer has a flat top surface but the first electrical material 1901 does not have truncated top, but top point. Furthermore, this structure must avoid having the first electrode layer 1903a electrically shorting the second electrode 1903b. Additionally, a passivation material 1907 is used in-between the second electric material 1902 and the second electrode 1903b such that it fills the gaps between the structures. Alternatively, both the first and the second electric materials may be truncated, by making the first electric material have a flat top portion, and/or the second electric material is conformally applied the first (not shown here).

The electrical materials as described in FIG. 19A, FIG. 19B, FIG. 19C, FIG. 19D, and FIG. 19E forming p-n junctions are semiconductor materials of amorphous, microcrystalline, crystalline, or their combination types materials and may be a single semiconductor type material and/or multiple semiconductor type materials selected from a group consisting of Si, Ge, GaAs, GaSb, GaN, InP, GaP, CdTe, ZnO, GIGS, polymer or combinations of thereof.

Figure 19F:
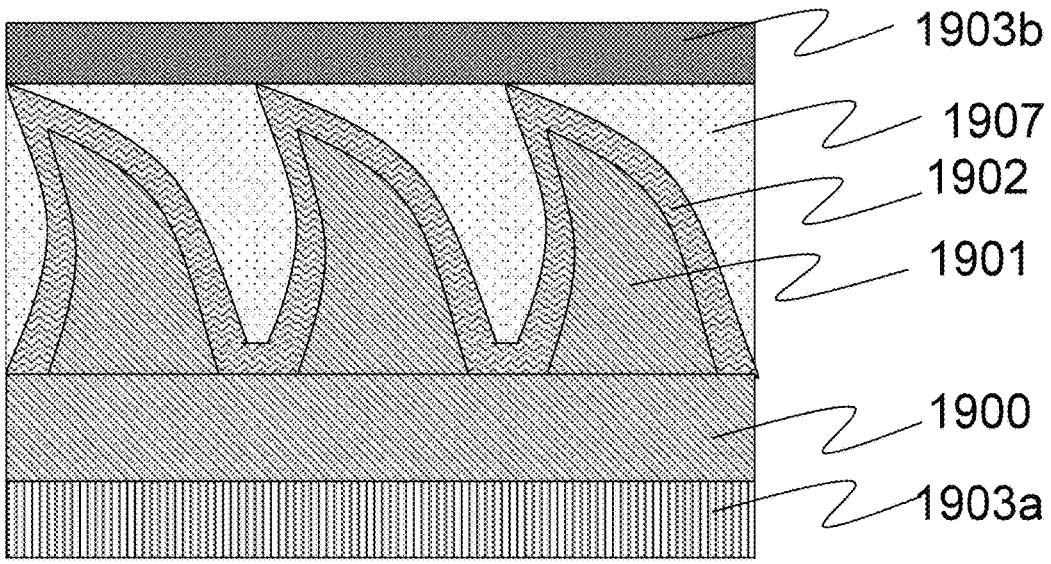

FIG. 19F is the schematic showing a cross-sectional view of photovoltaic cell in accordance to this invention, wherein the same numerals are the same parts as explained in FIG. 19A, FIG. 19B, FIG. 19C, FIG. 19D and FIG. 19E so that repeated explanation is omitted here. According to this invention as depicted in FIG. 19F the quintic structures 1901 are formed at an angle, and not perpendicular to the substrate 1900. The angled quintic structures may be aligned periodically, or aligned randomly such that the angles are either aligned in specific ordered directions or randomly selected directions. The structures may be spaced or conjoined as shown in FIG. 19A, FIG. 19B, FIG. 19C, FIG. 19D, and FIG. 19E as to allow for reflection between the structures or into gaps between the structures. Furthermore, the heights of the structures may vary in height, and base width of the structure (not shown here)

Figure 20A:
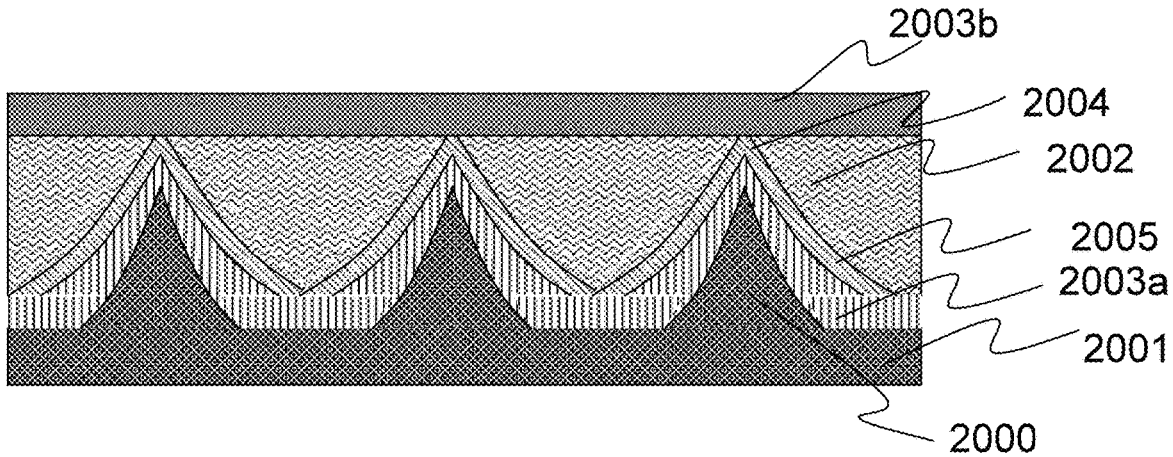

FIG. 20A is a cross sectional view of a photovoltaic cell in the preferred embodiment in accordance to this invention, wherein like parts are indicated by like or similar reference numerals as used in FIGS. 19A to 19F, so that a repeated explanation is omitted here. According to this invention, in way of an example not way of limitation, the nano-scaled quintic structures 2001 according to FIG. 20A may be formed on a substrate 2000 that is dielectric, insulating, conductive, polymer, or non-electrically conductive and the electrode 2003a is formed on the top of the substrate and structures. The electrode 2003a acts as a common electrode for all of the structures. A first electric material 2005 of either n or p type disposed, placed or formed on top of the electrode 2003a. A second electric material 2002 is then disposed, formed or placed on top of the first electric material 2005 on type opposite the first electric material 2005 in order to form a pn- or Schottky junctions where built-in potential for both electrons and holes are generated. The second electric material 2002 may either fill the reminder of the space between the quintic structure, as shown in FIG. 20A or coat the first electric layer 2005 (not shown here). A second electrode 2003b is placed on top of the second electric layer 2002. The second electrode 2003b may be a planner, or may be conformably applied to the second electric layer 2002 (not shown). Furthermore, when the second electrode 2003b is planer, then a passivation material may be used to fill the space between the second electric material 2002 and the second electrode 2003a. Alternatively, the second electric material 2002 may be conformally applied onto of the first electric layer 2005. Then the space between the second electric material 2002 and the second electrode 2003b may be filled with a third electric material or second electric material 2002 with higher doping concentration. More than one layer to make pn junction and/or ohmic contacts may require (not shown here).

The electrical material in FIG. 20A forming the p-n junction or Schottky junction are semiconductor materials may consist of semiconductors such as Si, Ge, GaAs, GaN, InP, GaP, GaSb, CGIS, CdTe, or ZnO or polymer or metal or a combination of thereof.

Figure 20B:
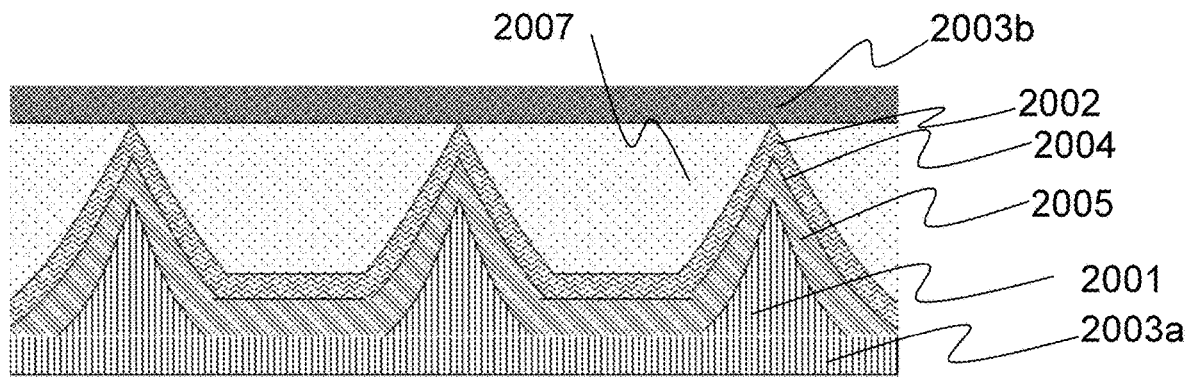

Alternatively, according to this invention, in way of an example not way of limitation, the nano-scaled quintic structures may be formed on a substrate comprising an electrically conductive material. FIG. 20B is the schematic showing a cross-sectional view of photovoltaic cell according to this invention, wherein the same or like numerals are the same parts as explained in FIG. 20A, so that repeated explanation is omitted here. In FIG. 20B the substrate used is an electrically conductive material 2003a and have quintic structures 2001 formed on it, or etched out of it, and acts as a common electrode to all of the structures. The quintic structures 2001 may be either conjoined (not shown), separated by gaps (not shown), or placed directly next to each other. FIG. 20B shows an embodiment wherein the quintic structures are located in direct contact with each other. A first electrical material 2005 of either p or n type is disposed, formed, or placed onto the quintic structures and in gaps if the configuration has gap between the structures. A second electric material 2002 is formed on top of the first electrical material 2005, and is an electrical material of opposite type than the first electrical material, creating a p-n junction 2004 or creating a Schottky junction. A passivation material 2007 is then disposed, applied, or placed on to the structures which levels or planarize the partially or entire surface of the cell, and a second electrode 2003*b* is then disposed, or applied to the structure which acts as a common electrode to all of the structures. Alternatively, the second electrode may be formed also to electrically connects with the pn-junction to collect the charges. Furthermore, the quintic structures 1401 can be made of a specific height, or at random heights. Furthermore, they can be arranged periodically, spatially or randomly. In addition, the quintic structures can have orientation in different angles with respect to the substrate surface.

According to this invention, in way of an example not way of limitation, alternatively the micrometer(s) or nanometer(s)-scaled quintic structures can be formed on utilizing the semiconductor substrate, and the electrode can be formed on back side of the substrate to have common contact for each micrometer(s) or nanometer(s)-scaled quintic structures, necessary for creating wide surface area. In way of an example not way of limitation, the nanometer(s) or micrometer(s)-scaled quintic structures can be made of p type or n-type semiconductor substrate and the thin film material that on or surrounds the micrometer(s) nanometer(s)-scaled quintic structures can be made of the opposite type of semiconductor.

Alternatively, the structures described in FIG. 20A and FIG. 20B may have gaps between the structures as described in FIG. 19B or may have conjoined to each other such in FIG. 19C. Furthermore, the quintic structures described in FIG. 20A and FIG. 20B may be truncated as in FIG. 19D, or may be truncated by having the internal layers of the structure become flat and have the other layers conformally applied the structures. Alternative embodiments of the present invention may also include the use of alternative shapes for the base of the quintic structure, including but not limited to a triangular, a circular, trapezoidal, and hexagon shaped bases.

According to this invention, in way of an example not way of limitation, alternately micrometer or nanometer quintic structures may be formed on the bottom surface of the cell. Because these structures are formed on the bottom surface of the cells the structures reflect light that has passed through unabsorbed. The reflected light then passed upward through the cell allowing for a more light (or radiation) to be absorbed through the cell. This embodiment will require the electrodes and the semiconductors located on top to be transparent to the wavelengths of light that is meant to be reflected back into the cell. The quintic structures located on the bottom surfaces act as traps to trap and reflect light back toward the surface. Furthermore, the structures are located such that there are no gaps between the structures in order to reflect light back toward the surface of the cell.

According to this invention, in way of an example not way of limitation, the quintic structures taught above in FIGS. 19A to 19E, and FIG. 19A and FIG. 19B may also be applied to embodiments where a 2-dimensional array of the structures, extends the length he length of the photovoltaic cell. Variations from the square base to a continuous shape, friendly to manufacturing across the length of the photovoltaic cell will cause more tolerance and less complexities to manufacture.

According to this invention, in way of an example not way of limitation, the quintic structures (1901, 2001) may be of uniform height or varied heights, as well as uniform or varied size of base and or uniform or varied distance between the center point of the bases, or a combination thereof. Furthermore, the base of the structures may be on the same plane or each structure may be at different elevations and or heights.

Furthermore, the quintic shaped structures, regardless of the shape of the base or whether they are truncated or combed to a point, may also be at an angle, and not perpendicular to the plane of the substrate.

Figure 21:
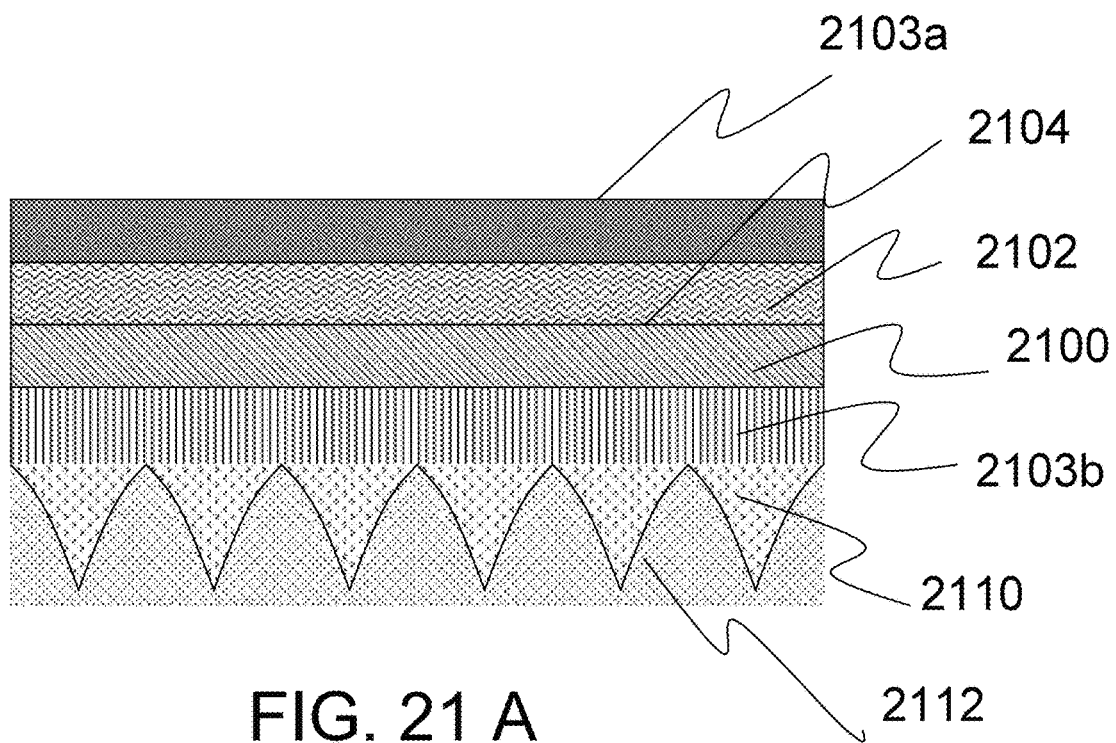
Figure 21:
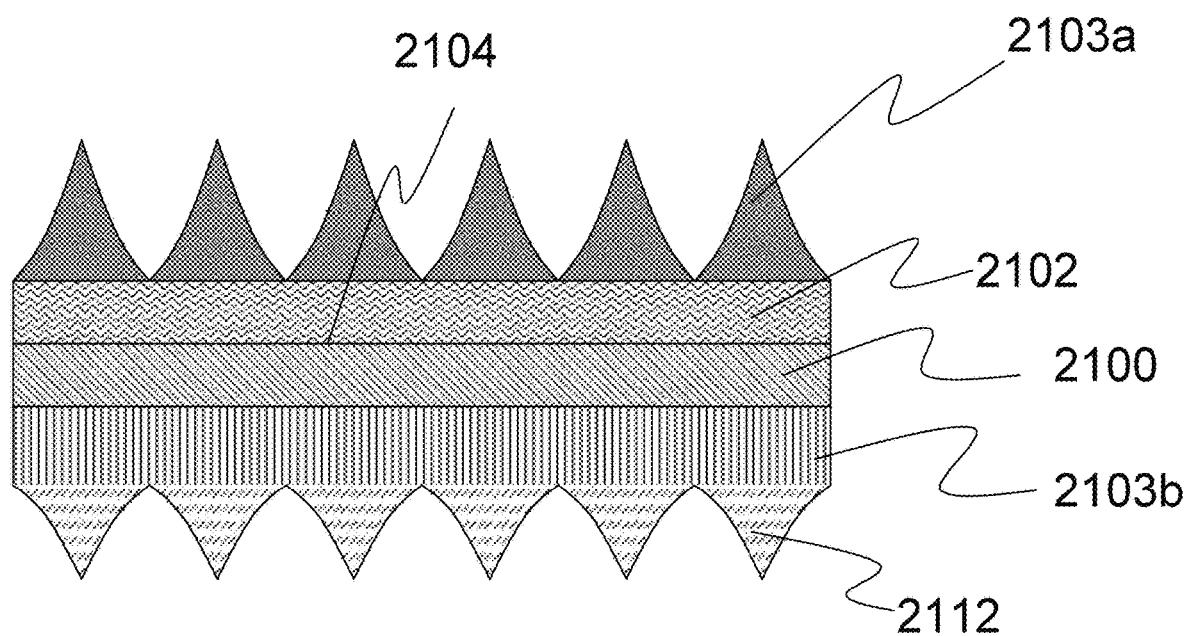

Alternatively, according to this invention, in way of an example not way of limitation, micro-nano scaled 3D structures at the top of the cell may be used to reduce the reflection, by trapping or creating pseudo-homogenous refractive index. Additional layer, either flat layer or 3D structured layer can be used at the bottom of the cell to reflect part or whole of the light not absorbed by the absorption layer FIG. 21A is the schematic showing a cross-sectional view of photovoltaic cell according to this invention, wherein the same or like numerals are the same parts as explained in FIGS. 19A to 19F and FIG. 20A and FIG. 20B, so that repeated explanation is omitted here. The bottom layer or back sheet 2110 is used as a part of the cell or separate layer or sheet put at the backside of the cell to reflect the light not absorbed and reflect back to the absorption layer. This layer may be made from a micro—or micro-nano-scaled 3D structure (i.e. 3D quintic shaped), either etched from a reflective layer or from other suitable material 2112. The structure can be made under a conventional photovoltaic cell having a first electric material 2100 of p type or n type, a second electric material 2102 of the opposite type as the first, and an electrode 2103*b* is located either top of the trap structures or bottom of the trap structure. The trap or reflective structure 2110 may be an empty space, etched from the reflective material, or filled with a material that is transparent to the wavelength or filled the semiconductor material either absorption type or transmisive type. The structure formed the back side of the PV cell, according to this invention, reflects back the light to the absorption layer. The light may be reflects, refracts, scatters, or diffracted by the structure located back side of the PV cell. The quintic structure acts as an effective traps structures when light comes from the base side of the structure. The quintic structure will scatter or reflect back the light into the junction 2104. The junction as shown is flat; however the trap structure may be applied to the embodiments shown in FIG. 19 A to 19E and FIGS. 20A and 20B. The electrode 2103*b* is a transparent electrode which allows light to the wavelength harvested by the photovoltaic cell to pass through into the trap structure. The trap-structure can be formed from the same material as electrode material or dissimilar material.

Alternatively, according to this invention, FIG. 21B is the schematic showing a cross-sectional view of a photovoltaic cell according to this invention, wherein the same or like numerals are the same parts as explained in FIG. 21A, so that repeated explanation is omitted here. According to the preferred embodiment, in way of an example not way of limitation, FIG. 21B depicts a photovoltaic cell wherein there are a trap structures, located in front of a photovoltaic cell in the path a incoming light to trap and eliminate the surface reflection, and act as the antireflection structures and increasing the absorption, and another structure reflecting layer or back sheet is located at the bottom side of the photovoltaic cell, located either before the electrode or after the electrode. The first quintic structure 2112 is etched out of the electrode 2103*a* which is comprised out of a conductive transparent electric material. The quintic structures 2112 may be etched partially or wholly into the electrode 2103*a* in order to act as a reflecting structure for reflected light coming from inside of the photovoltaic cell and allowing to return to the electric materials 2100 and 2102. The first electric material 2100 and second electric material 2102 are shown to be flat but may be shaped as the structures described above. The bottom reflecting structure underlay the cell and acting as highly reflective structure which scatters and reflects light back into the cell. Unlike the trap structure depicted in FIG. 21A the present trap or reflecting structure is made out of a highly reflective coating rather than an air gap etched from another material. Alternatively, the antireflective layer can be made from a nonconductive transparent material, and the top electrode 2103*a* will be made out of conductive transparent material which can be flat and can be under laid or located below the antireflective layer (not shown).

Figure 21C:
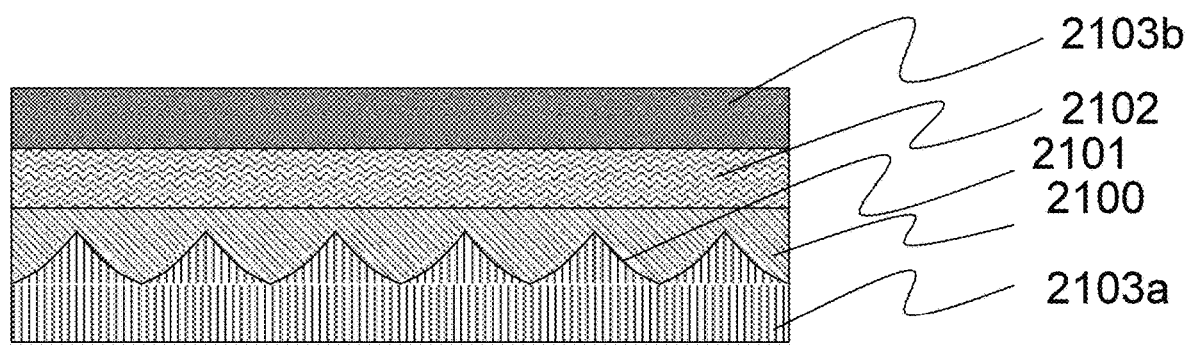

Alternatively according to this invention, FIG. 21C is a cross sectional view of a photovoltaic cell in the preferred embodiment in accordance to this invention, wherein like parts are indicated by like or similar reference numerals as used in FIGS. 21A and 21B, so that a repeated explanation is omitted here. FIG. 21C depicts a preferred embodiment, in way of an example not way of limitation, where the quintic structure 2101 is formed from, or on the first electrode 2103*b* and acts as a reflective layer scattering light in the structure pn junction.

According to this invention the antireflective layer or coating may in some embodiments use reduce reflection loss by tuning the refractive index to create a graded refractive index antireflective coating that matched the index of air on the one side and the refractive index of the substrate surface on the other. Methods used for creating a graded index include alternating high index and low index materials with thickness less than that the targeted wavelength, oblique angle deposition creating porous layer, quintic and modified quintic profiles, and implementing nanostructures. Various embodiments are employed by implementing different nanostructures comprising of nanopillars, nanopyramids, nanocones, and quintic structures, which significantly enhances the graded index antireflection coating to match the refractive index of air to that of the substrate to reduce the index contrast and hence reducing reflection. Various embodiments result in indicate reflectivity of <0.1% for the wide range of band of wavelengths (i.e. visible light wavelength of 430-660 nm) and/or perpendicular illumination or illumination having an incident angle of 0-80°, One embodiment can implement a selection of nanostructures depending on the substrate surface and how much tuning is required for the effective refractive index to achieve the target reflectivity of the optical device. In this type of nanostructure, a curved surface nano-pyramid-like shaped structure is mounted a top the surface of the optical device to reduce reflection and enhance light-trapping mechanism to boost absorption and therefore improve efficiency. Since the width of the quintic structure changes from the top ($\approx 0$) to the bottom, the effective refractive index is not a constant value. The effective refractive index value at the top of the quintic structure is equal to that of air and at bottom it is equal to that of the substrate. The quintic structure is designed to generate a quintic profile of effective index for optical thickness of the structure. The optimized geometry of the quintic structure results in the least amount of reflection among the different nanostructures used. The variation of shape of nano-pyramids from top to bottom provides a gradual change of the effective refractive index from air to the plane silicon layer, for example, and thus reducing reflection losses.

The antireflective coatings or trapped structures mentioned above can be manufactured using methods including, but not limited to, synthesis, vacuum deposition, spin-coating, photolithography, or combination thereof. The anti-reflecting coating can be a layer or a combination of layers or films having desired patterns for desired wavelength bands, and desired patterns comprises the same or different 3D structures having periodic or random aligned, vertically or randomly orientation in the standing mentioned earlier. The material for antireflecting or trapped structures can be insulator, electrically conductive, semiconductors, polymer. This structure can be made on the PV cell either while cell is fabricated or formed as the separate sheet (front as trapped or front sheet), and later put onto the PV cell (not shown here)Alternatively, according to this invention, in way of an example not way of limitation, the antireflection (AR) layer or front sheet may or may not be a type that does not include a 3D structure (i.e. quintic structure). Such a AR layer may be flat, or have 2D structures, or 3D structures (i.e. quintic shaped, or quintic-like structures), or combination thereof (not shown). These structures may be micrometer or nanometer scaled. The 2D structures or grating may be quintic shaped, curved, or straight sided groves. Additionally, 3D structures including pyramids, cones, truncated pyramids, truncated cones, rods, cylinders or rectangles, or combination of thereof may be used. A flat AR layer (/coating or front sheet) would comprise a single-layer or multi-layers stacked (not shown here).

Alternatively, according to this invention, in way of an example not way of limitation, the reflective layer or coating located at the bottom of the cell may have a flat surface (not shown here). A flat surface reflective layer may comprises of a metal or a distributed brag reflector either reflecting all of the wavelengths of light incident to the reflector or, reflecting specific desired band wavelengths reflecting back to the absorption layer, and some the rest of band of wavelengths passing through the reflector. The reflector used in the bottom made from the single layer or multiple stack of layers, and it can be part of the Cell. For example, if the metal is used as the back reflector, the metal layer can be part of one of the electrodes of the cell or an additional metal layer. Alternatively, reflector (part of band or whole of bands to be reflected) can be made from the grating structure or the plasmonic structure (not shown here).

Alternatively, by selecting the thickness and material composition of the layers within the stack desired reflection or desired transmission of the wavelengths can be tuned to specific ranges of wavelengths An example of a flat reflective layer is a dielectric mirror.

Alternatively, according to this invention, the reflective layer includes the use of 3D structure (i.e. quintic structures) formed on or etched in a material with a refractive index, and the structures are separated by gaps (not shown). The gaps separate the base of the structure from one another. The 3D structures may be arranged in two dimensional arrays that are separated by flat regions or patterns of three dimensional structures. The 3D structures may have a square or circular base. Wherein the base of the structures are by separated by gaps which have flat regions where no hole is etched, or where no structure protrudes from the surface. The structures may be formed in a periodic pattern or may be arranged at randomly across the surface of the reflection layer. The reflective structure can be a part of the PV cell either fabricated with PV cell fabricated or separately made as a back sheet, and later put back side of the cell to reflect the unabsorbed light back to the absorption layer. Alternatively, the bottom structure is made in such way for the light not absorbed by the absorption layer incident onto the the bottom layer, which then reflects, diffract and/or scatters back to the absorption layer or the cell (if used as the back sheet). The light that is scattered then travels through the cell in multiple vectors that cause the light to take longer paths through the absorption layer of the cell increasing the absorption of the light in the cell The 3D reflection layer may have have a flat base which can be made from a layer with etching out (not shown here. The top surface of the cell can be flat or having the 3D structure against the solar cell front surface, which may be of any embodiment mentioned above. The thickness of the material, and the specific material chosen, the height of the 3D structure (i.e. quintic structures) and the angle of the structures is dependent on the desired specific band of wavelengths to be reflected back to the absorption layer and/or to transmitted out from the absorption layer. Any 3D structures can be used covering, but not limited to, quintic, pyramids, cones, truncated pyramids, truncated cones, rods, cylinders and rectangles. The solar cell may comprises of one or more absorption layer/region, and each absorption layer is designed for absorbing specific band of wavelengths containing in the incoming light, and rest of the bands of wavelengths are transmitted to the following absorption regions. The reflection layer may be included after each absorption layer in order to reflect back the specific band of wavelengths to the respective absorption layer/region. The reflecting layer may be designed for specific band of wavelengths and transparent to the longer bands of wavelengths. The 3D structure, described above can be used for the reflector for the specific band of wavelengths. The cell having more than one absorption regions may be terminal Cell or four terminal cell.

The quintic or quintic shaped like structure and has numerous advantages over a flat surface, including causing multiple reflections, defraction of incoming light and the scattering of light back into the absorption layer of the photovoltaic cell above (not shown). The light that is reflected back to the absorption layer are scattered at several angles such that the light to travels a longer distances through the absorption layer causing more to be absorbed.

A second material may then be used to fill the space left around the 3D structures. This second material may have a different refractive index from the first and will be selected to reflect the desired waveband back into the solar cell. The second material may also be selected based on the electrical properties, allowing the second material to act as a conductor, insulator or semiconductor depending on the need of the reflection layer. In various embodiment such as one depicted in FIG. 21C having material that acts as a conductor in the reflection layer may allow the reflection layer to be built into an electrode. A reflection layer that is part of a 4 terminal device may need to have insulating materials (not shown). A reflection layer that is part of a device where the reflection layer is directly next to a semiconductor, then a semiconductor may be used to allow for additional pn junctions to be formed (not shown).

According to this invention, alternative embodiments of the reflection layer or trap structures described above, may include a structure forming from etching holes into the layer or substrate. In this case, the holes can be made with air and surrounding material can be solid structure. Based on the transition of refractive index as required, the holes shaped can have any shapes which may covers cylindrical, inverted conical, inverted pyramid, inverted trapezoidal, which are arranged either in 2D or 1D array. As mentioned earlier, these holes structures can be made in the front surface and/or back surface to act as trapping or reflecting structures.

Alternatively, there is a gap, or flat region between each hole. If the holes type structure is used for the reflecting layer, the light passing through the solar cell that has not been absorbed in the absorption layer will contact the reflection layer and interact with a combination of flat regions and 3D holes. The light then reflects, diffracts, and scatters when entering the reflection layer. The holes may be etched periodically, in an orderly pattern, or etched in a random manner. Alternatively, they may be arranged in the same deepness (or height) or variable heights. The thickness of the reflective layer, the choice of material, and the dimensions of the holes are selected based upon the desired bandwidth to be reflected back into the solar cell. The bandwidth is selected depending on the solar cell itself and the bandwidth the solar cell is most efficient at absorbing. Holes shapes can be of any shapes which includes, but not limited to, inverted quintic, inverted conical, inverted pyramid, inverted trapezoidal pyramid, or combination thereof. Alternatively the holes may either be left empty, or filled with a material with a refractive index that enhances reflection in the desired waveband.

Alternatively, embodiments of the reflective layer at the bottom of the solar cells, or at the bottom side of the each absorption region, may include structures formed on the top of the material with a refractive index such that the protruding 3D structure (i.e. quintic shaped structures) are facing towards the solar cell, and the flat surface of the material with a refractive index is facing away from the solar cell (not shown). Preferably the 3D structures includes, but not limited to, quintic, pyramids, cones, truncated pyramids, truncated cones, rods, cylinders, rectangles, or combination thereof. These structures may be etched from the material, or may be formed on the material. Each structure may be separated by a gap or located closely together as the individual shape allows. The closer together the shapes are the more reflecting and/or scattering the light will occur. The material used, its thickness, and the angle, and height of the structures are to be selected based on the band of the wavelengths to be reflected, or wavelengths to be transmitted through the reflective layer.

According to this invention, the structures on the top layer of the solar cell for anti-reflecting layer may consist of 3D structure may include but not limited to, quintic shapes, pyramids, cones, truncated pyramids, truncated cones, rods, cylinders and rectangles, or a combination of quintic shapes and other shapes, and may be placed at regular intervals or randomly. The material used, its thickness, and the angle, and height of the structures are to be selected based on the band of the wavelengths to be transmitted, or wavelengths to be reflected through the anti-reflective layer. The 3D structure mentioned above, may include 2D array or 1D array, with or without gaps, arranged in periodic way or random ways.

According to this invention, alternative embodiments of the anti-reflection layer or trap structures described above, may include a structure forming from etching holes into the layer or substrate. In this case, the holes can be made with air and surrounding material can be solid structure. Based on the transition of refractive index as required, the holes shaped can have any shapes which may covers cylindrical, inverted conical, inverted pyramid, inverted trapezoidal, which are arranged either in 2D or 1D array. As mentioned earlier, these holes structures can be made in the front surface and/or back surface to act as trapping or reflecting structures.

As an alternative to etching, 3D structure shaped holes, 2-dimensional groves or holes may be etched for the trapping or reflective layer. The groves may have a flat strip or region located between them or the grooves may be immediately adjacent to one another. The grooves are simpler to manufacture and to produce than etching or forming holes. The shapes of groves or holes and its dimensions may be selected based on the wavelengths of lights to be trapped, transmitted, or reflected back Furthermore, alternative trapping or reflection layers (not shown) may include structures or holes etched from the top and/or bottom of a material that consist of shapes such as pyramids, cones, truncated pyramids, truncated cones, rods, cylinders or rectangles, these shapes may be used with or alternatively to quintic shaped structures, and or holes (not shown). The shapes of each 3D structure mentioned above may cover with or without inverted shapes. The use of simpler shapes allows for easer manufacturing, and unlike the use of grooves allows for reflection, diffraction, and/or scattering in more directions. The shapes may be arranged to have either periodic or random spacing between each hole or protruding shape, in either a fixed pattern or a random scattering of holes and or protrusions. The reflective or anti-reflecting coating may consist of both holes and protrusions, or either holes or protrusions. Furthermore, when specific shapes such as pyramids, cones, truncated pyramids, and truncated cones are able to be aligned in direct proximity to one another without a gap, then the gap may not be necessary.

According to this invention, alternatively, the reflection layer may be used to reflect light back into the solar cell on top of the reflection layer, and have a second solar cell located below the reflection layer (not shown). The second cell is tuned to absorb the wavebands that the reflection layer does not reflect back to the top solar cell. In embodiments where there is a second cell located below the reflective layer, the reflective layer is designed to be highly reflective to the bandwidth of the cell located above the reflection layer (the first absorption layer) and transparent to the bandwidth of the solar cell located below the reflection layer (the second absorption layer). The wavelengths that pass through the reflective layer are considered to be transmitted through the reflection layer for the second cell or second absorption layer. The cell mentioned above comprises more than one absorption layer or region and the reflection layer mentioned here, may be located after each absorption region or multiple absorption regions to reflect back the band of wavelengths to those absorption region designed to absorb to those band of wavelengths, and the rest of band of wavelengths are transmitted to the bottom absorption region or second cell, and so on. Alternatively, the cell mentioned above comprises more than one cell and separated by the insulating layer and/or the reflection layer, may be located after each cell or multiple cells to reflect back the band of wavelengths to the those cells designed to absorb to those band of wavelengths, and the rest of band of wavelengths are transmitted to the bottom cell(s), and so on In preferred embodiments, where there are multiple junctions separated by the reflection layer, the junctions located on top of the reflection layer are optimized to absorb a certain band of wavelengths. The reflection layer is then designed as described above to reflect the band of wavelengths absorbed by the junction located above the reflection layer back into the junctions. The reflection layer is also designed to be transparent to bands of wavelengths that are not absorbed efficiently by the junctions' above the cell and pass through the reflection layer into another junction or series of junctions which absorb the wavelengths that have passed through the reflection layer.

Such a system can be either a two or four terminal device. In a two terminal device the reflection layer may be electrically conductive or insulating or semiconductor. For insulating case, the electrical conductive path (for example using conducting via to connect the top absorption layer to bottom absorption layer) is necessary in order to have the electrically connects to the bottom absorption layer or regions.

According to this invention in embodiments with a two terminal devices and the reflection layer is comprised of a semiconductor material, the reflection layer may be comprised of semiconducting materials and is able to form part of a pn junction. In all such embodiments, the reflection layer must be in contact with the semiconductors that comprise the absorption layer of photovoltaic cells located above and or below the reflective layer. Such embodiment includes the material with a refractive index, consisting of either a p or n doped semiconductor. The space left open by the structures or holes is then filled with a semiconductor that is of the opposite type. The two semiconductors will need to be carefully selected to have the proper refractive index to achieve the desired reflectivity. Band of wavelengths of lights absorbed in the pn junctions located above the reflective layer must be reflected by the reflective layer, and the reflective layer must be transparent to a band of wavelengths that are absorbed by the pn junction located below the reflective layer. Alternatively, the reflective layer may comprises more than one semiconductor materials which are doped as the same type such that there is no junction in the reflection layer, however the reflective layer as a whole can interact with semiconductors in adjacent absorption layers to form pn junctions. In alternative embodiment where semiconductors are used in the reflective layer, that is part of a two terminal device, may involving the application of insulating material in holes and gaps in the reflective layer. The material with a refractive index and holes or structures etched as described above, comprises of a semi conducting material, and may interact with the semi conducting material above and below of it. The space between the structures or in the holes covers also an insulating material or a high band gap material. In embodiments having the structures with the insulating material does not cover the peaks of the structures, but the peaks contact the semiconducting material in the adjacent absorption layer. Furthermore, in an alternate embodiments that have holes, the insulating material or high band gap material may fill the holes, and does not insulate between the semiconductive material in the reflection layer and the adjacent absorption layers. This results in a pn junction being formed at the peaks of the structures and absorption layer that the peaks contact. Alternatively, a pn junction is formed between the absorption layer and the flat surface between the holes or groves etched from the reflective layer.

According to this invention, in embodiments with a four terminal devices and the reflection layer and/or a layer require to electrically insulate the top absorption region or top cell to bottom absorption region or bottom cell. In this case, reflection layer may itself be selected from the electrically insulating material. Alternatively, if the reflective layer is made from the electrically conductive material, one or more insulating layer may necessary to electrically isolate the top absorption region or top cell to bottom absorption region or bottom cell after or before the reflecting layer.

In an alternative embodiment where the reflective layer is part of a four-terminal device, and acts as an insulating layer, the reflective layer is comprised an insulating material. The material with the refractive index with protruding shapes, and/or holes consist of an insulating material. This insulating material will electrically isolate the materials located above and below the reflective layer. Alternatively, the insulating material may be formed in the spaces between the protruding structures and in the holes such that the insulating material electrically isolates the absorption layers. Although it is possible for the reflection layer to make from a semiconducting or a conductive material, with a separate insulting material located above or below the reflective layer. The insulating material will have to allow the efficient transmission of bandwidths to be absorbed in the lower absorption layer.

According to this invention the two terminals multijunction devices and/or four terminals multijunction devices may be fabricated either monolithically, or be fabricated, such that the device is stacked together at the reflection layer.

Figure 22A:
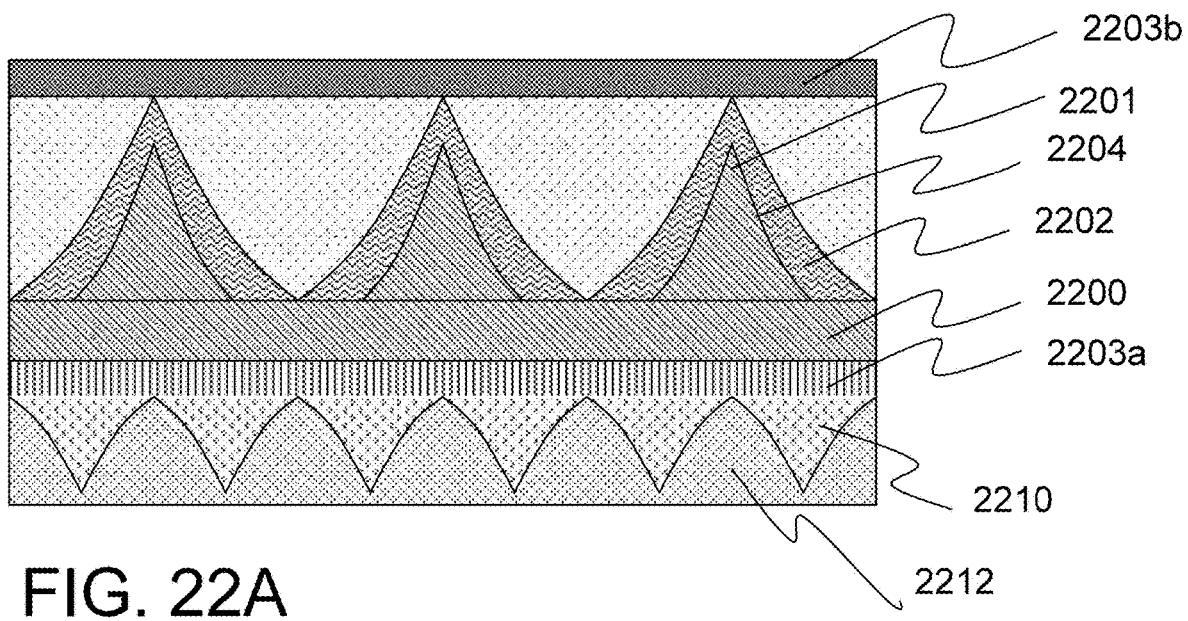
FIGS. 22A and 22B are the cross-sectional views of photovoltaic cell structure comprising with a quintic shaped structure and a reflecting structure located at the bottom.

According to this invention, in way of an example not way of limitation, the tap structure as depicted in FIGS. 21A, 21B and described above may be used for the embodiments depicted in FIGS. 19A, 19B, 19C, 19D, 19E, 20A and 20B. FIG. 22A depicts an example of the trap structure used in FIG. 21B on an embodiment of FIG. 19A. However, the trap structures may be used in all of the embodiments taught in FIGS. 19A through 19F, and FIGS. 20A, and 20B.

According to this invention, in way of an example not way of limitation, in FIG. 22A, the nanoscale quintic structures 2201 are electric material, comprised of an electrical conduction of either p or n type semiconductor material and can be treated as first electric material. The quintic structures are formed on or etched out of a substrate 2200 comprising a semiconductor of the same type as the structures. Alternatively, the substrate may be made out of a semiconductor of the same type or opposite type, (not show here) with the quintic structures 2201 formed on top. The second electric material 2202 dispose on to the quintic structures 2201, and surrounds the quintic structure 2201 and the second electric material 2202 comprises a semiconductor material of n or p type, which is opposite of the material used in the quintic structure forming a p-n junction 2204 along the top and side-walls of the quintic structure 2201. The electric material of the structures 2201 and the second electric material 2202 are electrically connected to electrodes: 2203*a* and 2203*b*. The electrodes can be common and that serve for all of the structures. Electrode 2203*a* or 2203*b* can be transparent, not shown here, and can be formed on the second electric material 2202 or junction 2204, respectively. Additionally, a passivation layer may be used to fill the gaps in between the structures formed after disposing the electrical material 2202. The passivation layer may be disposed either after disposing the electrode 2203*b* or before disposing the electrode 2203*b*. If the passivation layer (not shown here) formed before the electrode 2203*b*, either planarization is necessary to open the second electric layer 2202 for contact or via is required followed by the making contact using electrode 2203*b*. The passivation layer 2207 may be an insulter, or a second electric material type 2202, or a transparent layer.

Figure 22B:
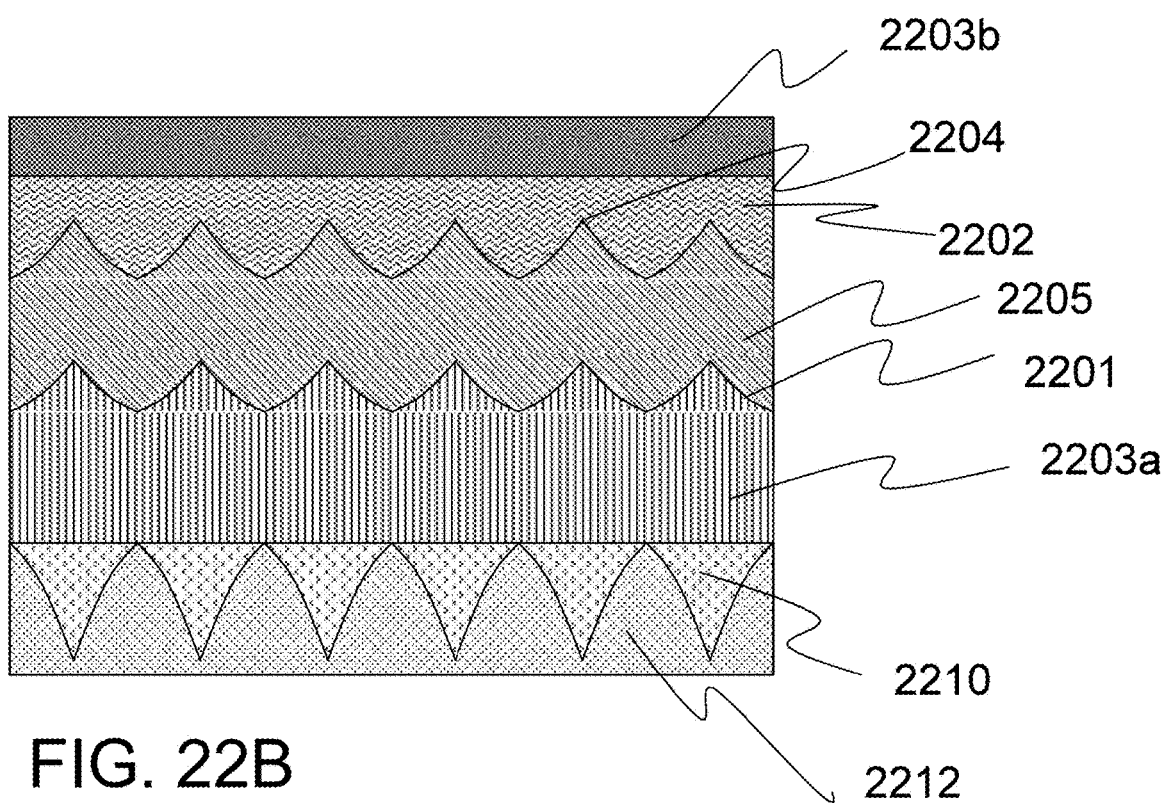

FIG. 22B is a cross sectional view of a photovoltaic cell in the preferred embodiment in accordance to this invention, wherein like parts are indicated by like or similar reference numerals as used in FIG. 22A, so that a repeated explanation is omitted here. In FIG. 22B the quintic structure is located between the first electrode layer 2203*a* and the first electric layer 2205. The second 3D (i.e. quintic) structure is shaped structures are formed, or etched from the top of the first electric layer 2205 which the second electric layer 2202 is deposed. The second electrode 2203*a* is then formed on top of the second electrical material 2202. This results in the pn junction being formed in the shape of the 3D structure. Wherein the trap or reflective structure is the same as described above in the description for FIG. 21A or others mentioned in FIGS. 2A to 20B.

According to this invention, in way of an example not way of limitation, alternatively the embodiments described in FIGS. 2A through 22B may also include a second or more p-n junctions. Such a junction may include the addition of a third electric material layer of placed in contact with an electric layer mentioned above, of opposite type than the electric layer in contract with the third electric material layer (not shown here). Alliteratively, two additional electric layers can be added to the invention, above or below the place electric layers that make the previously described p-n junction. This will add additional p-n junction for each electric material that is in contact with an electric material of different type (not shown here). For making a second or more p-n junction, more than one electric material layer may necessary. Furthermore, according to this invention, more than one electric material layers interfacing with the electrodes mention above may necessary to reduce the ohmic-contact resistance. Furthermore, according to this invention, more than one electric conductive layer may be used for making the electrodes mentioned above. According to this invention, in way of an example not way of limitation, the electrical material or electric material is used for the sake of explanation, and those are the same meaning.

According to this invention, in way of an example not way of limitation, 3D structures described above can be selected from the group consisting of quintic shaped, quintic-shaped like, rods (wires), cone, pyramids, truncated quintic-shaped, truncated quintic shaped like, truncated cone, truncated pyramids, and combination thereof. The 3D structures for (example quintic structures) may have a gap or without a gap in between two 3D structures. Herein, the "Gap" is mentioned a physical distance of two 3D structures measuring from edge of one 3D structure base to other 3D structure, located close proximity or adjacent to each other. All type of 3D structures mentioned above and/or as shown in FIGS. 2A to 22B has the space or void in between the nearest neighbors of two similar or dissimilar 3D structures. Here "Space" or "Void" is the opening area in between two 3D structures located adjacent or close proximity to each other. These spaces or voids are always present irrespective of 3D structures are having with gaps or with gaps. These 3D structures (i.e. Quintic structures or other 3D structure) may have be arranged in one dimensional or 2-dimensional array, or combination thereof (not shown here). The array of one dimensional or 2 dimensional can be made by using any of 3D structures mentioned above or combination of thereof (not shown here)

According to this invention, in way of an example not way of limitation, the passivation layer in the embodiments described in FIGS. 2A through 22B may be insulating material and/or electrical material. In way of an example not way of limitation, the passivation layer used for one or more of the following purposes, including but not limited to: (a) to insulate, (b) to reduce the leakage current, (c) to make the semiconductor junction, and/or (d) to reduce the ohmic contact resistance.

According to this invention, in way of an example not way of limitation, alternatively the embodiments described in FIGS. 2A through 22B may also include a radiation hardness layer, top, or bottom or both sides, or surrounding the cells preventing from performance degradation due to high energy particle (not shown here).

According to this invention, in way of an example not way of limitation, the electrical materials mentioned in FIGS. 2A to 22B, forming the p-n junction or Schottky junction are semiconductor materials which may consist of semiconductors such as Si, Ge, GaAs, GaN, InP, GaP, GaSb, CGIS, CdTe, Zn CdTe, or ZnO or polymer or metal or a combination of thereof. The substrate mentioned in FIGS. 2A to 22B can be chosen from a group consisting of semiconductor, dielectric, insulator, semi-insulator, electrical conductive, metal, polymer, or combination thereof.

According to this invention, in way of an example not way of limitation, the quintic structure could be II-V based materials (n or p type), for example CdTe, and the dozens of the materials could be II-VI based material like CdZnS (p or n type, opposite to CdTe rods) or Zn(Cd)Te/ZnS based materials formed on the substrate. In this case, by adjusting the Zn contents, the band gap can be tuned and thereby a wide spectrum of solar energy can be absorbed.

According to this invention, in way of an example not way of limitation, alternatively the quintic structures or rods could be Si or amorphous Silicon materials (n or p type) and the electrical materials could be Si:Ge alloy (p or n type, opposite to Si quintic structure). In this case, by adjusting the Ge contents, the band gap can be tuned and thereby a wide spectrum of solar energy can be absorbed.

According to this invention, in way of an example not way of limitation, alternatively the rods or quintic structure, or quintic-shaped like (i.e 3D structure) could be Si, InP, or CdTe (n or p type) and various semiconductor materials could make the junction with the rods or quintic structure, or quintic-shaped like (wires or tubes or 3D structures) and each type of material would have a specific band gap for absorbing a specific range of the solar spectrum. In this way a wide range of the solar spectrum can be absorbed, and by increasing the junction area (due to use of the rods, wires, or tubes), the electrical power generation could be increased tremendously (50 times and beyond).

According to this invention, in way of an example not way of limitation, the nanometer(s)-scale wires, rods, tubes, pyramid, cone, trapezoidal, or quintic structures mentioned in the preferred embodiments, can be made from any kind of electronic materials, semiconductor, insulator, or metal or the combination of thereof.

According to this invention, in way of an example not way of limitation, the nanometer sized rods, wires or tubes can be made from semiconductors such as Si, Ge, or compound semiconductors from III-V or II-VI groups. As an example, for rods, wires, or tubes, InP, GaAs, GaP, Pbs, or GaN III-V compound semiconductors can be used and they can be made using standard growth processes, for example, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, GaSb, InSb, InAs, CdTe, CdS, ZnCdTe, HgCdTe, PbSe, PbS, ZnSe, ZnS, etc. The substrate can also cover all kinds of polymers or ceramics such as AlN, Silicon-oxide, etc.

According to this invention, in way of an example not way of limitation, the nanometer sized rods, wires, or tubes based on an II-VI compound semiconductor can also be used. As an example, CdTe, CdS, Cdse, ZnS, HgCdTe, HgZnTe, PbSe, PbS, or ZnSe can be used, and they can be made using standard growth processes, for example, sputtering, evaporation, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaP, GaN, ZnS, CdTe, CdS, ZnCdTe, HgCdTe, HgZnTe, GaSb, etc. The substrate can also cover all kinds of polymers, ceramics such as AlN, Silicon-oxide, or metal etc.

According to this invention, in way of an example not way of limitation, the rods, wire, or tubes, mentioned earlier to make the photovoltaic cell, can be micro or nano scaled and their sides could be vertical or inclined (in shape) at an angle (e.g $\alpha$) with respect to the surface of substrate. Alternatively, the side could be nay shape convenient to manufacturing and increase the surface area. The advantage of using the inclined side is to concentrate the incident light falling onto the side and the gap in between the rods, wires, or tubes.

According to this invention, in way of an example not way of limitation, the nanometer sized rods, wires, or tubes can be made from carbon type materials (semiconductors, insulators, or metal like performances), such as carbon nano-tubes, which could be single or multiple layered. They can be made using standard growth processes, for example, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AlN, Silicon-oxide, etc.

In the preferred embodiment and also in an exemplary embodiment of the invention, in way of an example not way of limitation, in FIGS. 2A to 22B, the thinned material (i.e. silicon) is considered to show the benefits of the structures to achieve reduced reflection loss in broad spectrum ranges, to make broadening the absorption and also to reduce transmission loss, even using of thinned material for potentially useful for the optical devices (i.e. photovoltaic cell). Furthermore, the radiation considered in the examples as shown in FIGS. 2A to 22B, are solar spectrum. Using of infrared (or UV) range material, the structure can also be used for reducing the reflection loss in desired broad spectrum ranges to enhance the optical performance of the device. According to this invention, with proper selection of material, its refractive index, and its physical parameters, the quintic structure (micro-nano scaled) can also be used as a broadband antireflection coating as an additional layer, structure itself as a part of the device, or combination thereof, in an optical device (i.e. photovoltaic cell, detector, photoconductive device) or use itself as the coating structure for the applications (not shown here) where reflection loss of radiation is to be minimized.

In the preferred embodiment and also in an exemplary embodiment of the invention, in way of an example not way of limitation, the square shape base is explained. This invention also covers all shapes of bases covering circular, elliptical, parabolic, or rectangular for the quintic structure and/or also quintic like structures. These structures can be arranged in periodically in array or randomly aligned. Furthermore, these structures can be arranged all in same heights or arranged in variable heights. Alternatively, each of the structure can be arranged side by side without gap, and/or each structure can be arranged with a gap which could be fixed or variable In the preferred embodiment explained in FIGS. 16A to 22B, in way of an example not way of limitation, the quintic structure is considered as an 3D structure, for showing a benefit of the structure. All other structures such as quintic-like structures (semi-quintic structure) comprising of pyramid, cone, trapezoidal pyramid, quintic, or combination thereof, can be used for achieving the benefits According to this invention, alternatively with proper optimizing the structure, the structure can also be used as the high reflective coating layer (not shown here) usable in reflecting light in the device (laser device or in the detector or photovoltaic cell to reflect light.

Those skilled in the art will appreciate that the 3D structure such as pillar, cone, pyramid, trapezoidal, truncated pyramid, quintic, or truncated quintic shaped structure as shown in FIGS. 2A to 22B can be arranged with the square base 202 shown in FIG. 2A.-However, the square base may be replaced by any base shape such as elliptic, ellipsoidal, circular, triangular, elliptical, oval, or rectangular, or square, or pentagonal, or hexagonal or combination thereof, and arranged in array periodically or randomly, with or without any heights or bases, with or without gaps between 3D structures without deviating from the principles of the invention. Advantageously, the geometrical parameters of the any shapes (lengths of the major and minor axes) may be additionally selected to further control the proportion of the refractive indexes gradient passing through the air and through the material of the structures surrounding the structures and the base shape mentioned above. In this case also, the effective refractive indexes of 3D structure considering the base and 3D structure dimensions (i.e. height, base, etc.) Can be smoothly controlled to achieve enhanced performances (i.e. absorption). This adds many features in the optical devices such as enhanced conversion efficiency for PV cell, higher quantum efficiency in detector (which is function of absorption for given thickness of material used). Additionally, it may not necessary to face the device directed to the radiation in some aspect to achieve, appreciable performance. Furthermore, the structure is suitable for radiation, illuminated perpendicular, or some specific angle with respect to surface, or omni-directed illuminated on the structure, and yet to achieve similar performance.

According to this invention, alternatively with proper optimizing the structure, the structure can also be used as the high reflective coating layer (not shown here) usable in reflecting light in the device (laser device or in the detector or photovoltaic cell to reflect light.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

Although the invention has been described with respect to specific embodiments for complete and clear disclosure, the appended claims are not to be thus limited but are to be construed as embodying all modification and alternative constructions that may occur to one skilled in the art which fairly fall within the basic teaching here is set forth.

The present invention is expected to be found practically useful in that the novel photo-voltaic cells have higher power generation capability (25 times and beyond) when compared with that of the conventional cells. The proposed invention can be used for fabricating wide solar panels for both commercial and space applications.

What is claim is:

1. A photovoltaic cell comprising:
a substrate of one material having a top surface and a bottom surface;
an absorption layer;
wherein said absorption layer comprises:
at least one pn junction, wherein the at least one pn junction comprises at least one first electric material of p or n type, and;
at least one second electric material of opposite type to the at least one first electric material;
a pair of electrodes, and;
an antireflective layer or an antireflective front sheet;
wherein the antireflective layer or the antireflective front sheet comprises three-dimensional geometric pattern,
wherein the three-dimensional geometric pattern comprising:
an array of quintic, or quintic-like, or truncated quintic, or truncated quintic-like, or the combination thereof, shaped nano-scaled or micrometer-scaled protruding structures;
wherein the top surface of the substrate is flat or shaped as a plurality of protruding substrate members, wherein the pair of electrodes electrically connects to the at least one pn junction, wherein the antireflecting layer or the antireflective front sheet is directly physically attached to one of the pair of electrodes, wherein the antiretlecting layer or the antireflective front sheet with or without filling up is exposed to direct incoming light.

2. The photovoltaic cell of claim 1, wherein each of the three-dimensional geometric pattern has a base, selected from a group consisting of elliptical parabolic, rectangular, triangular, circular, trapezoidal, hexagonal, elliptical, and a combination thereof.

3. The photovoltaic cell of claim 1, wherein the three-dimensional geometric patterns are arranged in a 2-dimensional array or in a 1-dimensional array.

4. The photovoltaic cell of claim 1, further comprises a reflective layer located on the front surface of the substrate.

5. The photovoltaic cell of claim 1, wherein another of the pair of electrodes is placed on the bottom surface of the substrate.

6. The photovoltaic cell of claim 1, wherein the antireflective layer or the antireflective front sheet can be made from a nonconductive or conductive material, and/or the one of the pair of electrodes is made from a transparent conductive material.

7. The photovoltaic cell of claim 1, wherein the three-dimensional geometric patterns are inverted or standing form, and comprises of air or solid material.

8. A photovoltaic cell comprising:
a substrate of one material having a top surface and a bottom surface;
an absorption layer;
  wherein said absorption layer comprises:
    at least one pn junction, wherein the at least one pn junction comprises at least one first electric material of p or n type, and;
    at least one second electric material of opposite type to the at least one first electric material;
a pair of electrodes, and;
an antireflective layer or an antireflective front sheet;
  wherein the antireflective layer or the antireflective front sheet comprises three-dimensional geometric pattern,
    wherein the three-dimensional geometric pattern comprising:
      an array of quintic, or quintic-like, or truncated quintic, or truncated quintic-like, or the combination thereof, shaped nano-scaled or micrometer-scaled protruding structures;
a reflection layer or back sheet;
wherein the top surface of the substrate is flat or shaped as a plurality of protruding substrate members, wherein the pair of electrodes electrically connects to the at least one pn junction, wherein the antireflecting layer or the antireflective front sheet is directly physically attached to one of the pair of electrodes, wherein the reflection layer or back sheet is located on the bottom surface of the substrate, wherein the antireflecting layer or the antireflective front sheet with or without filling up is exposed to direct incoming light.

9. The photovoltaic cell of claim 8, wherein each of the three-dimensional geometric pattern has a base, selected from a group consisting of elliptical, parabolic, rectangular, triangular, circular, trapezoidal, hexagonal, elliptical, and a combination thereof.

10. The photovoltaic cell of claim 8, wherein the three-dimensional geometric patterns are arranged in a 2-dimensional array or in a 1-dimensional array, either periodically or randomly arranged.

11. The photovoltaic, cell of claim 8, further comprises additional absorption layer located after the reflective layer or back sheet.

12. The photovoltaic cell of claim 8, wherein the reflection layer or back sheet further comprises a layer or a structure to reflect back all or a part of light coming out of the absorption layer.

13. The photovoltaic cell of claim 8, wherein the antireflective layer or the antireflective front sheet can be made from a nonconductive or conductive material, and/or the one of the pair of electrodes is made from a transparent conductive material.

14. The photovoltaic cell of claim 8, wherein the three-dimensional geometric patterns are inverted or standing form, which further comprises of air or solid material.

15. The photovoltaic cell of claim 8, wherein the reflection layer or back sheet comprises of grating or brag reflector.

16. The photovoltaic cell of claim 1, further comprising a second absorption layer, wherein the second absorption layer is located in close proximity to the absorption layer.

17. The photovoltaic cell of claim 16, further comprising a reflection layer or back sheet, wherein the reflection layer or back sheet is located on one side of the absorption layer.

18. The photovoltaic cell of claim 17, wherein the reflection layer or back sheet comprises of grating or brag reflector.

\* \* \* \* \*